US007249992B2

(12) United States Patent
Kalenian et al.

(10) Patent No.: US 7,249,992 B2
(45) Date of Patent: Jul. 31, 2007

(54) METHOD, APPARATUS AND SYSTEM FOR USE IN PROCESSING WAFERS

(75) Inventors: William J. Kalenian, Arroyo Grande, CA (US); Tom Walsh, Atascadero, CA (US)

(73) Assignee: Strasbaugh, San Luis Obispo, CA (US)

( * ) Notice: Subject to any disclaimer, the term of this patent is extended or adjusted under 35 U.S.C. 154(b) by 55 days.

(21) Appl. No.: 11/173,992

(22) Filed: Jul. 1, 2005

(65) Prior Publication Data
US 2006/0035563 A1 Feb. 16, 2006

Related U.S. Application Data

(60) Provisional application No. 60/585,497, filed on Jul. 2, 2004.

(51) Int. Cl.
*B24B 51/00* (2006.01)
(52) U.S. Cl. .............................. 451/11; 451/5
(58) Field of Classification Search ................ 451/308, 451/305, 67, 72, 485, 5, 247, 11; 414/744.5, 414/416; 318/432; 700/121, 117
See application file for complete search history.

(56) References Cited

U.S. PATENT DOCUMENTS

| 4,653,231 | A | * | 3/1987 | Cronkhite et al. ............. 451/67 |
| 5,584,647 | A | * | 12/1996 | Uehara et al. ............ 414/744.5 |
| 6,045,716 | A | | 4/2000 | Walsh et al. |
| 6,155,768 | A | * | 12/2000 | Bacchi et al. .......... 414/416.03 |
| 6,354,926 | B1 | | 3/2002 | Walsh |
| 6,525,498 | B2 | * | 2/2003 | Zalkin et al. ................ 318/432 |
| 6,547,510 | B1 | * | 4/2003 | Beaulieu ................... 414/744.5 |
| 6,625,513 | B1 | | 9/2003 | Lymberopoulos et al. |
| 6,916,231 | B2 | * | 7/2005 | Wakabayashi ............... 451/66 |

FOREIGN PATENT DOCUMENTS

JP        05-305560 A      11/1993

OTHER PUBLICATIONS

International Search Report and Written Opinion, PCT/US05/23772, mailed Oct. 31, 2005.

* cited by examiner

*Primary Examiner*—Jacob K. Ackun, Jr.
(74) *Attorney, Agent, or Firm*—Thomas F. Lebens; Sinsheimer Juhnke Lebens & McIvor, LLP

(57) ABSTRACT

The present embodiment provides for methods and systems for use in processing objects such as wafers, including polishing and/or grinding wafers. Some embodiments provide systems that include a front-end module and a processing module. The front end module couples with a storage device that stores objects for processing. The front-end module can comprise a single robot, a transfer station, and a plurality of end effectors. The processing module is coupled with the front-end module such that the single robot delivers objects from the storage device to the processing module. The processing module comprising a rotating table, and a spindle with a carrier configured to retrieve the delivered object and process the object on the rotating table.

20 Claims, 32 Drawing Sheets

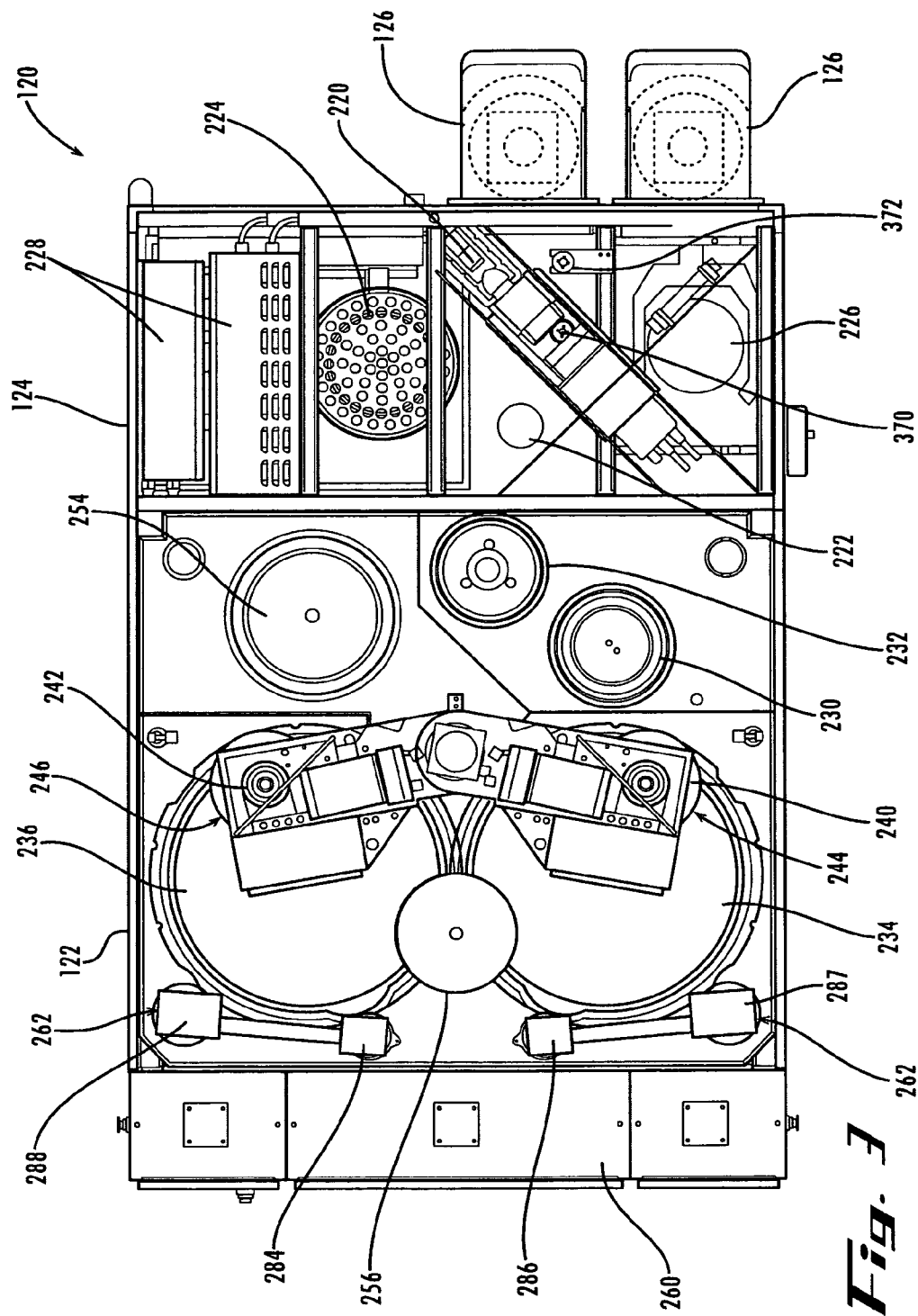

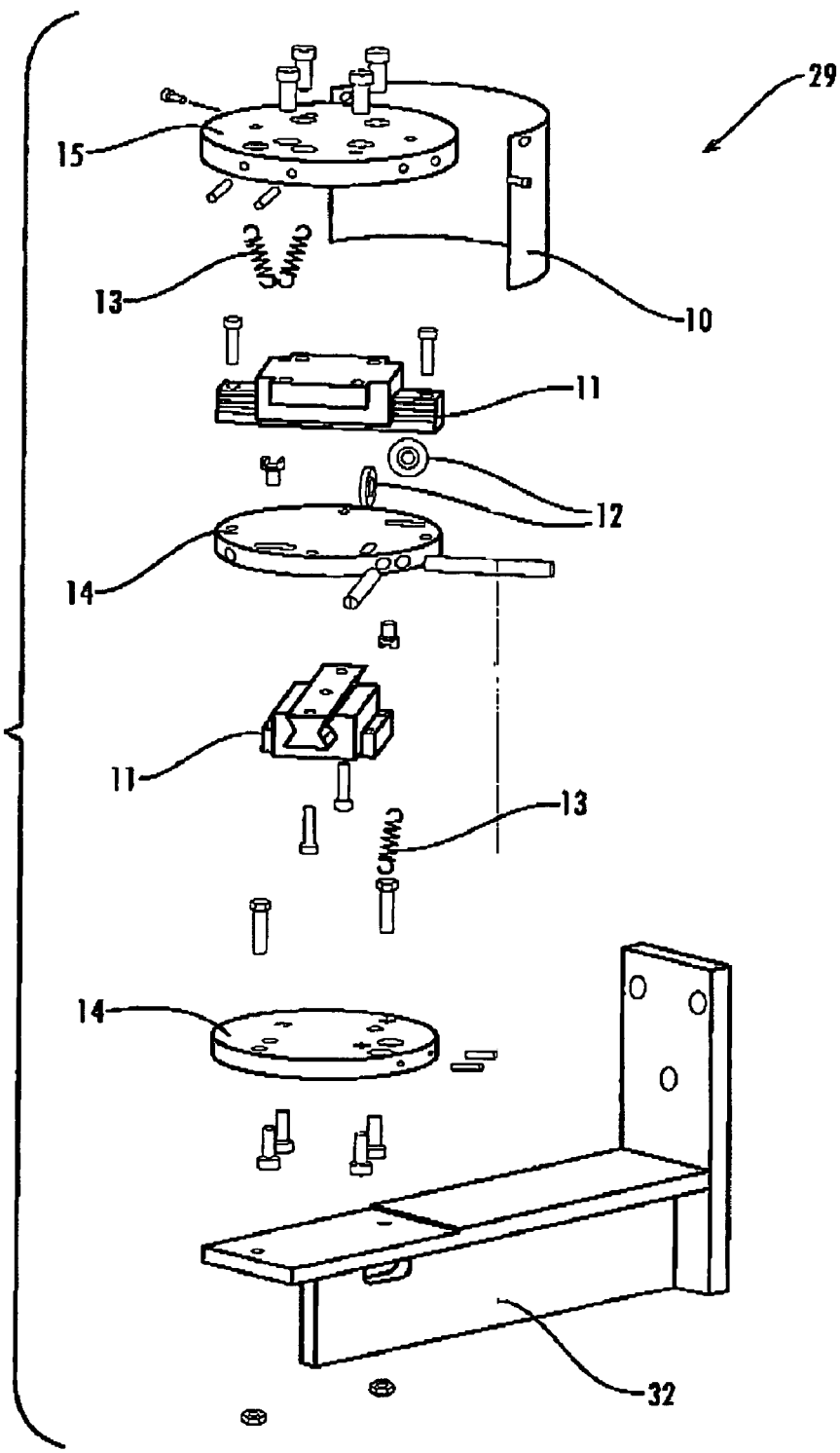

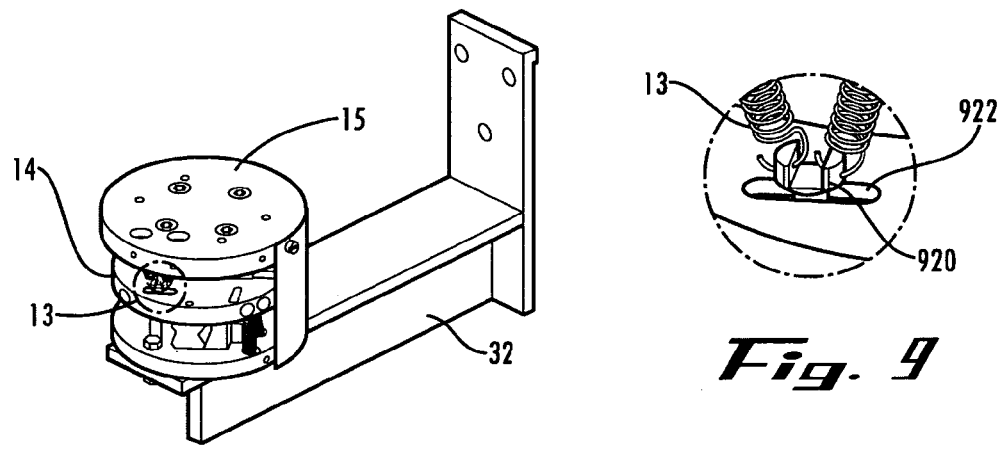
Fig. 7
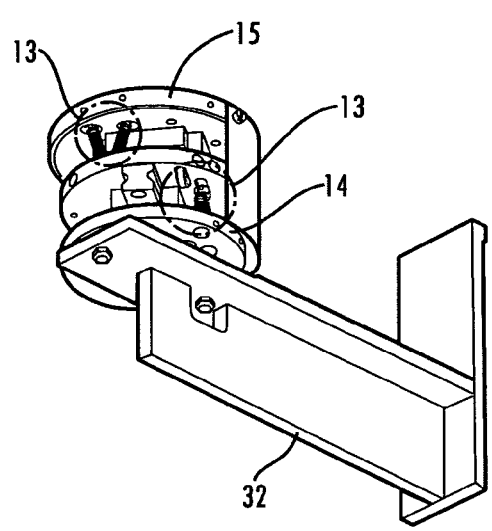
Fig. 8
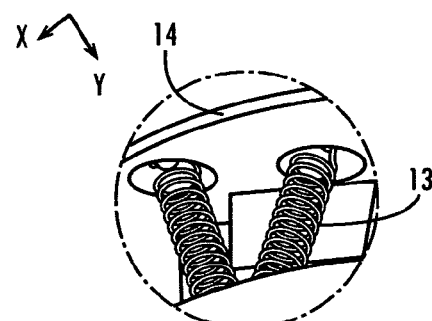
Fig. 9
Fig. 10
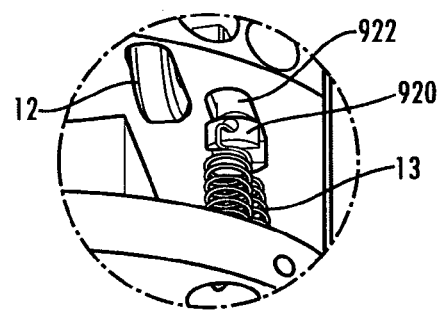
Fig. 11

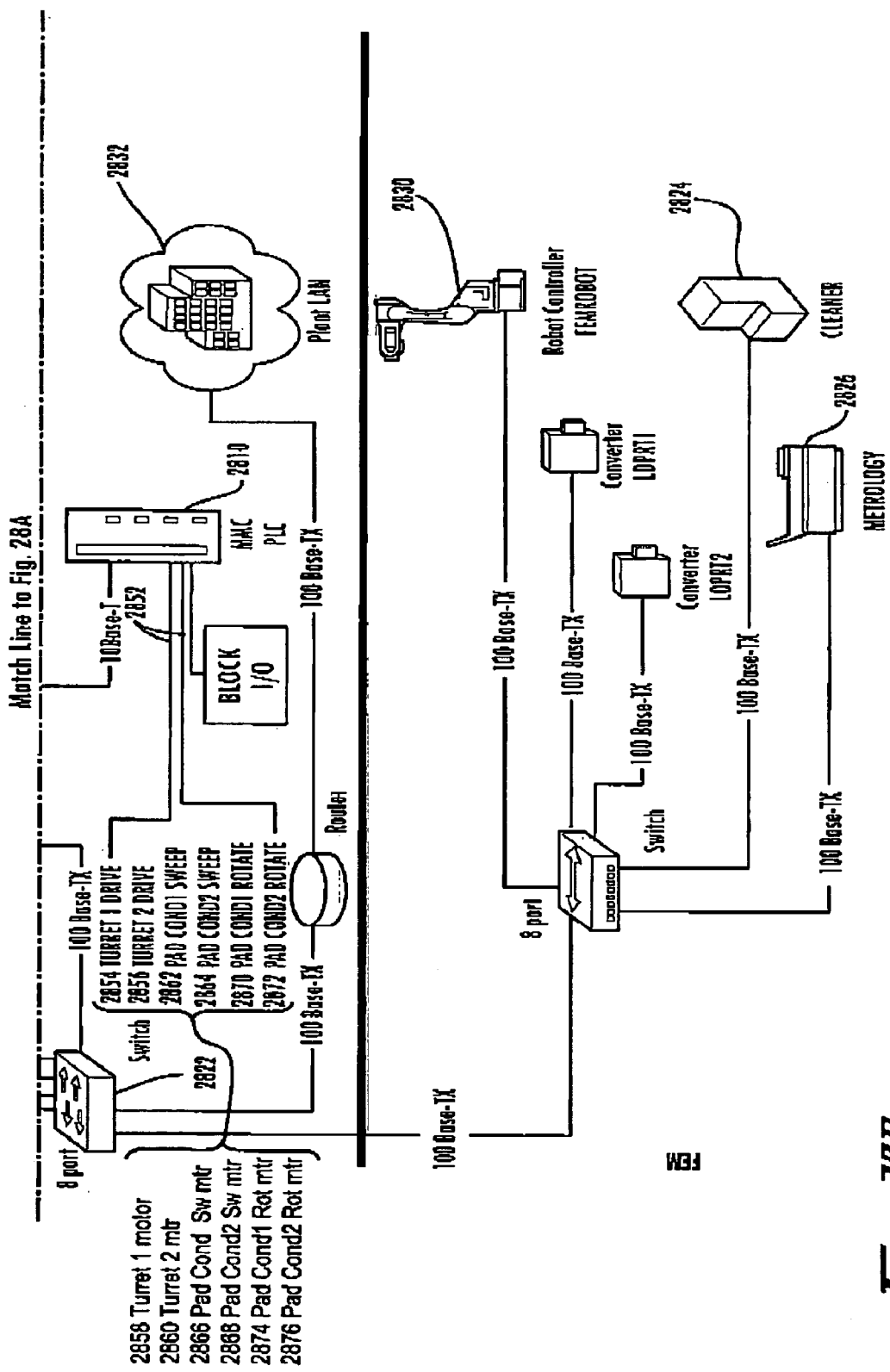

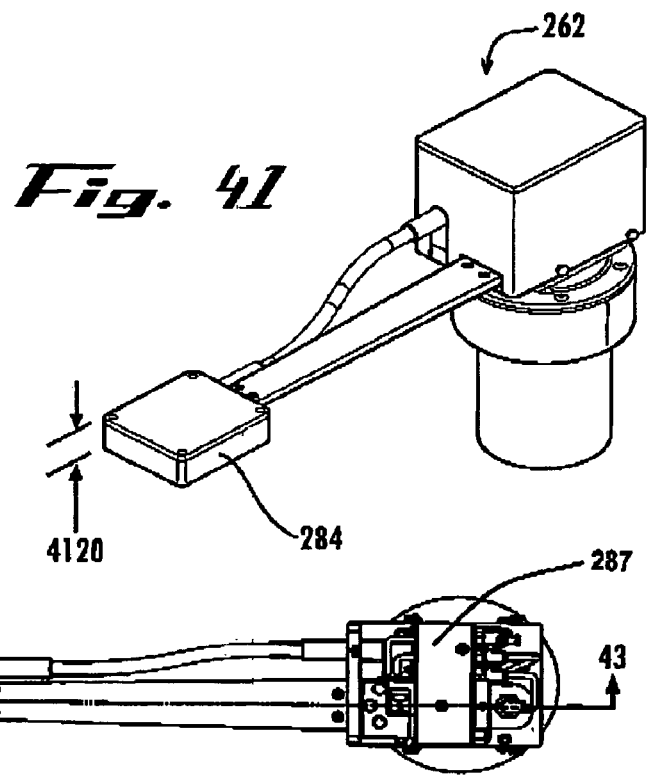
Fig. 41
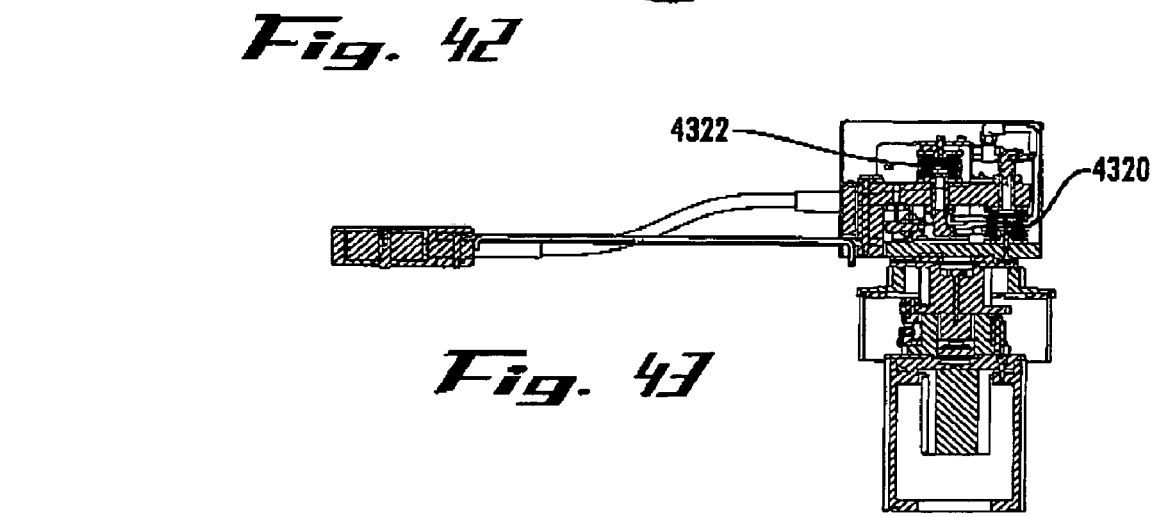
Fig. 42
Fig. 43
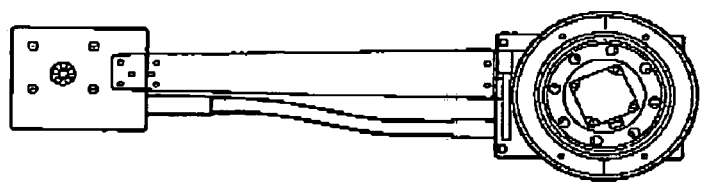
Fig. 44

METHOD, APPARATUS AND SYSTEM FOR USE IN PROCESSING WAFERS

PRIORITY CLAIM

This application claims the benefit of U.S. Provisional Application No. 60/585,497, filed Jul. 2, 2004, which is incorporated herein by reference in its entirety.

FIELD OF THE APPLICATION

The present application is directed generally toward wafer processing and more particularly to a system and method for wafer processing.

BACKGROUND

Chemical mechanical polishing or planarization (CMP) is a technique of polishing materials including semiconductor substrates and films overlying such substrates, which provides a high degree of uniformity and planarity. The process is used to remove high elevation features on films created during the fabrication of a microelectronic circuitry on the substrate, or to remove a layer of film to reveal the circuitry buried underneath the film. In some cases, the process can planarize semiconductor slices prior to the fabrication of microelectronic circuitry thereon.

Some conventional chemical mechanical polishing processes uses an apparatus having a single large polishing pad positioned on a platen, against which a substrate is positioned for polishing. A positioning member positions and biases the substrate to be polished against the polishing pad, which is rotating. A chemical slurry, which is likely to have abrasive materials, is typically maintained on the polishing pad to modify the polishing characteristics of the polishing pad and to enhance the polishing of the substrate or films.

BRIEF DESCRIPTION OF THE DRAWINGS

The aspects, features and advantages of the present embodiments will be more apparent from the following more particular description thereof, presented in conjunction with the following drawings wherein:

FIG. 3 depicts a more detailed overhead view of the system of FIGS. 1 and 2;

FIG. 6 depicts an exploded view of the lower section of the load station of FIG. 4 according to some embodiments;

FIG. 7 depicts a partial cut-away, elevated perspective view of the lower section of FIG. 6;

FIG. 8 depicts a partial cut-away, lower perspective view of the assembled lower section of FIG. 4;

FIGS. 9–11 depict enlarged views of the springs of the lower section of FIG. 8;

FIG. 17 shows a magnified view of the sensory array of FIG. 16;

FIG. 41 depicts an isometric view of a pad conditioner;

FIG. 42 depicts an overhead partially transparent view of the pad conditioner of FIG. 41;

FIG. 43 depicts a cross-sectional view of the pad conditioner of FIGS. 41–42; and FIG. 44 depicts an under-side view of the pad conditioner of FIGS. 41–43.

Figure 1:
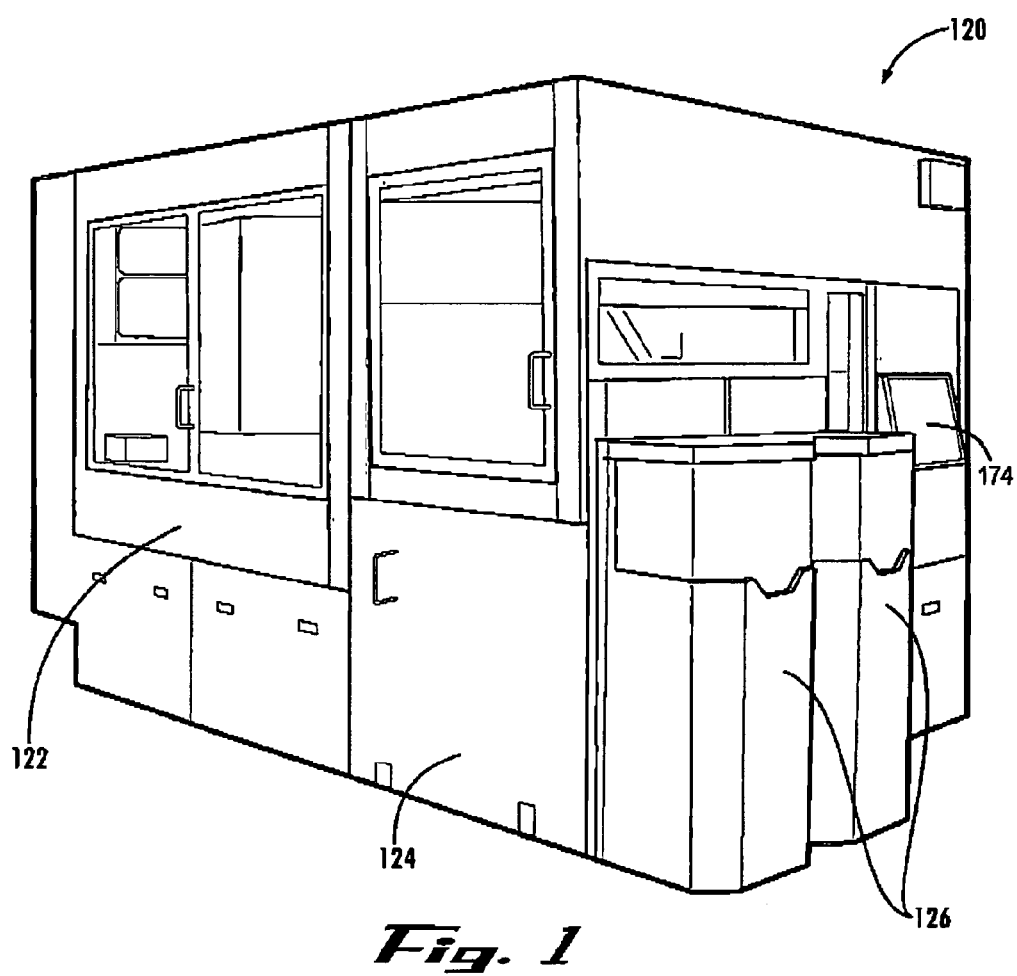
FIG. 1 depicts a simplified block diagram of a system according to some present embodiments.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

SUMMARY OF THE INVENTION

The present embodiment provides for methods and systems for use in processing objects such as wafers, including polishing and/or grinding wafers. Some embodiments provide systems that include a front-end module and a processing module. The front end module couples with a storage device that stores objects for processing. The front-end module can comprise a single robot, a transfer station, and a plurality of end effectors. The processing module is coupled with the front-end module such that the single robot delivers objects from the storage device to the processing module. The processing module comprising a rotating table, and a spindle with a carrier configured to retrieve the delivered object and process the object on the rotating table.

Other embodiments provide for an apparatus for use in processing wafers. The apparatus can comprises a single turret, a first spindle cooperated with the turret, a second spindle cooperated with the turret, a first motor cooperated with the turret such that the first motor indexes the first spindle using the turret, and a second motor cooperated with the turret such that the second motor indexes the second spindle using the turret independent of the first spindle.

DETAILED DESCRIPTION

The present embodiments provide apparatuses, systems, and methods for processing wafers and other objects that are to be processed though one or more automated processes. For example, the present embodiments are particularly applicable to Chemical Mechanical Polishing (CMP). CMP is used, at least in part, to planarize and/or polish flat objects such as silicon prime wafers, semiconductor wafers, substrates with magnetoresistive (MR) or giant magnetoresistive (GMR) heads, and other similar objects to be planarized and/or polished. Some preferred embodiments are directed to systems that are relatively compact and inexpensive, and highly reliable. The present embodiments provide very reliable loading of wafers into the carrier that holds the wafer while CMP polishing takes place.

FIG. 1 depicts a simplified block diagram of a system 120 according to some present embodiments. The system includes a processing module 122 and a front-end module 124. The front-end module retrieves objects to be processed, such as wafers, from a bin or storage elements 126 and delivers the objects to the processing module 122. The processing module processes the objects depending on the desired resulting products. In some embodiments, the processing module 122 polishes the wafers. The processing module can, in some embodiments, additionally and/or alternatively grind the wafers. The front end module 124 can be detached from the processing module such that different front end modules can be cooperated with different types of processing modules as fully described below. The processing module 122 and the front-end module 124 operate together, and are typically secured together during operation. The system typically further includes structural casings and a frame surrounding the processing module and the front-end module. Some embodiments further include a user interface 174.

Figure 2:
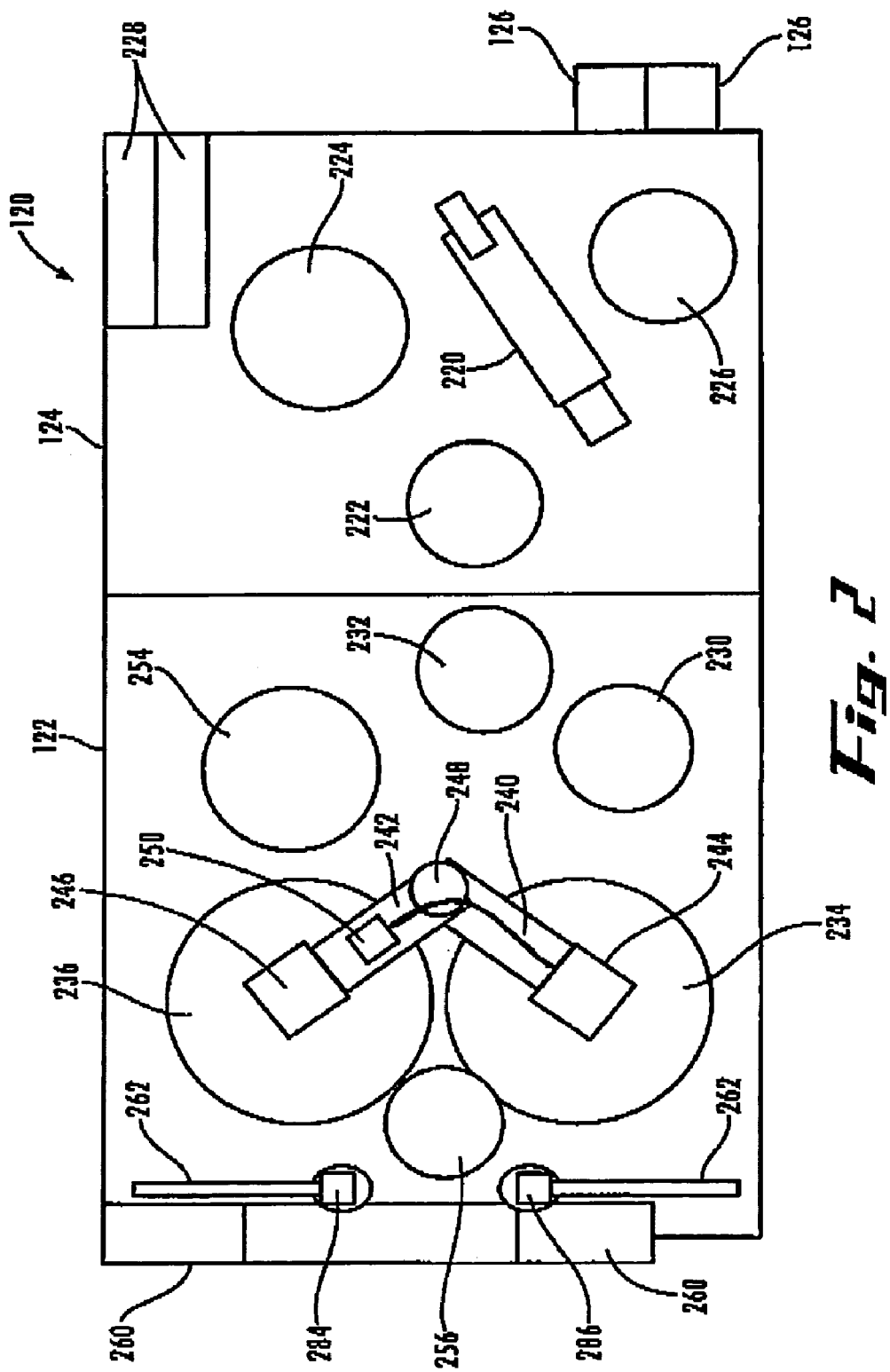
FIG. 2 depicts a simplified overhead view of the wafer processing system of FIG. 1.

FIG. 2 depicts a simplified overhead view of the wafer processing system 120 of FIG. 1 according to some embodiments with the processing module 122 being secured with the front-end module 124, and two storage elements 126 are secured with the front-end module. FIG. 3 depicts a more detailed overhead view of the wafer processing system 120 of FIGS. 1 and 2 according to some implementations. Referring to FIGS. 2 and 3, the storage elements 126 can be substantially any device that stores objects for processing and can be accessed by the front-end module. For example, the storage elements can be front opening unified pod (FOUP) with pod door openers for storing wafers, standard mechanical interfaces (SMIF), cassettes with open cassette loaders, a basin containing fluid within which the wafers are stored, and other similar devices. In other embodiments, a cart carrying the basin is inserted within the front-end 124 allowing the basin to be positioned within the front-end allowing processed wafers to be inserted into the basin and/or wafers retrieved from the basin. The front-end module typically includes one or more mounting faces (e.g., Box Opener/Loader to Tool Standard (BOLTS) interface) that allow the FOUPs, SMIFs, cassettes and other storage devices to be mounted with the front-end module. In some embodiments, the mounting face(s) is adjustable up and down, and side to side for alignment with the storage device.

The front-end module 124 includes a transport device such as a robot 220 that extracts wafers or other objects from the storage elements 126. The robot control is programmed to retrieve the wafers, transport the wafers to the processing module 122 and return the processed wafers to a storage element. Some preferred embodiments limit the front-end module to a single robot 220. By limiting the system to a single robot, the front-end module can be constructed with a significantly reduced area or foot print, at a reduced cost, reduced complexity and an increased reliability. The single robot implementation, however, can be limiting in processing speed and throughput, but the benefits of reduced size, cost, and complexity, and the increased reliability compensates for the trade off of reduced throughput. Alternative embodiments of the front-end module, however, can be constructed with multiple robots that can be cooperated with the processing module 122 as introduced above. The overall size of the system 120 can be critical for some users as the square footage of floor or facility space, such as within a clean room, occupied by the system can be extremely limited and typically relatively valuable.

The robot is implemented in some embodiments through a six (6) axis robot. The six axis robot allows the front-end module to perform functions that other systems, such as other CMP systems employing common polar style robots, cannot perform, or cannot perform without the inclusion of multiple robots. Typically, with standard polar style robots the robots operate horizontally and substantially every aspect of the positioning of the wafer and the components receiving the wafer are positioned substantially horizontal (e.g., parallel with the ground). This horizontal limitation restricts the movement of the wafer and the configuration of the devices and/or positioned that receive the wafers (such as increasing the size of the system).

Alternatively, the six axis robot utilized in present embodiments allows for horizontal movement and placement of the wafer, vertical movement and placement of the wafer, as well substantially any orientation. Components of the system and the carts or FOUPs cooperating with the system do not have to precisely align as the six axis robot can be moved to adjust for and/or compensate for the misalignment. During a setup of the system, the robot can be manually manipulated to desired locations where the positioning, tilt, angle and other parameters set through the manual manipulation are stored for future identification by the robot during operation.

The robot 220 utilizes end effectors to grasp the wafers during transport. In some embodiments, the robot utilizes two separate end effectors implemented by using tool changers 370, 372. A first end effector 370 can be utilized for grasping and transporting dry wafers, and the second end effector 372 can be used for grasping and transporting wet wafers as further described below. A transfer station 222 is included in some embodiments within the front-end module where the robot 220 positions wafers while switching between end effectors. The transfer station in some implementations receives the wafers in a generally vertical orientation relative to the ground or the polishing tables, and in some implementations is at a slight angle (e.g., about 15 degrees from vertical).

Some embodiments of the front-end module 124 optionally include one or more single station wafer cleaners 224, and/or measuring stage 226. For example, the measuring equipment can include Nova equipment and/or other equipment. The single station wafer cleaner 224 can be included to perform multi-stage washing and clean of processed wafers prior to returning the wafers to a cassette or FOUP, or other storage. The use of a single station cleaner saves space typically at the sacrifice of throughput. Typically, other CMP systems attempt to optimize throughput and are not particularly concerned with the size of the system. Other embodiments of the system 120 can include multiple single station cleaners to increase throughput, or include a series of stations for performing different stages of cleaning, at the cost of typically increasing the size of the front-end module 124.

One or more electrical cabinets and/or control circuitry 228 can also be included in the front-end module to power, control and drive the components of the front-end module 124. The front-end module can include additional features and/or devices, such as filtering system to allow cleaned air to be introduced into the system, such as a high-efficiency particulate air (HEPA) filtering system. Pre-alignment methods can be included to aid in aligning and securing cassettes, FOUPs or other devices with the front-end module as well as aligning the front-end module 124 with the processing module 122. Similarly, a wafer identification (ID) reader can be included to read an ID from the wafer and record the processing of the wafer for many different uses, such as verifying and/or identifying the type of processing to implement through the processing module 122, record keeping, stock count, and/or other purposes. Some embodiments of the front-end module further include a user interface 174 (typically including a keyboard or other input device, and a monitor). Some embodiments alternatively and/or additionally provide data ports tat allow an external user interface to be cooperated with the system 120 from a distance. The user interface allows the user to control the operation of the system 120, monitor the system, retrieve reports and data from the system, and alter the operation of the system.

As introduced above, the front-end module 124 can be configured with a wet basin and/or cassette (e.g., cassette 3214 of FIG. 32 as more fully described below). The wet basin receives the wafers following processing in the processing module 122, and keeps the wafers wet so that slurry and/or other processing chemicals and materials do not dry on the wafer. The wet basin can be positioned within a basin holder that can raise and lower the basin. In some implementations, the wet basin and holder are incorporated instead of a cleaner and/or a measurement system 226, again maintaining a desirable footprint.

Because the front-end module 124 is removable from the processing module 122, and can incorporate many different features and functionality, the front-end module can be configured for different defined specifications to meet specific user's needs. The customizing of the front-end module allows the system 120 to meet different user demands, provide alternate enhancements and allow customized processing.

The processing module 122 includes a load station 230 and an unload station 232, one or more polishing tables 234, 236, and one or more spindles 240, 242. In the embodiment shown in FIG. 2, the processing module includes two polishing tables 234 and 236, and two spindles 240 and 242. Other embodiments can include three or more polishing tables and spindles, or only one polishing table and spindle. Each spindle includes a carrier 244, 246 for carrying wafers for processing. The spindles 240, 242 are secured with independently rotating turrets 248 that rotate and position the carriers 244, 246. A carrier controller 250 is secured with one of the spindles/carriers to drive the rotation of both spindles. The carrier controller drives the rotation of each spindle independently such that both spindles can be rotating simultaneously, the first spindle 240 can be rotated while the second spindle 242 is stationary, and vice versa. The processing module 122 can optionally further include a buff table 254 and/or a rinse station 256. Electronic circuitry, power, power control and operational control 260 are included in electronic cabinets. The electronic cabinets can be attached as shown, or be detached as separate cabinets from the processing module 122. The circuitry couples with the respective components of the processing module to power and/or control the operation of the components. Pad conditioners 262 can also be included. The front-end module 124 and the processing module 122 can additionally include other components for wafer processing as is known in the art.

In operation, the robot 220 utilizes, in some embodiments, the two different end effectors, a wet end effector and a dry end effector. The robot switches between the end effectors depending on the stage of processing for the wafer being grasped. By utilizing the two separate end effectors, the present embodiments operate through a single robot transport 220. Limiting the system to a single robot 220 reduces cost, complexity and provides other advantages. Some alternative embodiments, however, may include multiple robots.

In some embodiments, the robot 220 positions a first end effector (e.g., wet effector) at an effector storage location, disengages from the first end effector and engages the second effector (e.g., dry effector) from its storage location. By engaging the end effector, the robot electrically and pneumatically couples with and engages the end effector to supply electrical power and/or control signals. In some embodiments, a tool changer apparatus is incorporated into the robot 220 to allow for the engagement and disengagement of the effectors. The tool change includes a mechanical latching mechanism, in some implementations, to engage the end effectors providing both electrical and pneumatic connections. In operation for example, the robot utilizes the dry end effector to retrieve wafers from the FOUP cassette to be processed and to return wafers that have been processed to avoid contaminating the clean environment of the cassette. The robot temporarily places the dry wafer at the transfer station 222, switches to a wet end effector, grasps the wafer and transfers the wafer to the load station 230 of the processing module 122. In the embodiment shown in FIGS. 2 and 3, the transfer station is positioned between wafer cleaner 224 and the measurement system 226.

Figure 28A:
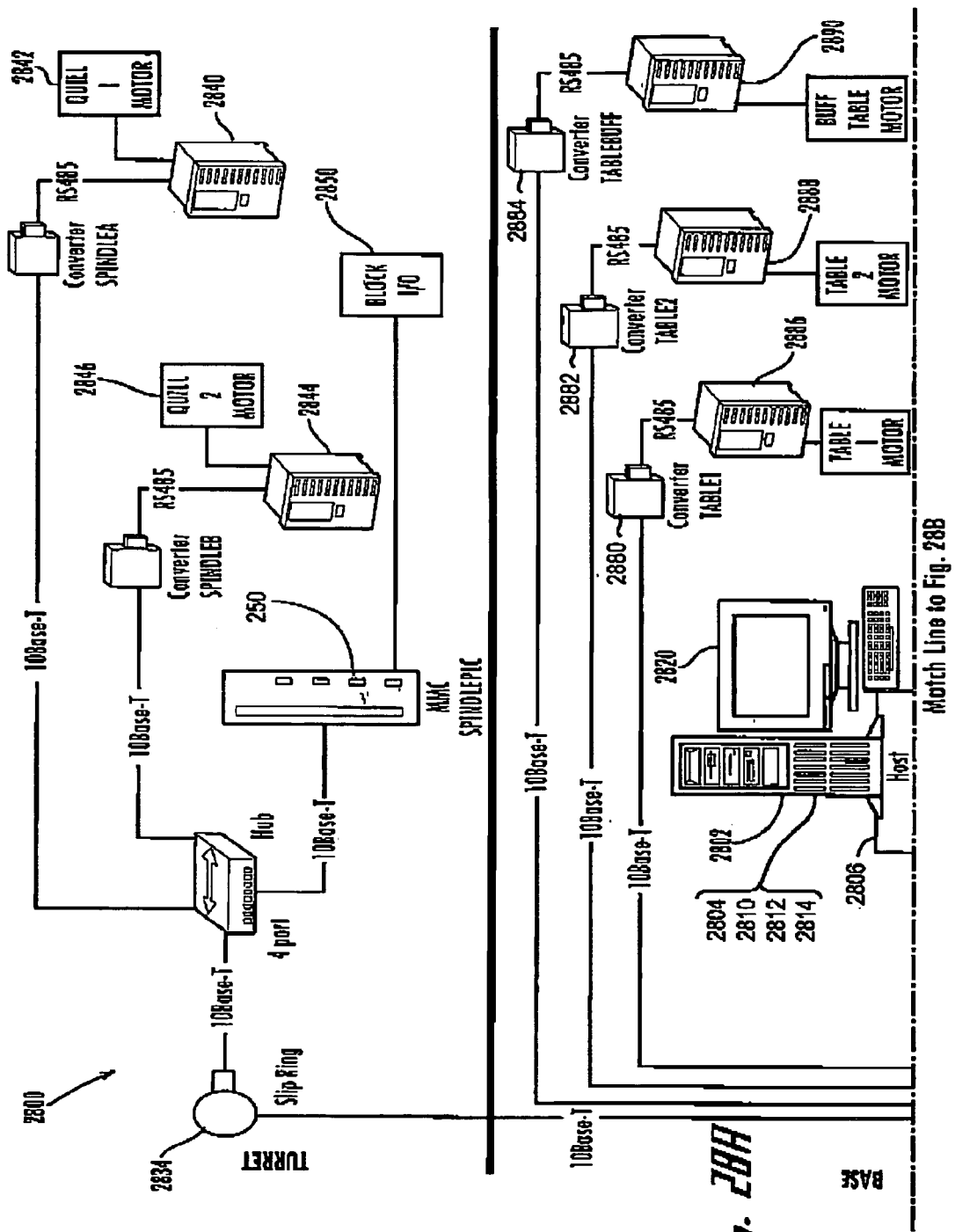
FIG. 28 depicts a simplified block diagram of a control system for a wafer processing system according to some present embodiments.

The wafer is precisely positioned within the load station 230. The precision is achieved through several advantageous characteristics and components of the end effector and load station as described in detail below. Once positioned in the load station, a wafer sensor 26 (see FIG. 16) detects the presence of the wafer and initiates the operation of one of the spindles, e.g., spindle 246. The turret and spindle controllers 250 (which, in some embodiments is implemented through controllers as shown in FIG. 28) causes one of the turrets 248 to rotate the spindle 246 into position over the load station, picks up the wafer and moves the wafer to the first polishing table 234 for polishing (or other processing, such as grinding and the like). The robot 220 is notified by the wafer sensors in the carrier and load station that the load station is empty such that the robot retrieves and delivers another wafer to the load station. The turret and spindle controller(s) 250 (such as controllers 2810, of FIG. 28) then rotate the second spindle 242 around to retrieve the second wafer for processing. Because of the design of the present embodiments, the spindles operate independently allowing improved operation over fixed turrets. For example, one turret/spindle can be polishing while the other turret/spindle is rotating to load or unload wafers.

Once the polishing and/or processing of the wafer are complete at the first polishing table 234, the turret rotates for additional processing. For example, the first spindle 240 may be rotated to an optional rinse station 256, if incompatible polishing slurries are used on the separate polishing tables 234, 236. Alternatively, rinsing can also aid in preventing particle contamination, drying of the processing chemicals, and/or scratches from forming on the wafers during processing. The rinse station 256 can further be employed to provide a quick rinse, to rinse quick drying slurries, cool the wafer, reduce particles on the wafer, clean the carrier, and/or provide a second place to temporarily place a wafer if the processing gets stalled, if the processing on the second polishing table 236 takes longer than the process on the first polishing table, and/or other reasons. The turret can then be rotated to the second polishing table 236 for further polishing and/or processing. While the first spindle is shifting the placement of the first wafer, the second spindle 242 can independently rotate to retrieve a second wafer and position the second wafer at the first polishing table 234. Once the processing of the first wafer is completed at the second polishing table 236, the first spindle/carrier 244 can deliver the wafer to the buff table 254 to buff the wafer (when the optional buff table is present), for example through a water buff to clean the wafer, and/or then transfer the wafer to the unload station 232. In some embodiments, a sensor similar to the sensor 26 in the load station is used to verify the presence of a wafer at the unload station. The robot 220 then retrieves the processed wafer with the wet end effector to move the wafer to the measurement tool 226 or cleaner 224 (when present). After measurements are complete and the wafer meets predefined criteria, the wafer is shifted to the cleaner 224 (when present) where it is cleaned and dried. The robot switches to the dry end effector, picks up the cleaned and dried wafer and returns the processed wafer to the FOUP 126. Alternatively, when there is no cleaner station 224, the robot continues to use the wet effector and places the wafer into a wet storage device.

The spindles 240, 242 continue to rotate, typically in a single direction (e.g., clockwise), to process a series of wafers. This is referred to as "serial processing." Alternatively, each spindle can be dedicated to a specific polish table, commonly referred to as "parallel processing." For example, the first and second spindles can alternatively be configured for predefined positioning movements of the wafer. For example, the first spindle can be configured to retrieve the wafers from the load station 230, perform the first processing on the first table 234, and move the wafer to the rinse station. The second spindle can perform the second processing at the second table 236 and place the processed wafer in the unload station 232.

The system 120 can be continuously operated as long as wafers are supplied for processing. The spindles do not have to be unwound because the system employs a rotary union for coupling fluids to the spindles and a slip ring for coupling electrical power and/or control signals, as described fully below.

In some implementations, the turrets 248 are implemented in separate bearing systems that are concentric. For example, a first bearing system for the first spindle 240 can be positioned concentrically within a second bearing system for the second spindle 242. A first solid column or tower can house the second bearing system and the first bearing system can be housed within the second bearing systems. Further, tubes are included within the tower to deliver fluids through the rotary union.

Figure 40:
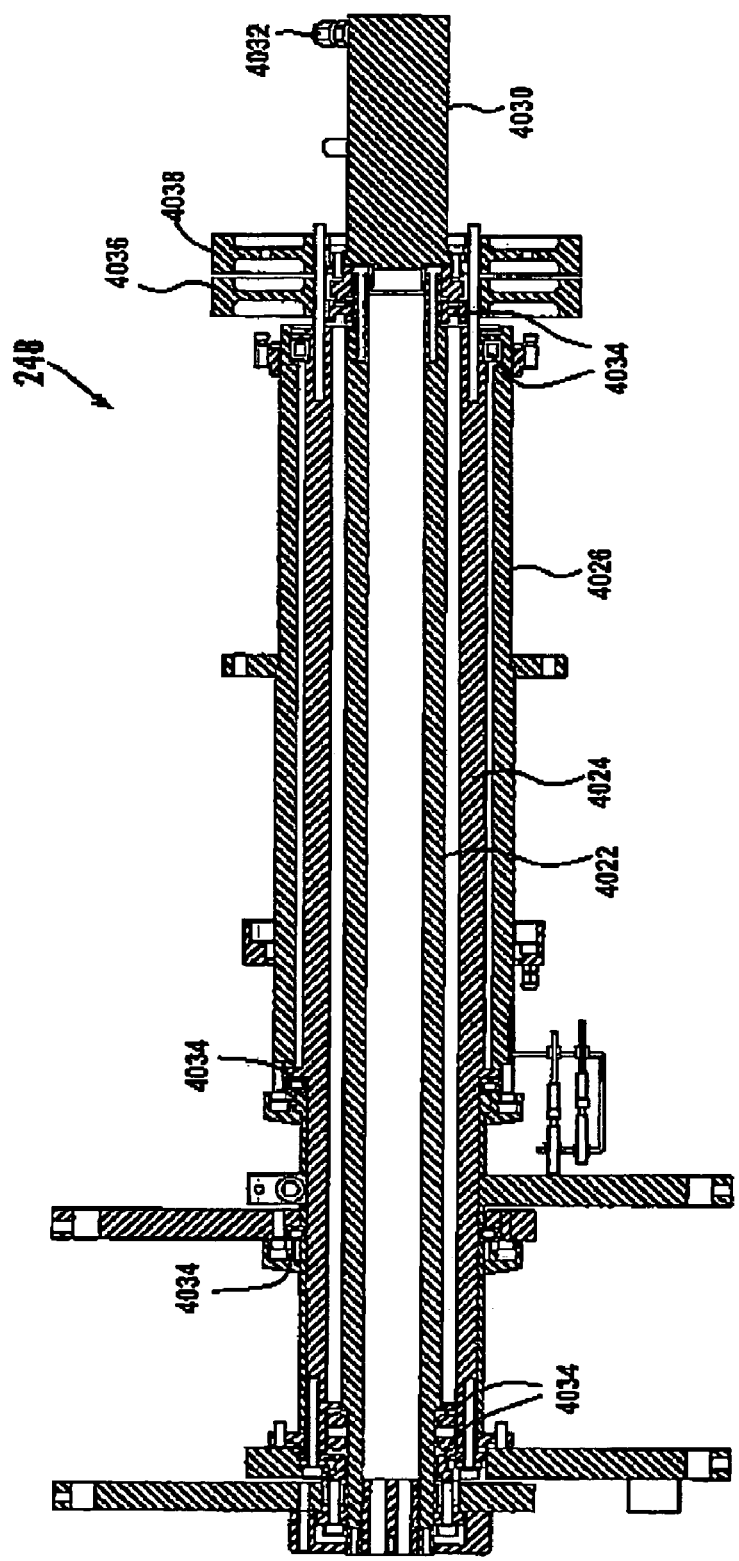
FIG. 40 shows a simplified cross-sectional view of the turret according to some embodiments.

Each turret is driven separately by separate motor, harmonic drive and gear reduction systems (not shown) to move and position the carriers 244, 246. FIG. 40 shows a simplified cross-sectional view of the turret assembly 248 according to some embodiments that includes first or inner turret 4022, concentric second or outer turret 4024, tower housing 4026, rotary union 4030 wit fluid fittings 4032; bearings 4034, belt or drive pullies or sprockets 4036, 4038, and other elements. The separate motors implement independent indexing of the carriers 244, 246 and further can independently oscillate the spindle/carrier as the wafer is being forced onto the tables 234, 236 (e.g., oscillating the wafer about half an inch, an inch or other distances over the polishing table as the wafer is in contact with the rotating table). The oscillation can be implemented at variable rates (e.g., the frequency of oscillation (cycles per minute) can be varied), the amount of movement relative to the tables can be controlled, and the positioning of the wafer radially along the tables can also be independently controlled. The independent oscillation and positioning allows for greater control over the polishing, grinding or other processing of the wafer. Similarly, the rate of polishing is a function of velocity of the polishing pad and controlling the positioning of the wafer on the table allows the system to take advantage of the differences in rotational velocity of the polishing pad as a function of the radial distance from the center of the rotating pad. Single central turret designs of prior art systems do not allow the independent positioning oscillation of the wafers, and when the position of one wafer is shifted, the positioning of other wafers or carriers are similarly shifted.

A rotary union 4030 couples with the tubes to communicate fluids to and/or from the spindles 240, 242 and between the spindles. The fluids can include substantially any fluid, such as air, nitrogen, vacuum, water, and other such fluids. A slip ring 2834 (see FIGS. 28) is further included with the turrets to deliver electrical power (at various voltages) and electrical signals to communicate to the spindle controller 250 and between spindles. In some embodiments, the electrical signals are communicated through Ethernet connections through the slip ring to the spindle controller. Instead of and/or in cooperation with the slip ring, the system m some embodiments employs wireless communication (e.g., radio frequency (RF), infrared, Bluetooth, and other such wireless coupling) and/or optical communication, such as through fiber optical coupling. Further, an inductive coupler, battery power and/or other similar powering schemes can be employed to deliver power to the spindles allowing continuous rotation of the spindles.

In some implementations, the system includes one spindle controller 250. Both fluid and electrical signals are communicated to a single spindle (e.g., second spindle 242). From the second spindle, the first spindle 240 is electrically coupled with the second spindle and fluid carrying tubing is included to connect the fluids from the second spindle to the first spindle. For example, a cable carrier is included in some implementations to establish the electrical connections between the two spindles and allow control signals to be communicated from the spindle controller 250 to the first spindle 240. As such, the first spindle is daisy chained from the second spindle. In embodiments where the system 120 includes a third spindle, the third spindle can be coupled in parallel with the first spindle from the second spindle or further daisy chained from the first spindle to receive electrical control signals and power, and fluids.

In some preferred embodiments, the system is implemented with commercially available components, and the numbers of components incorporated into the system are limited to achieve a system with a reduced size, reduced parts, simplified design, and simplified operation, while maintaining a high degree of reliability and consistency. In achieving these criteria, these specific implementations are limited to the single robot 220, and only two spindles/carriers 240, 242 and polishing tables 234, 236. The single robot 220 where effectors are switched and a single station cleaner 224 simplify the design and reduce the size of the system 120. Further, the reduced components significantly reduce the cost of manufacture and maintenance.

The present embodiments employ independent spindle indexing which eliminates the need to backup (counter rotate)., when processing calls for motions between the multiple processing/polishing tables 234, 236. The rotation allows continuous 360-degree motion of wafers around the turret without backing up. However, the spindles can be backed up when desired, for example, the spindle 242 can rotate the wafer in a counter-clockwise direction back to the optional rinse station 256 following a polishing at the second polishing table 236 prior to rotating the spindle in the clockwise direction to deposit the wafer at the unload station 232 or buff table 254. Independent motion allows for one spindle to be polishing a wafer while the second spindle is polishing or rinsing another wafer, and/or loading or unloading. This capability improves throughput as well as process options for an operator, for example, because each step does not have to be the same duration. Other previous systems had multiple spindles tied together so that they were required to move simultaneously together, limiting the throughput and/or process options. The present embodiments allow for greater flexibility and improved throughput while employing fewer spindles, saving cost and reducing complexity. The independent operation of the spindles further allows the system to rotate the spindles either backwards or forwards to an available station to avoid letting the wafer dry and/or keep wafer wet during processing or during an interrupt of processing because some processing chemicals can damage a wafer when allowed to dry on the wafer. For example, the first spindle 240 can shift the wafer to the rinse station 256 and the second spindle 242 could rotate to place the wafer into the buff table, unload station 232 or load station 230 depending on proximity and availability.

The independent spindle indexing is implemented in some embodiments through encoded motor, closed loop servo-control, the combination of the slip ring 2834 (see FIG. 28) at a top of the tower of the turret 248 for electrical signal and power (e.g., 400V and 24V electrical power, and Ethernet signals) and the rotary union at bottom of the tower provides for the delivery and/or withdrawal of one or more fluids, and/or distributed control with MMC(s) (Machine Motion controller(s)) located on one spindle assembly (e.g., second spindle 242) so that few signal lines are to be sent through the slip ring(s). The spindles are wired and tubed together, in some implementations, to carry electrical signals and fluids to each spindle. Fiber optic, RF, infrared, wireless Bluetooth and/or other methods of delivery could additionally and/or alternatively be employed. In some implementations, the rotary union is a four-passage utilities system for water, air, vacuum and Nitrogen. Additional and/or alternative fluids can similarly be utilized. In embodiments where a third spindle assembly is added, a fifth (or more) fluid passages can be added to achieve adequate volumes. Alternately, the four passage rotary union's capacity is increased. The three or more spindle implementations can be desirable for higher through put, such as when polishing times are of relatively short duration.

By utilizing the indexing, precise positioning of the carrier and wafer can be achieved. The present embodiments include an indexing of each of the motors rotation and/or the rotation of the turrets 248. Further, the indexing from station to station is employed to monitor the location of the carriers and wafers and the processing of the wafers, and controlling the oscillation of the carriers. In some implementations, a controller 2810 (see FIG. 28) controls the indexing of the spindles from station to station and the oscillating of the spindles. Spindle controller 250 controls the rotation of the spindles, the up and down motion of the carriers and wafer, back pressure, ring force, and the level of downward force applied by the carrier onto the wafer during polishing. The spindle controller 250 can be implemented through a programmable logic controller (PLC), a microprocessor, or other control device. The Ethernet connection through the slip ring reduced the number of wired and/or channels that has to be communicated through the slip ring. Signaling is received by the spindle controller 250 which controls both the first and second spindles through a cable carrier between spindles. In some embodiments, the spindles further include biasing springs that bias the carriers 244, 246, and thus the wafer, in an up position or a position away from polishing tables 234, 236. By biasing the carriers away from the tables, the system provides a safety mechanism and reduces damage to wafers in the event of temporary or long term power loss or other problems than can interrupt the control of the processing of a wafer. The spindles can further include air powered boots that can implement the downward movement and force of the carrier and wafers as further described below. Other mechanisms can be employed to move the cater and wafer between up and down positions and assert the downward force during processing, such as hydraulics, screw drive, or other such relevant mechanisms.

Figure 5:
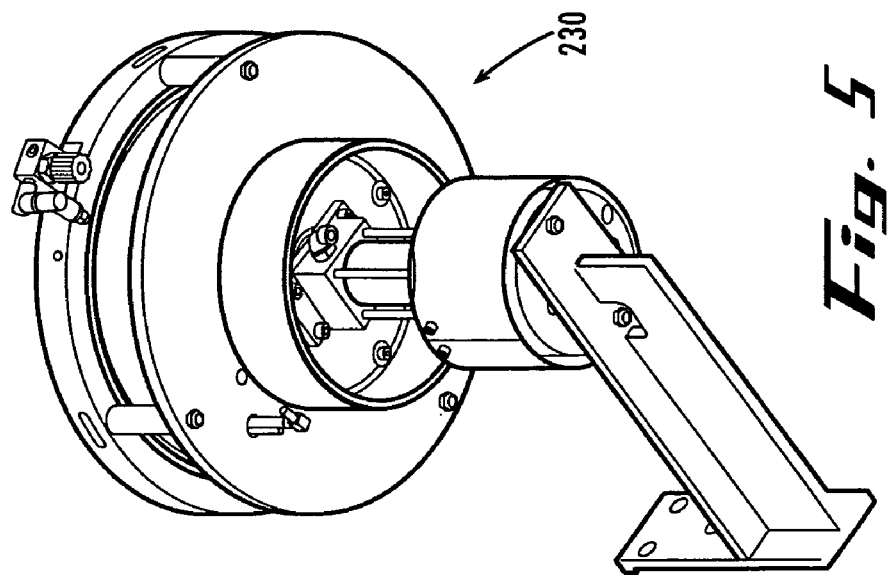
FIG. 5 shows the load station of FIG. 4 from a lower perspective.
Figure 4:
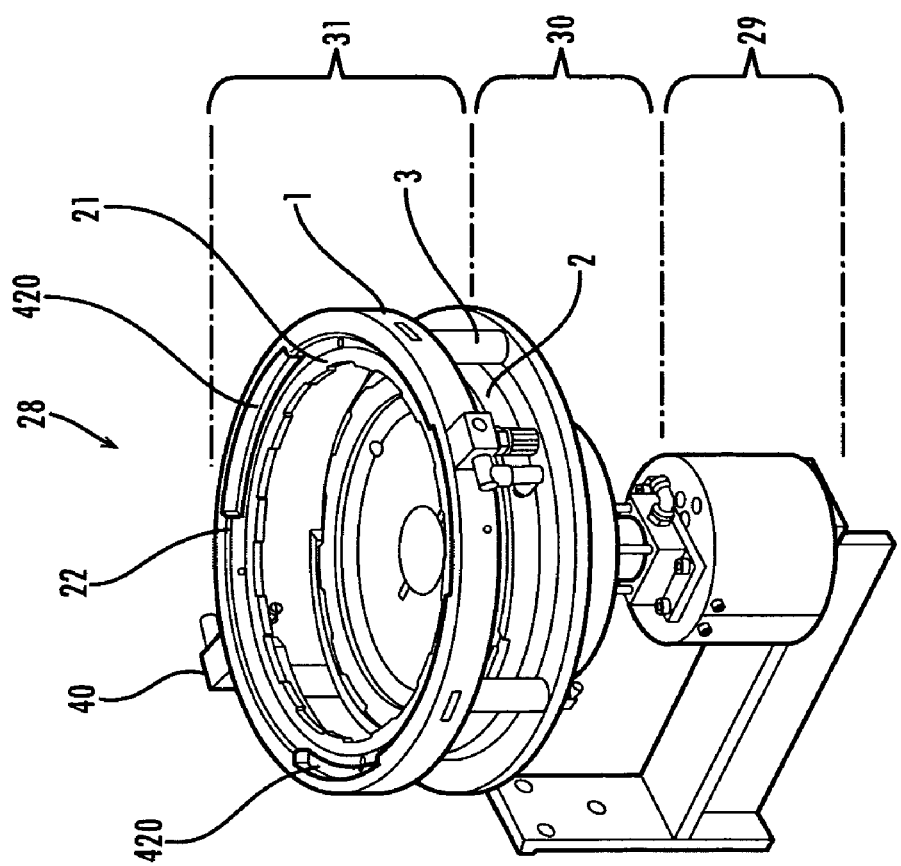
FIG. 4 depicts a perspective view of a load station according to some present embodiments.

FIG. 4 depicts a perspective view of a load station 230 according to some present embodiments. FIG. 5 shows the load station 230 of FIG. 4 from a lower perspective looking up at the load station. In this embodiment the load station is an edge-contact load station, where the load station contacts the wafer at the edges (defined by the transitioning area extending between the two generally planar face surfaces of the wafer) and/or around a relatively small area about the perimeter of the planar face surfaces of the wafer (e.g., typically less than about 0.005 times the diameter of the wafer extending from the edge toward the center). Some embodiments further include a sensor 26 (see FIGS. 12 and 17) that confirms the wafer is properly positioned on the load station. The load station 230 of the present embodiments simplifies and provides highly accurate placement of the wafer within the load guide, and further simplifies and ensures accurate placement of the wafer with the carrier 244, 246 of the spindle 240, 242. This accurate placement is achieved at least in part by allowing a range of misalignment between the load station 230 and the carrier 244, and/or a misalignment between the load station 230 and the robot 220.

Still referring to FIGS. 4 and 5, the load station 230 includes a first or lower section 29, a second or middle section 30, and a third or upper section 31. FIG. 6 depicts an exploded view of the lower section 29 according to some embodiments. The lower section 29 contains linear rail assemblies 11, which in some implementations include a linear ball bearing arrangement. The load station is mounted on these linear rail assemblies to allow alignment adjustments of the load station in the X and Y directions. The linear rail assemblies 11 are mounted to rail bases 14. One or both of the rail bases are secured with a load station base 32 that connects the entire load station 230 to the system 120. The lower section 29 also contains springs 13 that bias the load station and allow adjustments of the position of the load station 230 in the X and Y directions, as fully described below. These springs 13, at least in part, return the load station to a known or centered position. Adjustment knobs 12 are further included in some embodiments to bias the adjustments to positioning and align the load station with the carrier 244 and/or robot 220. A cylinder base 15 is secured with one or more of the rail assemblies 11 and/or rail bases 14 such that the cylinder base shifts in the X and Y directions. One or more of the springs 13 are secured with the rail base 14 to bias the cylinder base 15 to a center position (as defined through the adjustment of the adjustment knobs 12). The biasing springs and linear bearing rail array assembly 11 allow for relatively large amounts of misalignment between the load station 230 and the spindle carriers 244, 246, as well as misalignment between the load station 230 and the robot 220.

Figure 11:
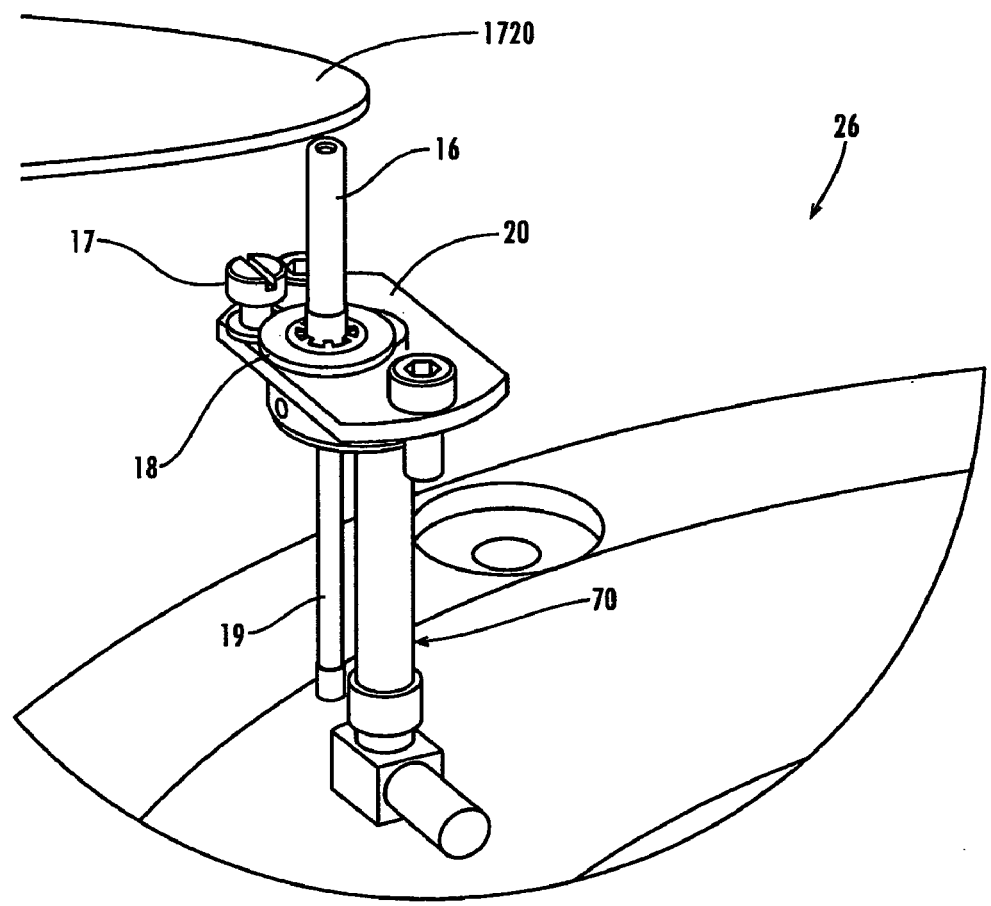

FIG. 7 depicts a partial cut-away, elevated perspective view of the lower section 29 with the cylinder base 15, linear rail arrays 11 and rail bases 14 assembled and secured with the load station base 32. FIG. 8 depicts a partial cut-away, lower perspective view of the assembled lower section 29 with the springs 13 that force the linear rail arrays to a selected center position. FIGS. 9–11 depict enlarged views of the springs 13 coupled with the linear rail arrays and extending through and/or secured with the rail bases 14.

Figure 12:
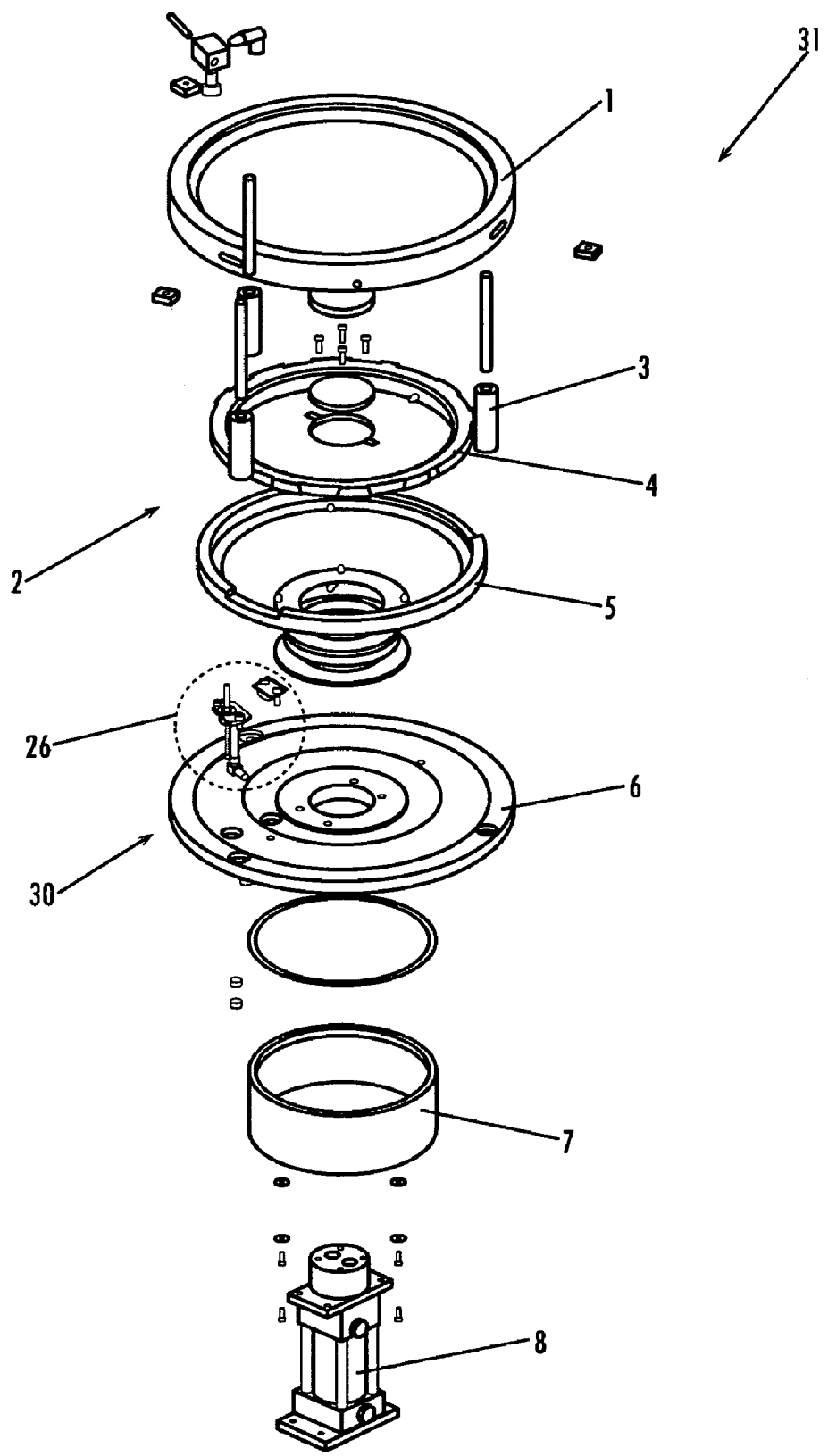
FIG. 12 depicts an exploded view of the middle and upper sections of the load station of FIG. 4.
Figure 13:
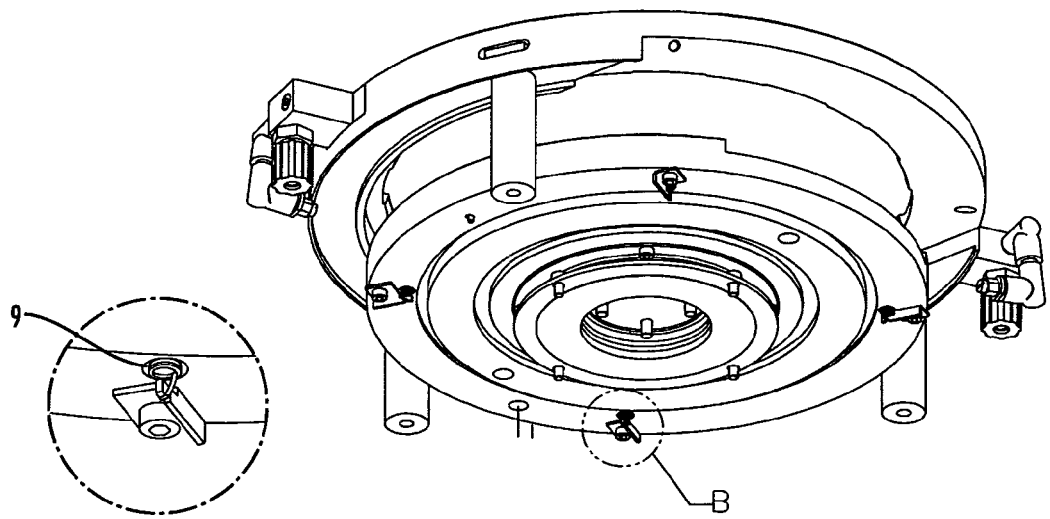
FIG. 13 depicting an enlarged view of spring forcing a chuck wafer and a wafer guide ring of the middle and upper sections of FIG. 12 together.

FIG. 12 depicts an exploded view of the middle and upper sections 30 and 31, respectively. The middle section 30 includes a wafer chuck assembly 2. In some embodiments, the wafer chuck assembly contains a wafer chuck 4 and wafer guide ring 5. The robot 220 places the wafer into the wafer chuck 4 in preparation for loading into the carrier 244. The wafer chuck 4 is seated within the wafer guide ring 5. The wafer chuck 4 and the wafer guide ring 5 are forced together with springs 9 (see FIG. 13 depicting an enlarged view of the spring 9 forcing the chuck wafer 4 and the wafer guide ring 5 together). The wafer chuck 4 and wafer guide ring 5 together create a pocket to receive the wafer from the robot 220. Further, in some embodiments, the wafer chuck 4 and wafer guide ring 5 are configured such that the wafer only contacts the wafer chuck around an edge of the wafer. The wafer chuck 4 is mounted through a base plate 6 to a cylinder 8 that lifts the wafer toward and/or into the carrier 244, and retracts the wafer chuck assembly 2. The cylinder 8 can be implemented through substantially any relevant lift, such as a hydraulic lift (e.g., a double-rod hydraulic cylinder), a screw drive or other such mechanisms or combinations of mechanisms.

The stationary body of the cylinder 8 is mounted to the base plate 6 which connects the lower section 29, middle section 30, and upper section 31 together. Some embodiments further include one or more wafer sensor assemblies 26 in the middle section 30 to detect when the wafer has been properly and/or improperly placed on the wafer chuck 4. A shield 7 is also included at the bottom of the middle section that protects the lift from water and other contaminants.

The upper section 31 contains a load guide ring 1, standoff separators 3 and a sprayer 40 (see FIG. 4). Referring to FIGS. 4 and 12, the load guide ring 1 includes a chamfer 22 along an inner surface. An internal ledge defines a carrier load pocket 21. The components of the load station 230 that are potentially exposed to processing chemicals are generally constructed of corrosion resistant materials, such as plastics, stainless steel, titanium, aluminum and other relevant corrosion resistant materials. Other components protected from processing chemicals can be constructed of the same corrosion resistant materials or other materials, such as steel and other relevant materials.

Figure 14:
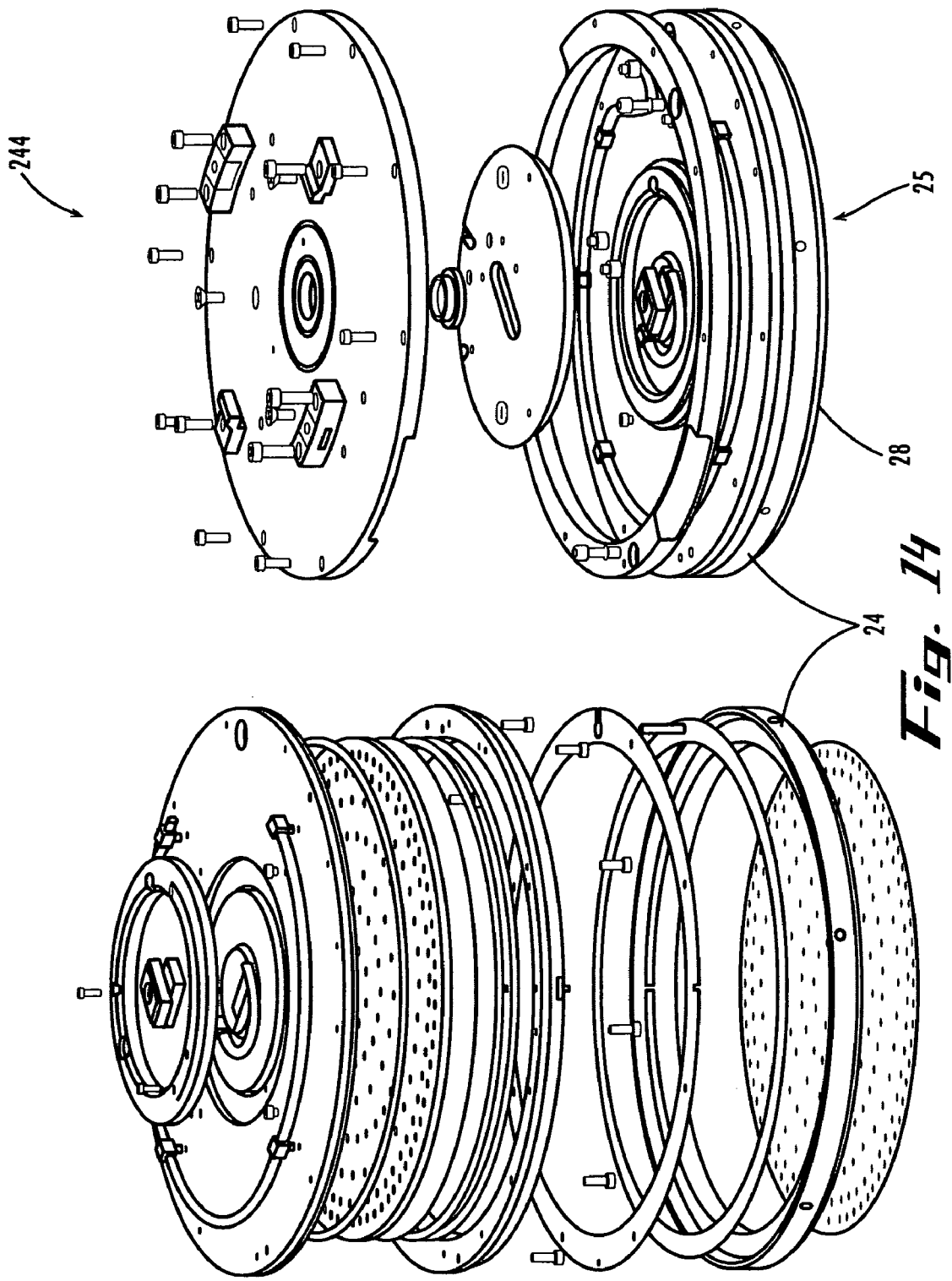
FIG. 14 depicts an exploded view of a carrier according to some embodiments.

FIG. 14 depicts an exploded view of a carrier 244 according to some embodiments. The carrier includes a retaining ring 24 that has a chamfer 28 defined at an exterior, leading edge of the retaining ring 24. A carrier pocket 25 is defined within the retaining ring to receive the wafer from the load station. In operation, the carrier 24 is seated into the load guide ring 1 of the load station 230 to retrieve the wafer from the load station. The chamfer 28 of the retaining ring 24 cooperates with the chamfer 22 of the loading guide ring 1 to provide compensation for misalignment between the carrier 244 and the load station 230.

The chamfering 22 of the load guide ring 1, in part compensates for misalignment with the carrier, but further provides at least some compensation for misalignment of the load station relative to the robot 220. In delivering wafers to the load station 230, the robot 220 places a wafer in the wafer guide ring 5. The configuration of the load station allows for a predefined amount of misalignment with the robot, and in part the chamfered upper edge 22 of the wafer guide ring 5 allows compensation of some misalignment. Similarly, the springs 13 can also provide some adjustment to the misalignment. However, the misalignment tolerance between the robot 220 and the load station 230 is typically less than the misalignment tolerance allowed through the present embodiments between the carrier 244 and the load station 230. For example, in some implementations the misalignment tolerance between the robot 220 and the load station 230 is less than about 0.1 inches, and in some preferred embodiments, less than about 0.05 inches.

In some implementations, the load station 230 is initially aligned with the carriers 244, 246 using the adjustment knobs 12 defining a center position. The robot 220 and/or robot controls are then programmed to move to the defined centered position. As such, the carriers, in some embodiments, dictate the centered position of the load station 230. The chamfers 22 and 28 on the load station 260 and carriers 244, 246, respectively, make it simple to adjust the load station 230 by not requiring the technician to adjust the position of the load station to a high degree of accuracy. Also, as the system 120 is operated, the carrier(s) 244, 246 may become misaligned to the load station. Because the load station allows for a relatively large degree of misalignment tolerance and is accepting of these misalignments, the system can continue to be operated for a longer time before being realigned.

In some embodiments, the adjustment knobs 12 can additionally and/or alternatively be utilized to accurately align the load station 230 and robot 220 to within the defined misalignment tolerance (e.g., less than about 0.05 inches). This adjusted alignment defines and/or redefines the center position of the load station.

The carrier 244 of the spindle 240 is positioned over the load station 230 when the carrier is to retrieve the wafer. The carrier is directed downward in an arching motion onto the load station in preparation for retrieving the wafer. The carrier further includes the chamfer 28 on the outer edge of the retaining ring 24, and the load station 230 includes the chamfering 22 on the interior of the load guide ring 1. The dual cooperation of the two chamfers, at least in part, allows for the carrier and load station to be misaligned. Further, by positioning the wafer chuck assembly 2 and load guide ring 1 on the linear ray assemblies 11, the load station can be shifted in the X and Y directions by predefined amounts depending on the length of the linear rail arrays. The springs 13 bias the load station to the desired center position. In some embodiments, the misalignment tolerance between the carrier 240 and the load station 230 can be about 0.25 inches, because the carrier 244 applies sufficient force to the load station when misaligned within the tolerance to overcome the spring force from springs 13 and shift the position of the loading wafer chuck assembly 2 and loading guide ring 1 into alignment.

Because the misalignment tolerance between the robot 220 and the load station 230 is typically less than the misalignment between the carrier 244 and the load station, the present embodiments compensate for these two differences in variation, by mounting the load station on the linear rail arrays 11. The linear rails allow the load station to slide in both the X and Y axes. As a result, when the misalignment of the carrier 244 and the load station 230 is within the tolerance, the chamfering 22 and 28 of both the load guide ring 1 and the retaining ring 24, respectively, cause the load station to role along the linear rail arrays in the X and/or Y direction to align the carrier 244 and the load station 230. This shift in positioning of the load station, however, can adversely affect the alignment of the load station 230 with the robot 220. Therefore, the load station is biased to the predefined center position for alignment with the robot. Following a shift of the load station 230 by the carrier 244, once the carrier is withdrawn from the load station, the load station returns to the center position through the biasing.

In some embodiments, the load station includes one or more, and typically a plurality of springs 13 to implement the biasing. The load station can further be centered at the center position (typically defined by the alignment with the carrier) by adjusting the adjustment knobs to shift the positioning of the anchoring of the biasing springs 13 and/or the tension on the one or more springs 13 to center the load station 230 in alignment with the robot 220, within the predefined tolerance as further described fully below.

In some prior art systems, screws would have to be loosened, allowing the load station position to be adjusted, then the screws would be secured to maintain the positioning. The present embodiments avoid this complicated and cumbersome process by allowing the tension within the biasing of the load station 230 to be adjusted.

In removing the wafer from the load station, the carrier is positioned over the load guide ring 1 and is pressed into the carrier load pocket 21 (with the chamfering 22 and 28 cooperating for alignment). The cylinder 8 drives or elevates the wafer chuck assembly 2 and the wafer through an inverted truncated cone aperture in the load guide ring 1, aligning the wafer with the carrier 244, and into carrier pocket 25. The inverted truncated cone in the load guide ring allows for misalignment between the wafer, wafer chuck and load guide ring, such that as it passes through the guide ring the wafer is aligned with the carrier. In some embodiments, the load guide ring 1 further includes one or more cut-outs or recesses 420, and typically a plurality of cut-outs positioned about the circumference of the load guide ring. The cut-outs 420 provide additional areas into which the retaining ring 24 of the carrier 244 can extend due to swelling or expanding of one or both of the load guide ring 1 and retaining ring 24, often as a result of absorbing fluids and/or expansion from heat. The spacing tolerance between the inner diameter of the load guide ring 1 and outer diameter of the retaining ring 24 is precise. The cut-outs effectively provide areas into which the retaining ring 24 can bend or bulge during retrieval of the wafer from the loading station and reducing the friction between the retaining ring 24 and the load guide ring 1 such that the retaining ring is more easily removed from the load guide ring, reducing the likelihood of the retaining ring becoming lodged and stuck in the load guide ring 1.

In other systems, reliable loading often required extremely precise alignment of the spindle (and carrier) center with the load station center in both the X and Y directions in the horizontal plane of the load station. Typically, the spindle and load station centers of these other systems need to be aligned to one another within a tolerance of at most about 1/64 of an inch. As such, frequent realignments of these components are required in these other systems during production operation to maintain reliable loading and to avoid breaking valuable wafers.

The present embodiments, alternatively allow for a relatively much greater misalignment tolerance. For example, in some implementations, the misalignment tolerance between the carrier 244 and the load station 230 can be about 1/4 of an inch, which is about 16 times more tolerant than other systems. This simplifies aligning, reduces the frequency of periodic realignments, improves throughput, improves reliability, reduces wasted wafers and provides other significant advantages.

The capacity to handle misalignments between carrier and load station are achieved, at least in part, by machining matching chamfers 22 and 28 into the load guide ring's load pocket 21 and carrier's retaining ring 24, respectively. The outer diameter of the retaining ring engages and aligns the carrier in the load pocket. These chamfers 22, 28 allow for the misalignment within a predefined tolerance (e.g., about 0.25 inches), and additionally the wafer chuck assembly 2 and load guide ring 1 are free to move in X and Y directions on the linear rail assemblies 11, allowing the load station to freely move and align with the carrier. After the load sequence, the load station 230 shifts back to a known center position by use of springs 13. The return of the load station to the known position after loading the wafer into the carrier aligns the load station 230 with the robot 220 within the predefined misalignment tolerance to ensure the next wafer can be loaded into the load station 230 by the wafer robot 220. The present embodiments allow for the continuous operation of the system 120 to load wafers in the carriers 244, 246 with minimal, and preferably zero failures and without repeated realignments, as is often required in other systems.

Figure 15:
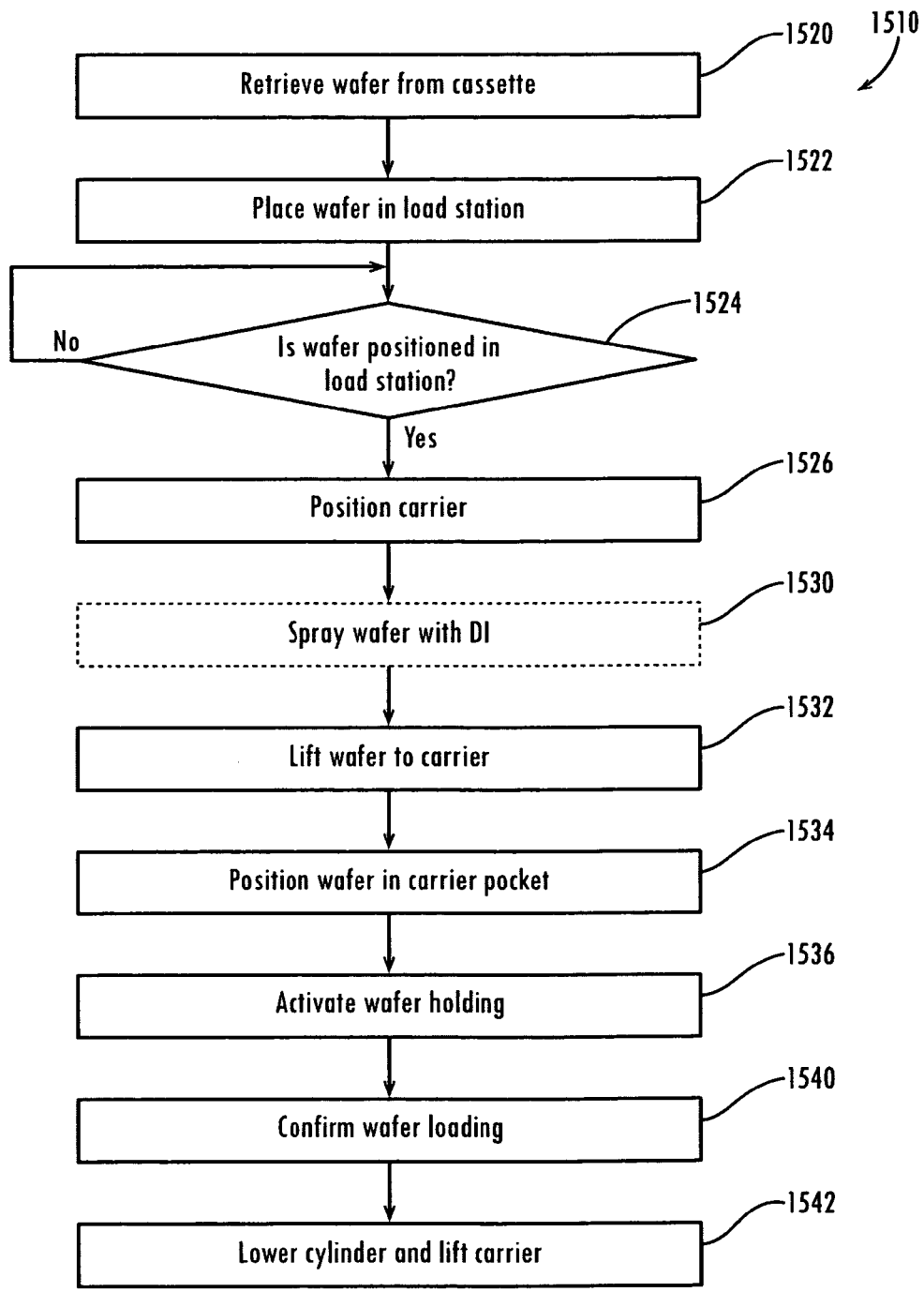
FIG. 15 depicts a simplified flow diagram of a process for loading a wafer into a carrier.

FIG. 15 depicts a simplified flow diagram of a process 1510 for loading a wafer into a carrier 244. In loading a wafer in the carrier, several moveable mechanical elements are coordinated in space and in time to achieve a successful wafer loading. In step 1520 a wafer is selected by the robot 220 from a storage element 126 by an edge-contact end-effector. In some embodiments, vacuum holding on the back of a wafer can also be used, but may not be desirable for some processes. In step 1522 the wafer is moved by the robot to the wafer chuck 4 and placed into the wafer guide ring 5. The wafer chuck 4 and wafer guide ring 5 are designed, in some preferred embodiments, with relief cuts to accommodate edge contacting end effectors. In step 1524 it is determined whether the wafer sensor assembly 26 confirms that the wafer is correctly placed. The sensor assembly communicates the results to a central control center (e.g., control center in electronics 260). In some embodiments, the wafer sensor 26 is a passive type sensor that operates in a very wet environment. The wafer sensor 26 is described in detail below.

If the wafer is not present, the process returns to step 1524 to await the detection of a wafer. Once the wafer sensor 26 detects a wafer in step 1524, the process continues to step 1526 where the carrier (e.g., first carrier 244) is moved into position above the load station 230 and the load guide ring 1. In step 1526, the carrier 244 is lowered into the load guide ring, seating it into carrier load pocket 21 of the load station. In some embodiments, the process includes an optional step 1530, where the backside of the wafer is sprayed with deionized water using sprayer 40 (see FIG. 4). Wetting the backside of the wafer can assist in loading the wafer into the carrier 244 via water tension, as well as can have useful affects during processing.

In step 1532, the cylinder 8 lifts the wafer, wafer chuck 4, and wafer guide ring 5 until the wafer guide ring contacts the bottom of the load guide ring 1. Because the wafer, wafer chuck 4 and wafer guide ring 5 are raised together, the wafer stays centered on the wafer chuck and within the wafer guide ring. Even though the wafer guide ring 5 is now stopped, and in some embodiments, positioned against the bottom of the load guide ring 1, the wafer chuck 4 can continue to lift the wafer up through the load guide ring 1 because the wafer chuck 4 and wafer guide ring are connected by tension springs 9 or some other biasing, which stretch to accommodate the separation. As the wafer passes through the load guide ring 1, it is aligned with the carrier 244. In step 1534, the wafer is pushed up until it is seated into the wafer carrier pocket 25. Splined, segmented, and sloped contacts on the load guide ring 1 and on the wafer chuck 4 are included in some embodiments to allow positioning and reliable alignment of the wafer on the carrier, while only contacting the edges of the wafer.

In step 1536, a carrier holding method is applied to hold the wafer in place in the carrier pocket 25. In some embodiments, the holding method is implemented through a vacuum, however, other holding methods can be employed. In step 1540, the correct loading of the wafer is confirmed by a carrier sensor (e.g. vacuum level sensor), and the positioning is communicated to a control center. In step 1542, the cylinder 8 of the load station 230 lowers to a down position. As the cylinder lowers, the wafer guide ring 5 and the wafer chuck 4 are forced back together by biasing (e.g., through springs 9). The carrier lifts from the load station (in some implementations simultaneously with the lowering of the cylinder) with the wafer and moves to the polishing position, thus completing the operation of loading a wafer on the carrier 244. As the carrier rises from the load station, springs 13 move the wafer chuck assembly 2 and load guide ring 5 (and/or the load station 230) back to a known and/or centered position. The chuck and guide ring are lowered. The load station is now ready to receive the next wafer.

Figure 16:
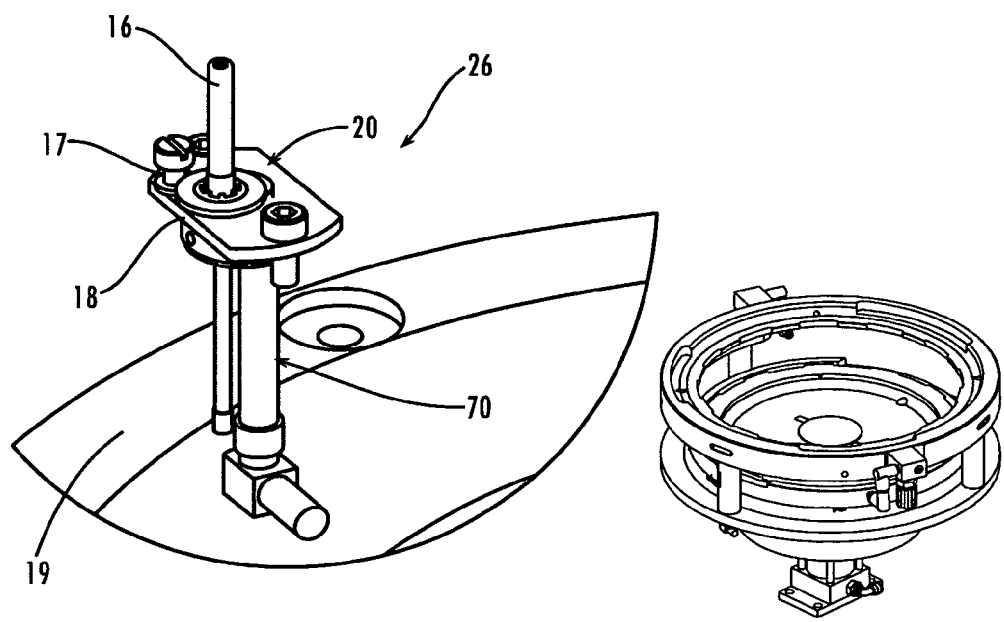
FIG. 16 shows a perspective view of the sensory array employed on the middle section of the load station of FIG. 4.

FIG. 16 shows a perspective view of the sensory array 26 according to some embodiments, which can be employed on the middle section 30 of the load station 220. FIG. 17 shows a magnified view of the sensory array 26 of FIG. 16. In some embodiments, the sensor array 26 is designed to operate reliably in very wet environments and tolerates variations in water supply pressure. Other sensors of this type are sensitive to a supply pressure of a liquid. The present sensory assembly, however, operates accurately within a wide range of pressures, for example, at pressure between about 10 to 80psi, and generally operate between 20 to 60psi (nominal is 30psi).

The sensor assembly 26 consists of sensor cap 16 mounted atop sensor tube 19, which is mounted to sensor base 20. During operation, water is supplied to the lower end of the sensor tube 19, so that it flows up the sensor tube and out a top of the sensor tube (not shown). This flow pushes on the sensor cap 16 upward from its down position and up against stop 17. In some preferred embodiments, only a small amount of water pressure is required to lift the sensor cap to the stop. The stop 17 further allows a wide range of pressures to be used, because as water pressure is increased, the sensor cap is still held in place by the stop. The stop 17 is adjustable to achieve a desired lift of the sensor cap 16.

In some embodiments, the sensor cap has a small orifice or orifices, and/or porous material at the top, which allows some amount of water to flow out of the top. When a wafer 1720 (see FIG. 17) is lowered down against the sensor cap 16, the wafer's weight pushes the sensor cap down. Because of the water escaping through the hole/boles and/or porous material the wafer is maintained on the surface of the water such that the wafer does not touch the cap, and as such only water touches the wafer. A target flange 18 is firmly secured with a base of the sensor cap. On the base there is a proximity sensor 70 to sense the presence of the target. The proximity sensor can be implemented through substantially any proximity sensor, such as an inductive sensor or other such sensors. When the sensor cap 16 and target 18 are in the up position, the proximity sensor 70 does not sense the target meaning no wafer 1720 is present Alternatively, when the sensor cap and target are in the down position, the proximity sensor 70 senses detects the target 18 identifying that a wafer is present in the load station 230.

Some preferred embodiments employ chamfered edges 22 and 28 on the wafer guide ring 1 and the retaining ring 24, respectively, so that the robot 220 and wafer carrier 244 have some latitude in positioning relative to the load station 230. The wafer chuck 4 and load guide ring 1 include, in some implementations, segmented shoulders so that the wafer is contacted only at the edge of the wafer, while still allowing accurate placement of the wafer into the carrier 244 during loading.

In some embodiments, low friction X-Y self alignment with the carrier is employed by way of low friction linear rail assemblies 11. Additionally, precise X-Y alignment is achieved through adjustment knobs 12. Mechanical adjustment of the wafer load station X-Y position is implemented, in some implementations, by firmly mounting the load station base 32 support structure to the rigid frame of the system or tool 120. The adjustment knobs 12 are then used to set the load station 230 to a desirable centered position to assure loading of two or more spindles, where the alignment of the spindle to load station centers are within predefined thresholds (such as within about ¼ an inch). Similarly, the adjustment knobs 12 are then used to position the load station to the desirable centered position to assure alignment with the robot 220 to within a predefined tolerance and thus providing proper placement of the wafer in the load station 230.

The linear rails assembly 11, in some embodiments, is implemented through two rails positioned orthogonally on opposite sides of a rail base 14. Each rail cooperates with a rail block that slides or rolls along the rails. In some embodiments the rail block includes one or more ball bearings through over which the rails roll. The first rail (e.g., rail closest to the base 32) is positioned along a first axis (e.g., X axis), while the second rail is positioned along a second axis (e.g., Y axis) orthogonal to the first axis. The rails can be configured to mate with the rail block so that the rails engage the block, such as through tapered grooves in the block that receive the rails that are similarly tapered to correspond with the grooves of the blocks. The first rail block can be secured with the first rail base (e.g., the rail base closes to the lower section base 32) and the first rail can be secured with the second rail base such that the second rail base moves along the first axis. The second rail is further secured with the second rail base on an opposite as the first rail. The second rail block coopered with the second rail can then be secured with the cylinder base 15 allowing the cylinder base to move along the second axis achieving movement of the load station 230 in both the orthogonal directions through the movement of the second rail base 14

The rails and rail blocks of the linear rail assembly can be constructed of steel, stainless steel, aluminum, plastic, an alloy, one or more polymers, combinations of materials and/or other relevant materials. In some instances the rail block can include bearings or other friction reducing means, such as a plastic, Teflon or other coating, that aid in the rolling or sliding of the rails through the block. The rails and/or rail block can include stops that prevent the excessive movement of the rails relative to the block and/or the rail base 14. Typically, the rail assembly 11 is positioned in the lower section 29 of the load station assembly 28 that is positioned below a deck or floor of the processing area of the processing module 122 to limit and/or avoid contact with potentially corrosive or damaging chemicals. Further in some implementations, the rail assembly 11 is encased within a protective cover to further protect the assembly.

The adjustment knobs in some embodiments are implemented through threaded members that threadedly engage an anchoring 920 of a biasing spring 13. Referring to FIGS. 7, 9 and 11, by rotating an adjustment knob the threading provides precision adjustments of the biasing spring anchoring 920 along a groove 922 on one side of the biasing spring shifting the center biasing position and thus the position of the carrier load pocket 21 of the load station 230. The lower section 29 of the load station assembly 28 can include one or more adjustment knobs 12 to adjust the anchoring positions of one side of the biasing springs 13.

The spring return system, implemented in some embodiments through the biasing springs 13 and linear rail assemblies 11, return the load station 230 to a known position after the wafer is loaded into the carrier, allowing the robot 220 to load the next wafer into the wafer guide ring. Referring to FIGS. 8 and 10, in some implementations, the biasing springs 13 are positioned at slight angles relative to vertical to reduce or avoid inadvertent pulling toward one direction or another when the load station is at a centered position.

Referring to FIGS. 4, 12 and 13, a biasing or spring system 9 connecting the wafer chuck 4 and wafer guide ring 5 biases the chuck and guide ring defining such that a pocket is formed to receive the wafer when the cylinder is in a down position. The spring system 9 further allows the wafer chuck 4 (and wafer when positioned within the load station) to extend into the load guide ring 1 and up to the carrier 244 during lifting by the cylinder 8 and be pulled or biased back into position upon retracting the cylinder. The wafer sensor assembly 26 (see FIGS. 12 and 16), which in some preferred embodiments is substantially immune to changes in incoming water pressure, accurately detects the presence and/or positioning of a wafer, and contacts the wafer only with water, preventing scratches or particulate damage, while the flow of water flushes or purges the sensor such that the sensor does not clog.

The present embodiments can be easily and quickly adjusted for different objects for processing. For example, the present embodiments are quickly converted for wafers of various diameters (e.g., 100 to 400 mm diameter, and other diameters) by simply changing a few parts on the load station 230 and the carrier size. The parts to be swapped typically include the load guide ring 1, the wafer chuck 4, the wafer guide ring 5, and the carrier 244.

Figure 19:
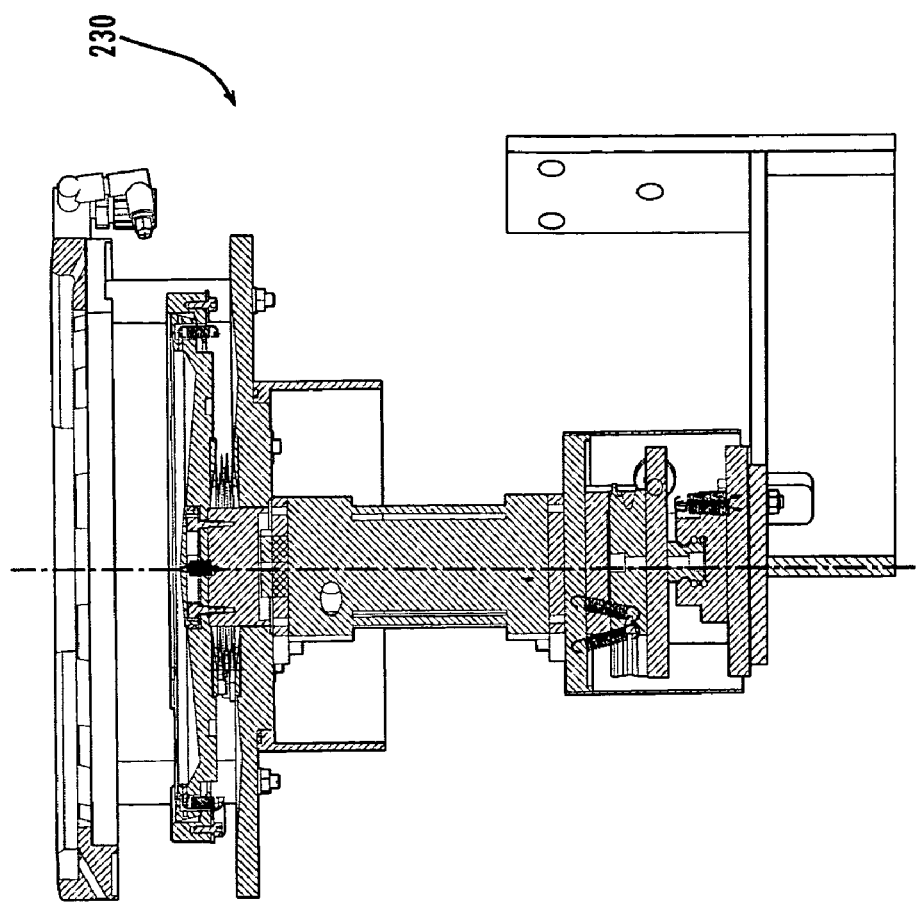
FIG. 19 depicts a cross-sectional view of the load station of FIG. 18.
Figure 18:
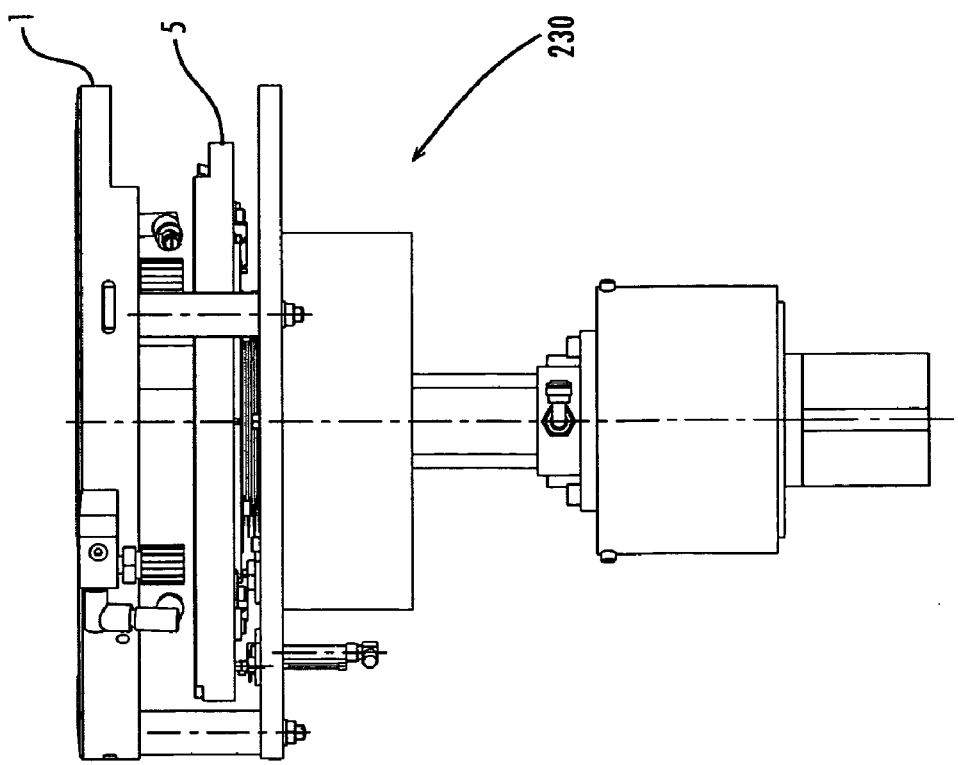
FIG. 18 depicts a side view of load station according to some embodiments.
Figure 21:
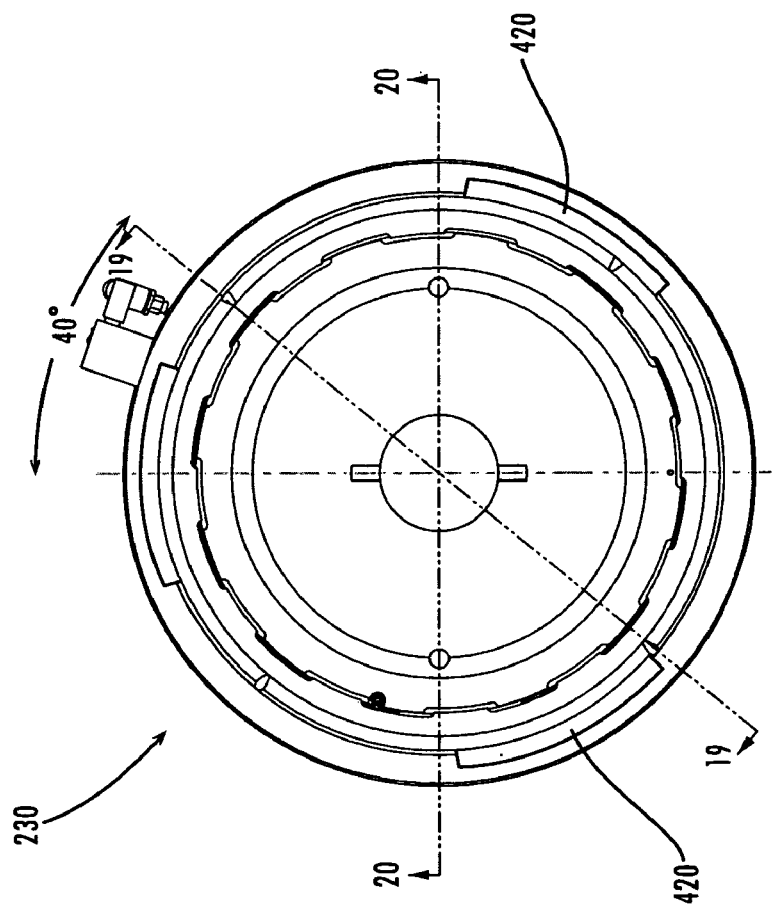
FIG. 21 depicts an overhead view of the load station of FIG. 18.
Figure 20:
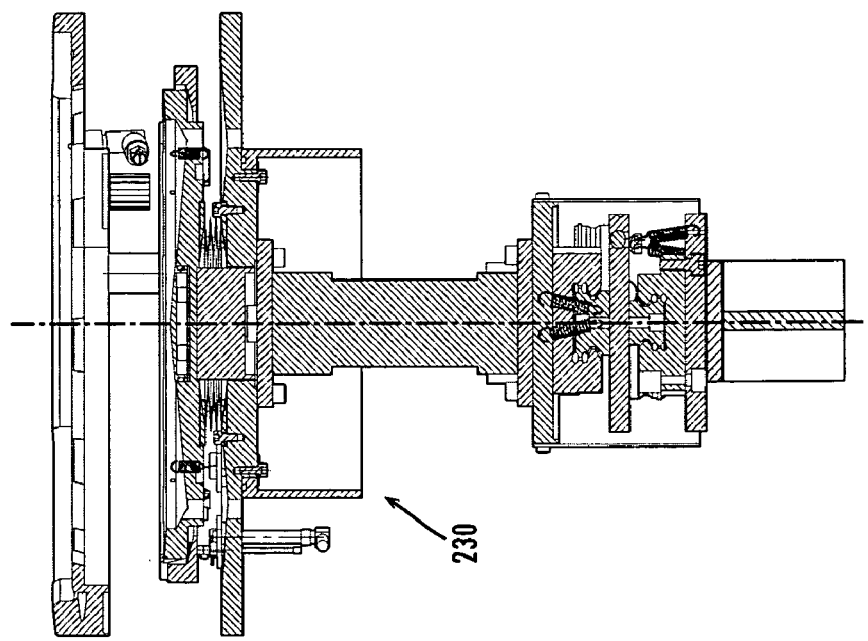
FIG. 20 depicts a cross-sectional view of the load station of FIG. 19, rotated about a Z axis.
Figure 22:
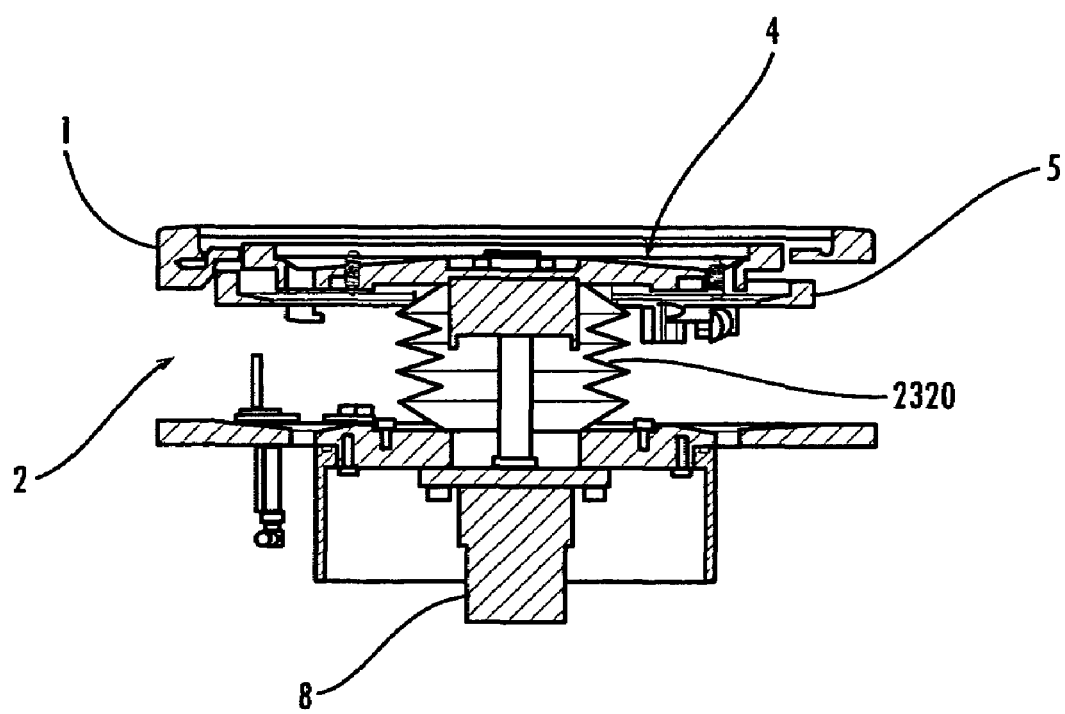
FIG. 22 depicts a cross-sectional view of the load station of FIG. 19 with the wafer chuck assembly and the load guide ring, where the cylinder in an extended position.

FIG. 18 depicts a side view of load station 230 according to some embodiments. The wafer chuck 4 and wafer guide ring 5 are in a down position separated from the load guide ring 1. FIG. 19 depicts a cross-sectional view of the load station 230 of FIG. 18. FIG. 20 depicts a cross-sectional view of the load station 230 of FIG. 19, rotated about the Z axis. FIG. 21 depicts an overhead view of the load station 230 of FIG. 18. FIG. 22 depicts a cross-sectional view of the wafer chuck assembly 2 and the load guide ring 1, with the cylinder 8 in an extended position driving the wafer chuck 4 into the load guide ring 1, and the wafer guide ring 5 in contact with the load guide ring 1. A bellows seal 2320 is shown around a portion of the cylinder 8 to protect the cylinder and to limit or prevent water and slurry from seeping below the bearing rail assembly, table and system 120.

Figure 23:
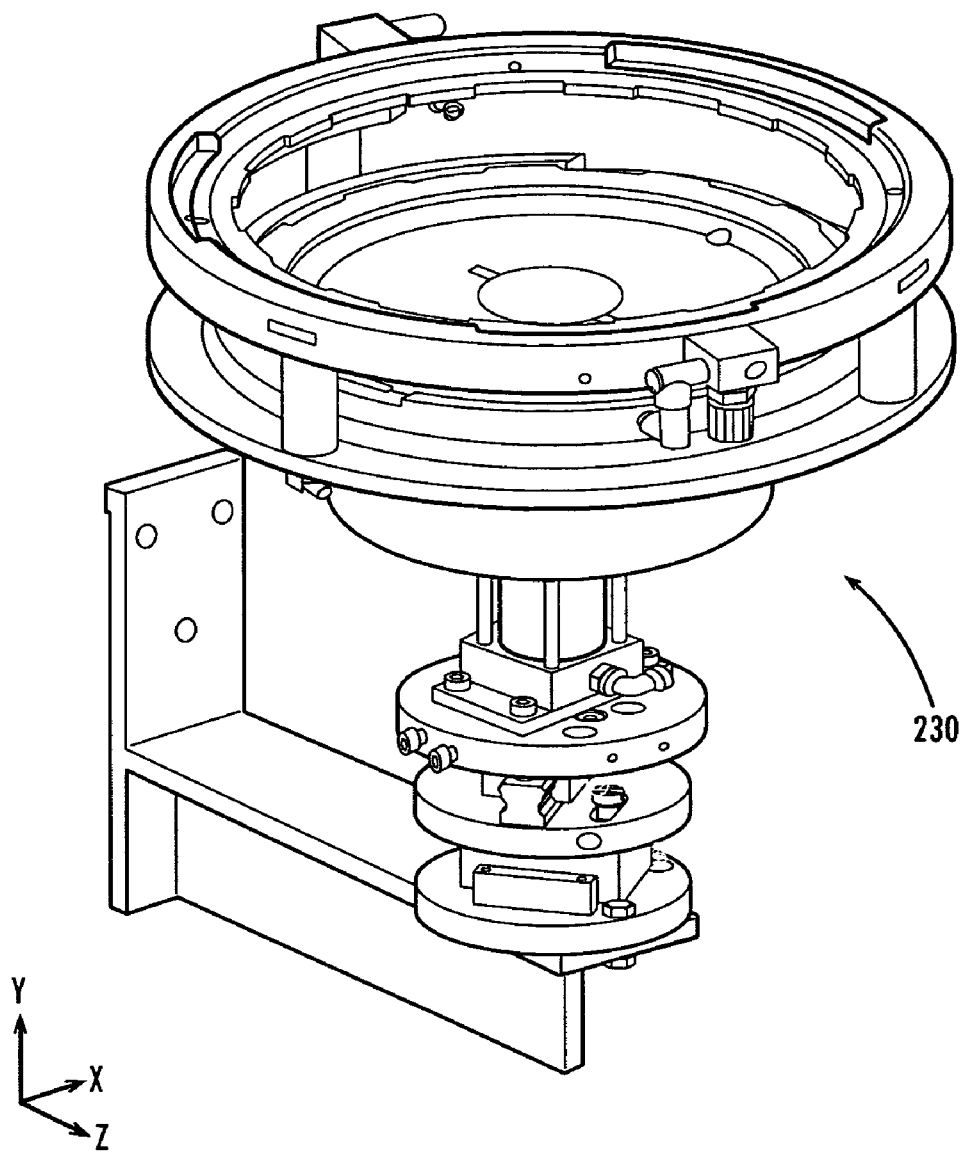
FIG. 23 depicts an isometric view of a load station according to some embodiments.
Figure 24:
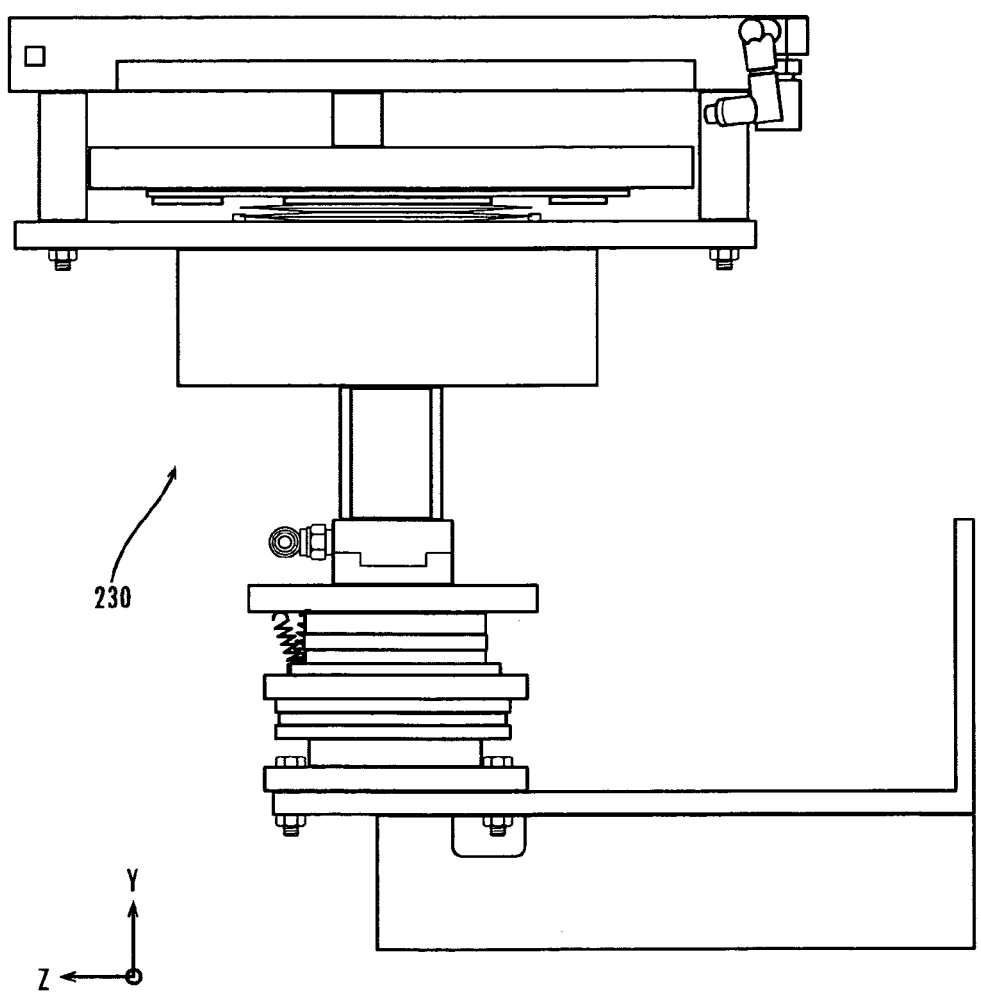
FIG. 24 depicts the load station of FIG. 23 rotated about the Z axis.
Figure 25:
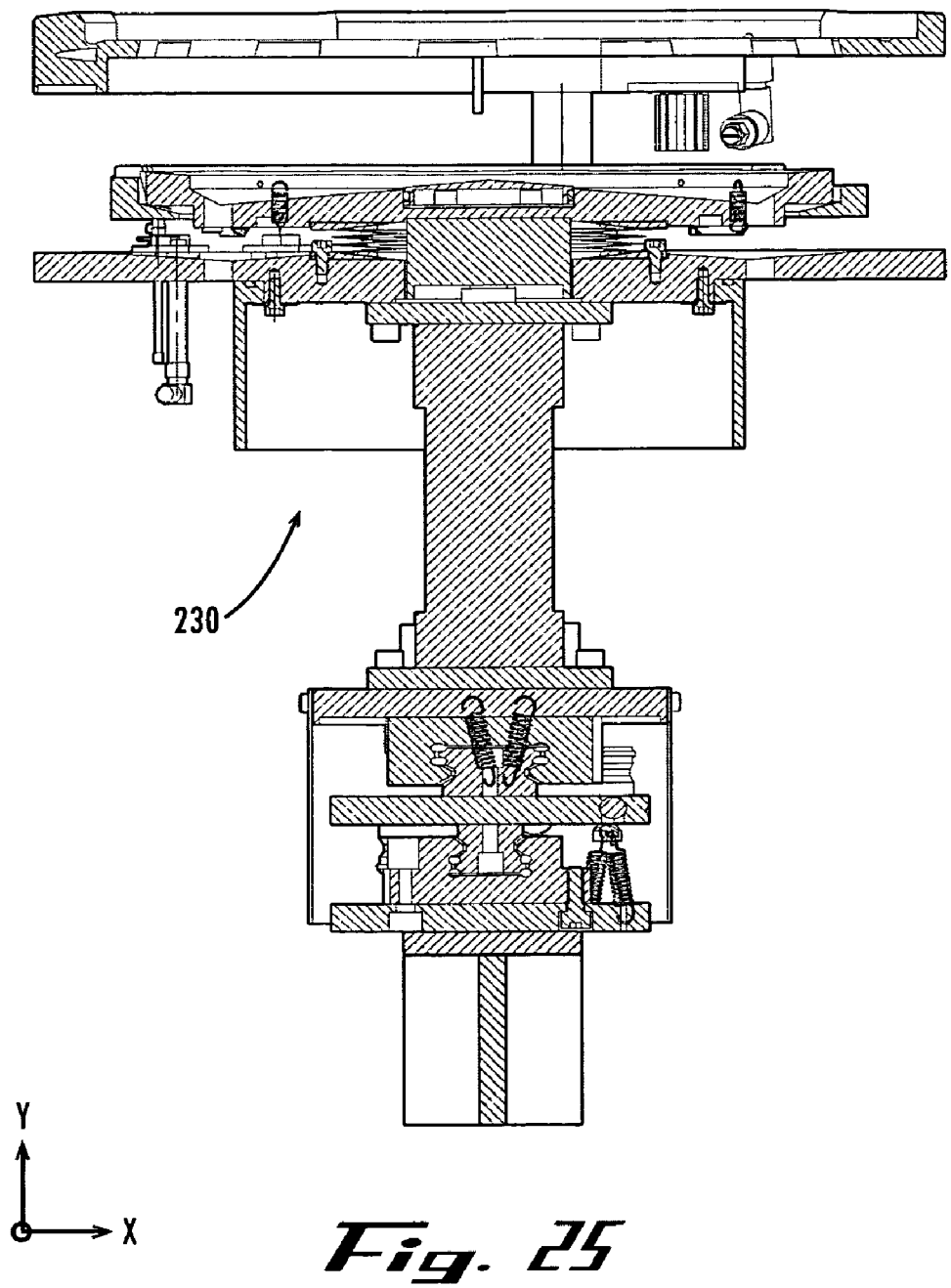
FIG. 25 depicts a partial cross-sectional view of the load station of FIGS. 23 and 24.
Figure 26:
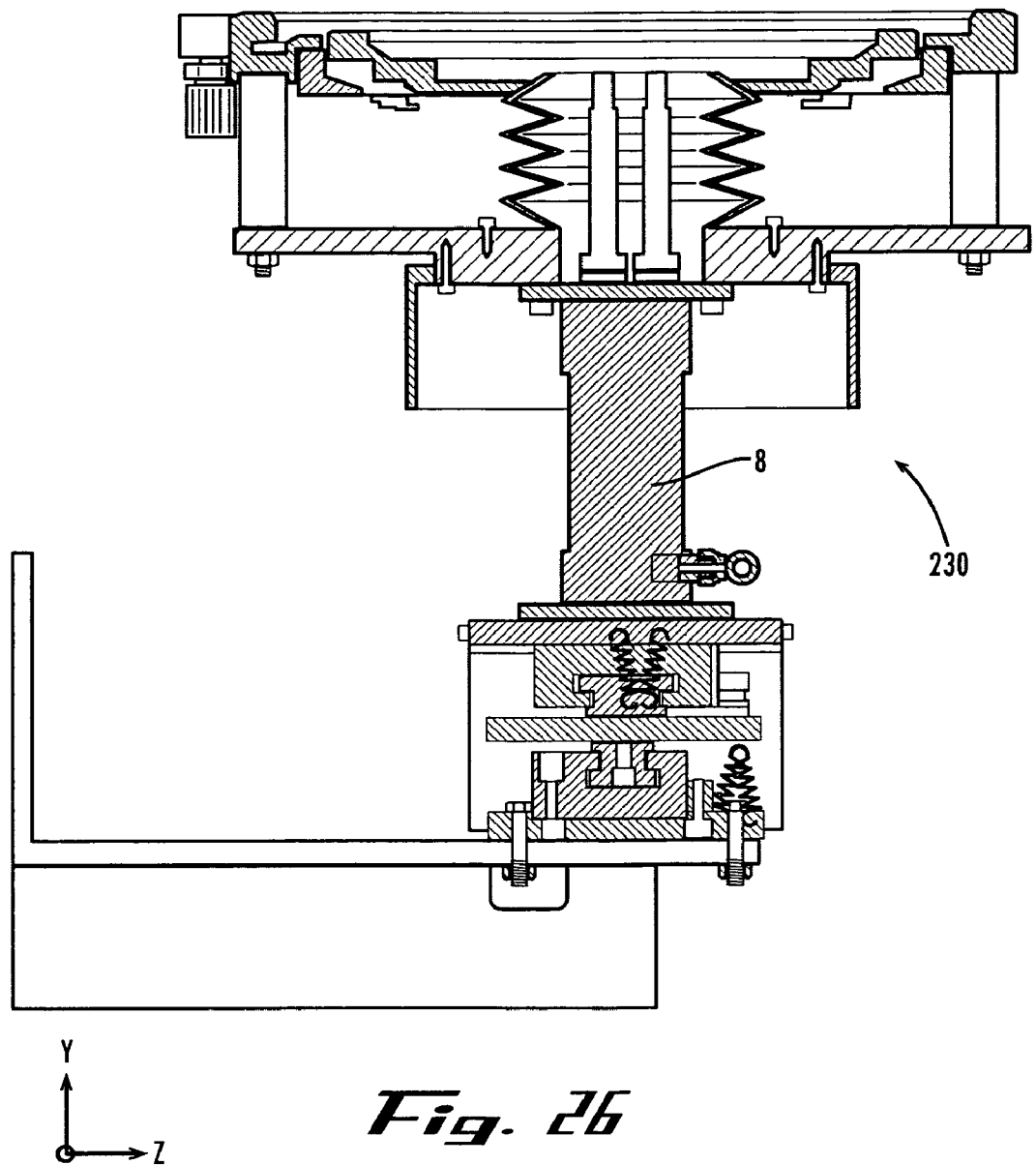
FIG. 26 depicts a partial cross-section view of the load station of FIG. 25, rotated about the Z axis with the cylinder 8 in an extended position.
Figure 27:
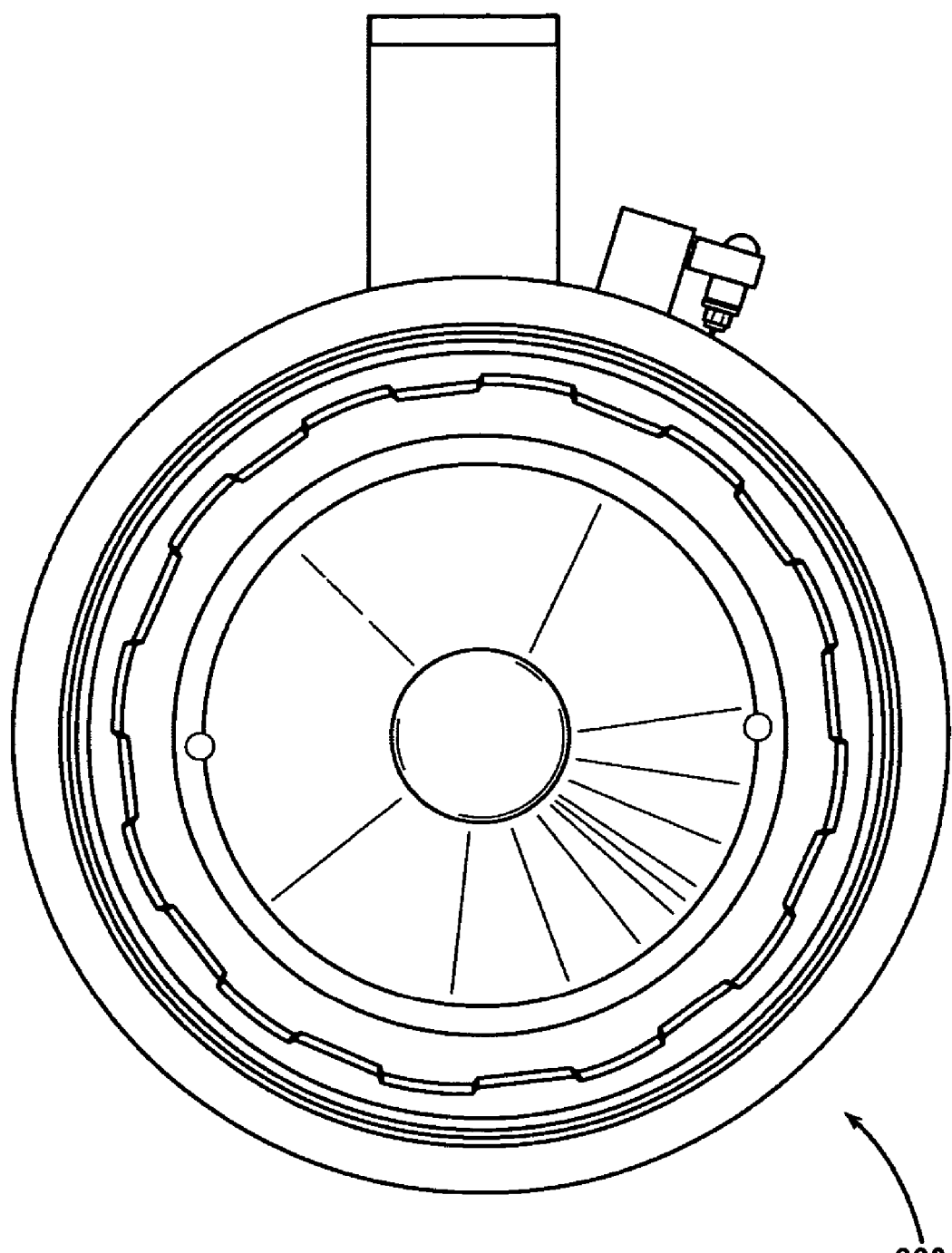
FIG. 27 depicts an overhead view of the load station of FIG. 23.

FIG. 23 depicts an isometric view of a load station 230 according to some embodiments. FIG. 24 depicts a side plane view of the load station 230 of FIG. 23 rotated about the Z axis. FIG. 25 depicts a partial cross-sectional view of the load station 230 of FIGS. 23 and 24. FIG. 26 depicts a partial cross-section view of the load station 230 of FIG. 25, rotated about the Z axis with the cylinder 8 in an extended position. FIG. 27 depicts an overhead view of the load station 230 of FIG. 23.

The unload station 232 can be configured similar to that of the load station 230. In some embodiments, however, the unload station does not include a cylinder for raising and/or lower a portion of the station. The unload station 232 in some implementations does include one or more sprayers 276 (see FIG. 2) that keep the processed wafers wet until retrieved by the robot 220 using the end effectors. The sprayers can further wash the carriers 244, 246. For example, sprayers can be positioned about the perimeter of the unload station to spray the wafer and/or carrier, and/or one or more sprayers in the center of the unload station to spray the underside of the wafer. The robot 220 removes the wafer from the unload station and places the wafer into storage, following some measurement and/or cleaning in some implementations. Implementing the robot through the six axis robot allows the system to tilt the disk to let accumulated water on the surface face of the disk to run off. Some embodiments of the system include a receptacle or drain proximate the unload station over which the wafer is tilted such that the pooled or accumulated water is received upon tilting the wafer to limit the amount of water or other liquid dripped over the processing and/or front-end modules.

The system 120 can, in some implementations further include components for measuring and/or calibrating the spindle force, wafer force and/or retaining ring force as applied through the carriers 244, 246. For example, the unload station 232 in some embodiments includes one or more load cells 276 (see FIG. 2) for use in detecting pressures applied by the carrier and/or wafer when the carrier deposits the processed wafer into the unload station as fully described below.

FIG. 28 depicts a simplified block diagram of a control system 2800 for the system 120. The control system 2800 includes a central controller 2802, which can be implemented through a process, micro-process, computer, other control systems, and other such controller and/or combinations thereof. The central controller 2802 includes a plurality of input/output ports, such as SBC video, keyboard, mouse and other user interface input/output port 2804, and external communication port 2806 (such as an Ethernet port). The central controller can include processing circuitry and/or sockets, such as MMC/PC Block I/O socket 2810, MMC/PC Analog socket 2812, RS-485 PCI card socket 2814, and other such processing capabilities.

The central controller couples with an operator interface 2820, to allow users to control the system, alter operations, upgrade the system, to retrieve data stored by the central controller and other such acces. An Ethernet hub 2822 couples with the Ethernet connector 2806 of the central controller to distributed control signals to the cleaner control system 28 that controls the wafer cleaner 224 in the front-end module 124, to a measurement control system 2826 that controls the measuring stage 226, a robot controller 2830 that controls the operation of the robot 220, an Fab Service connection, and other similar controllers. In some preferred embodiments, the Ethernet hub 2822 further couples with a slip ring 2834 of the turret 248 for powering and/or controlling the spindles 240, 242 and carriers 244, 246. The slip ring distributes the control signals through an MMC standalone motion controller and PLC 250 (which, in some embodiments, can be implemented for controller of FIG. 2) to the drives of the spindles, such as to a first inverter 2840 and motor 2842, to control the spindle rotations. The control signals can be daisy chained from the first inverter to a second inverter 2844 to be delivered to a second motor 2846. The daisy chaining can continue for any number of spindles. The slip ring can further direct control to other components, such as block I/O 2850 and other components. In one embodiment, the Ethernet hub 2822 is implemented through a four or eight port hub or switch, however other such switching devices can be employed.

A communication channel 2852, such as a fiber optic link, can couple with the port of the controller 2810 to the turret controllers 2854, 2856, that control the turret motors 2858 and 2860. In some embodiments, the MMC Analog 2812 provides at least some control of the rotations of the turrets. Pad sweep controllers 2862, 2864 can also couple with the fiber link to control the pad sweep motors 2866, 2868. Similarly, pad rotator controllers 2870, 2872 can communication with the central controller 2810 over the fiber link to control the pad rotation motors 2874, 2876. Data break out terminals 2880, 2882, 2884 can couple with the PCI card port 2834 of the central controller 2810 distribute control to polishing table inverters 2886 and 2888, and a buff table inverter 2890.

Figure 29:
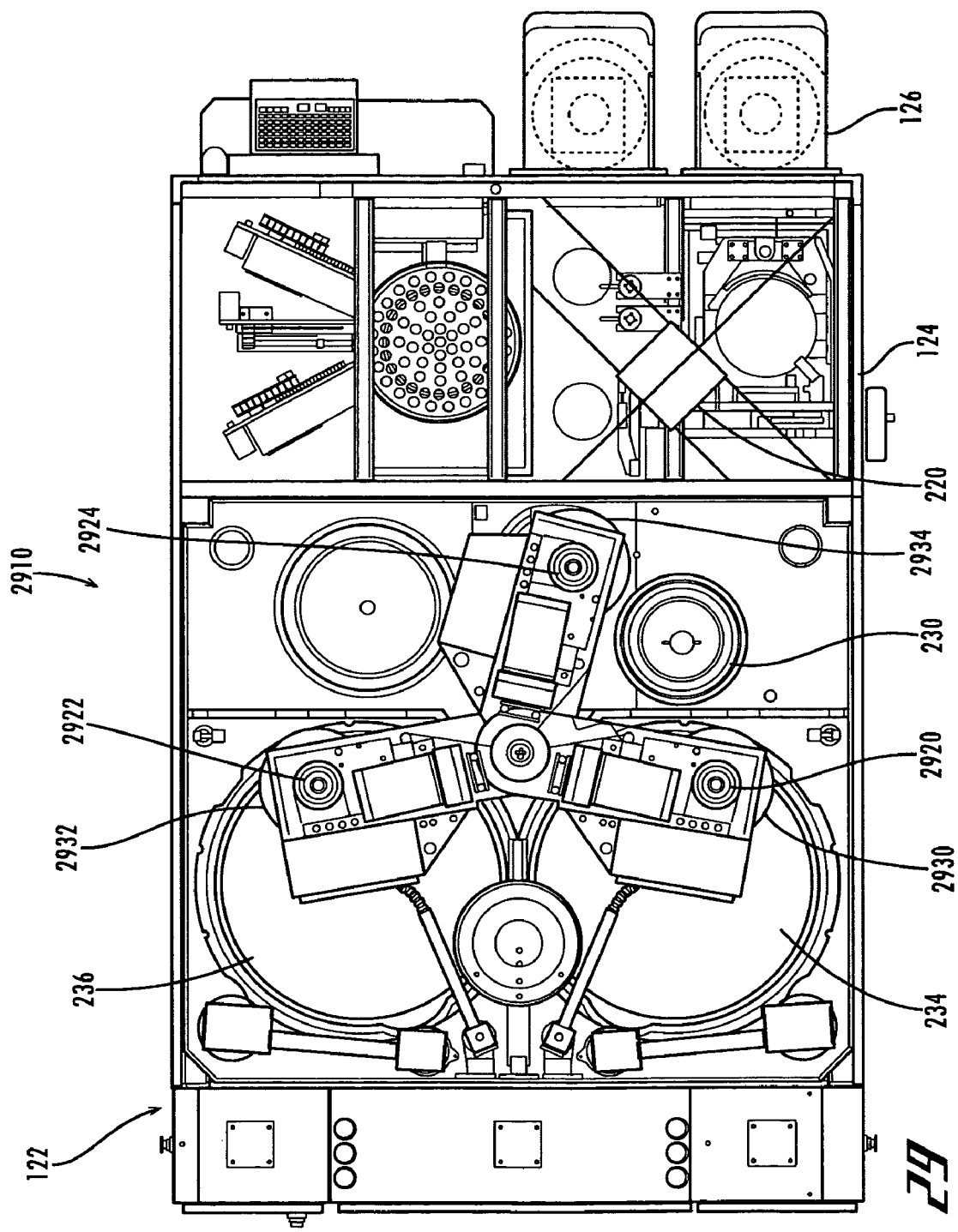
FIG. 29 depicts an overhead view of a system according to some embodiments for processing wafers.
Figure 30:
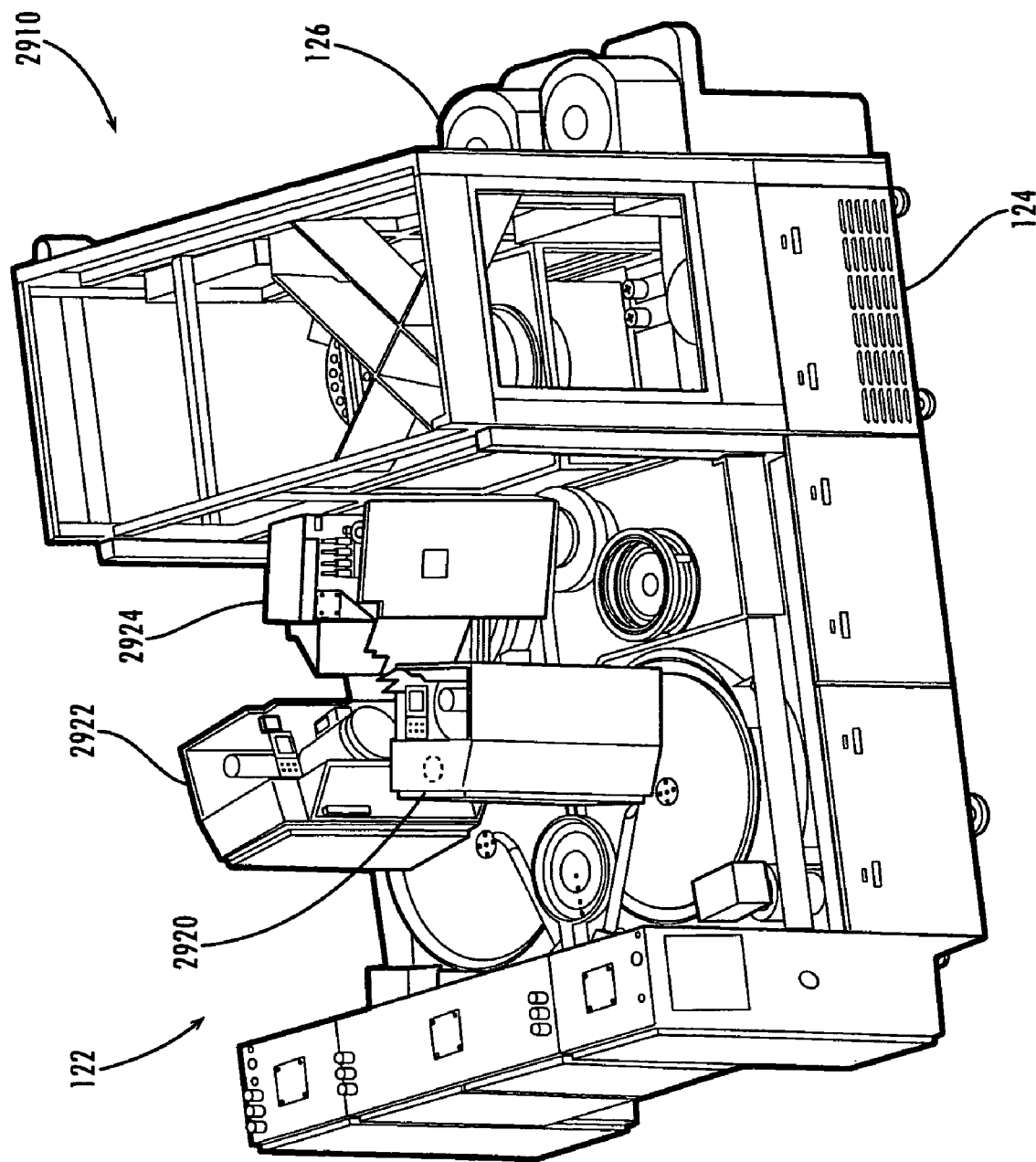
FIG. 30 depicts an isometric view of the system of FIG. 29.

FIG. 29 depicts an overhead view of a system 2910 according to some embodiments for processing wafers. FIG. 30 depicts an isometric view of the system 2910 of FIG. 29. The system 2910 includes the processing module 122 and the front-end module 124. The processing module 122 includes three spindles 2920, 2922 and 2924, each with a carrier 2930, 2932 and 2934. Each spindle is coupled with a turret in the tower such that each spindle is independently operated and indexed. The system 120 further includes other similar components as the system shown in FIGS. 1–3, such as the robot 220, the storage elements 126, load station 230, first and second pads 234, 236 and other such components. The front-end module 124 further includes a scanner, however, the area occupied by the scanner can be utilized to incorporate other devices into the system 2910, such as a spin station, metrology, or other devices. Further, the transfer station is positioned generally vertically (e.g., 15 degrees from vertical) relative to the deck of the system.

In some embodiments, the system 120 and/or 2910 can be employed to provide fully automated, cassette to cassette, chemical-mechanical wafer polishing for wafer reclaim. For example, in one implementation, the system 120/2910 can be configured to operate on wafers with sizes of 300 mm in diameter, notched, with nominal thickness equal to about 800 microns, and/or 200 mm in diameter, notched, with nominal thickness equal to about 725 microns. The system would have a tool footprint of about 2.8×2.0 meters, 5.6 square meters, and operate at 208 Volts 3-Phase, 150 full load Amps, 50–60 Hz, clean dry air at 6.2 bar, 170 L/min, nitrogen at 5.5 bar, 14 L/min, a vacuum at 508 mm of mercury, 85 L/min, an exhaust at about 14 m$^3$/hour at 125 Pascal, and utilize deionized water at 2.1 bar, 11 L/min. This system would be SEMI S2, S8 and CE compliant.

Further, the system can be easily converted from processing 200 mm diameter wafers to other sized wafers (e.g., to 300 mm diameter wafers). For example, in reconfiguring the system 120, a user would switch out in the load station 230 the load guide ring 1, chuck 4, and wafer guide ring 5; in the unload station 232 the unload guide ring; in the carriers 244, 246 the retaining ring; and in the front-end module the end effectors and cassettes. When altering at least the unload station 232, the sprayers 3260 (see FIG. 32) would be shifted to the corresponding diameter, and in altering the load and unload stations, the sensor would be shifted between sensor positions (e.g., 3280 and 3282 (see FIG. 32) for 300 mm and 200 mm diameter wafers, respectively).

In operation, such a configured system can achieve a throughput for single side polishing of about 30 to 40 wafers per hour, at the first polishing table (Platen 1) 234 for a time equal to about 60 seconds, and at the second polishing table (Platen 2) 236 for a time of about 30 seconds. Similarly, the system could provide a throughput for double side polishing at a rate of about 15 to 20 wafers per hour with the same polish times as listed above. This system could expect to have a high reliability. For example, the system would operate continuously for at least 500 hours MTBF, and maintain an 80% confidence interval, as calculated per SEMI specification, with greater than about a 90% up time, with an MTTR less than about 4 hours. In some preferred embodiments, the system would include factory host communications operating with Ethernet, using SECS/GEM Protocol, with recipe uploading.

Some embodiments of the systems 122/2910 can employ polish table (e.g., 2 each) with a granite surface, having a diameter of about 32 inches (812 mm), and operated at table temperature controls between about 10 to 90 degrees Celsius, and at speed ranges between about 10 to 180 RPM.

Pad conditioners 262 can be utilized in some implementations. FIGS. 41–44 depict an isometric, an overhead partially transparent, cross-sectional, and under-side views, respectively of pad conditioners according to some embodiments. The conditioners can be implemented through diamond disks, nylon brushes and other relevant conditioners depending on the type of polishing or grinding pad used on each table. The conditioners include a gear box 284, 286 that typically have a relatively low profile 4120 to allow the independently controlled and rotated spindles 240, 242 to index over the pad conditioner without contacting the conditioner. The gear box can be implemented as worm drive typo gear box to operate the conditioning disk or brush. Further, the motor 287 and 288 to operate or rotate the conditioning disk or brush is moved back along to arm from the conditioning end with a flexible shaft cooperating between the motor and the gear box. Some other previous systems commonly employ the motor and gear box at the conditioning end of the conditioner, which would interfere with the movement of one or both spindles and carriers. This configuration also allows the motor to be contained and away from to elements of the polishing process.

The downward force is applied to the conditioning disk or brush to condition the tables 234, 236, is through bellows 4322 or other relevant devices, which is in some implementations is co-located with the motor. For example, one metal bellow 4322 can be pumped up to push the arm down and one bellow 4320 can be used to raise the arm up. Employing bellows provides rapid response, precise calibration and avoids hysteresis. The arm is rotated by a servo-motor and harmonic drive beneath the deck that rotate the arm into position, and is programmed for where the conditioning is to take place, how fast the disk or brush is rotated, and how much force is applied.

Some embodiments further include a wet dish into which the conditioning disk or brush are placed while not in use and in a parked position. The wet dish, such as a dish of water or other relevant liquid, avoids drying out of the conditioner, and allows cleaning of the condition. The water dish can additionally include a brush or bar that can be rotated or rubbed against the conditioner to clean the conditioner. In some implementations an ultrasonic cleaner is cooperated with the water dish to further aid in cleaning the conditioner.

For example, pad conditioners (2 each, 1 per platen) are, in some embodiments, 4 inch diamond disk or nylon brush types, that operate at device speed ranges between about 5 to 100 RPM, with down force ranges for example of between about 0.5 to 60 pounds (2 to 133 N) or more, with user programmable sweep and force parameters.

The system includes, in some preferred embodiments, a slurry delivery. The shiny delivery can be, for example, standard: 2 peristaltic-type pumps per table, with 1 deionized water rinse, with options of up to 6 pumps per table, with a closed-loop flow control, a flow range of slurry equal to about 10 to 500 mL/mim., a flow range of deionized water equal to about 50 to 1000 mL/min., and a slurry range of about 2 to 12. A rinse station 256 can further be included with cleaning sprays for wafer and wafer carriers tat are located between tables 1 and 2, with user configurable spray recipe.

The system typically includes a turret for each spindle, though more than one spindle could be arranged with each turret for polishing more than one wafer on each table simultaneously or separately. These turrets are independently controlled, indexed and oscillated, and allow for continuous rotation. The polishing spindles 240, 242 utilize a down force range of between about 25 to 1000 pounds (111 to 4448 N), with a speed range between about 10 to 180 RPM. Each spindle includes a wafer carrier 244, 246 that, in this embodiment, carry wafers of between about 200 and/or 300 mm with spherical gimbaling mechanism. These carriers have pressure zones between about 1 to 3 (for uniformity control), where wafer polish and retaining ring forces are recipe controlled.

The system farther includes a wafer unload station 232 with water hover nozzle wafer contact or edge contact. In some preferred embodiments, the unload station includes integrated spindle and retaining ring down force calibration. This down force calibration allows for the calibration of the down force of to spindles during the unload wafer sequence or at other user-specified times. Wafer front and back side sprays can further be included along with carder cleaning sprays. The unload station can also utilize a wafer sensor 26.

In some embodiments, the polishing can be implemented through a polishing recipe. The recipe is a 10 programmable steps per polish table, that is user-configurable, each step, for: polish time, down force, back pressure, table speed, spindle speed, force ramping, retaining ring force, and slurry flow.

The front-end module 122 includes the robot 220, and can be implemented through substantially any relevant robot for transport of wafers, such as an AdeptSix 300CR CS, 6-axis cleanroom robot, with cleanroom compatible quick-change tool changer for attaching end effectors. The end effectors, in some embodiments, are 300 mm or 200 mm, edge contacting type or 200 mm, 150 mm, or smaller, backside vacuum contacting type. Wafer input and output utilizes, in some embodiments, wafer carts 126 to mechanically dock with front-end module, where the input is dry and the output is wet.

In some implementations, the system includes a light tower having, for example, four colors (red, yellow, green, and blue) and/or audible signal to indicate different processing conditions. Additionally and/or alternatively, a graphical user interface can be employed, such as a color touch screen control.

Figure 31:
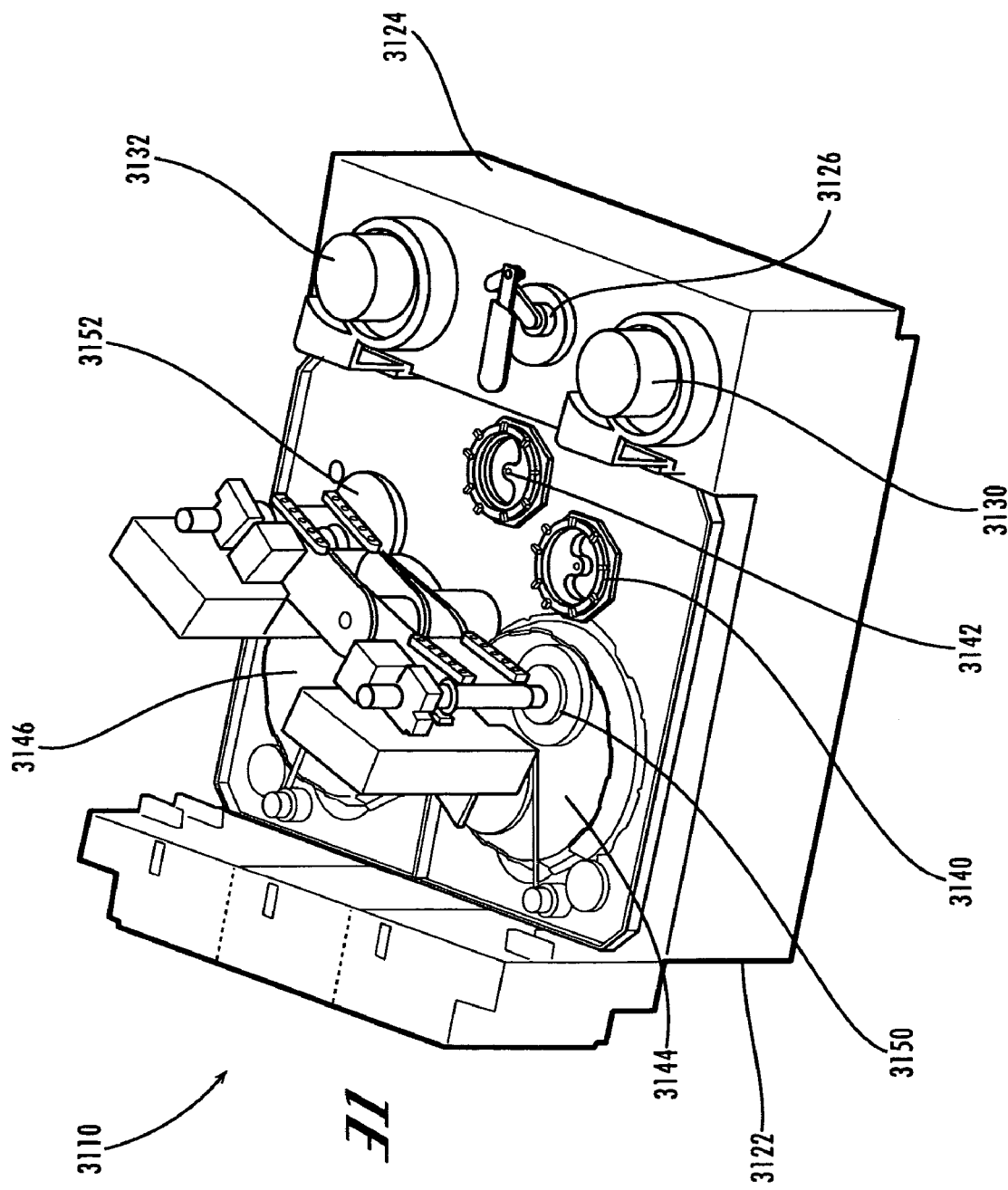
FIG. 31 depicts a simplified, isometric view of a system for processing wafers.

FIG. 31 depicts a simplified, isometric view of a system 3110 implemented according to the parameters specified above. The system 3110 includes the processing module 3122 and front-end module 3124. The front-end module further includes the robot and end effectors 3126, and the send and receive cassettes 3130, 3132. The processing module includes the load and unload stations 3140, 3142, the first and second tables 3144, 3146, and first and second spindles with wafer carriers 3150, 3152.

Figure 32:
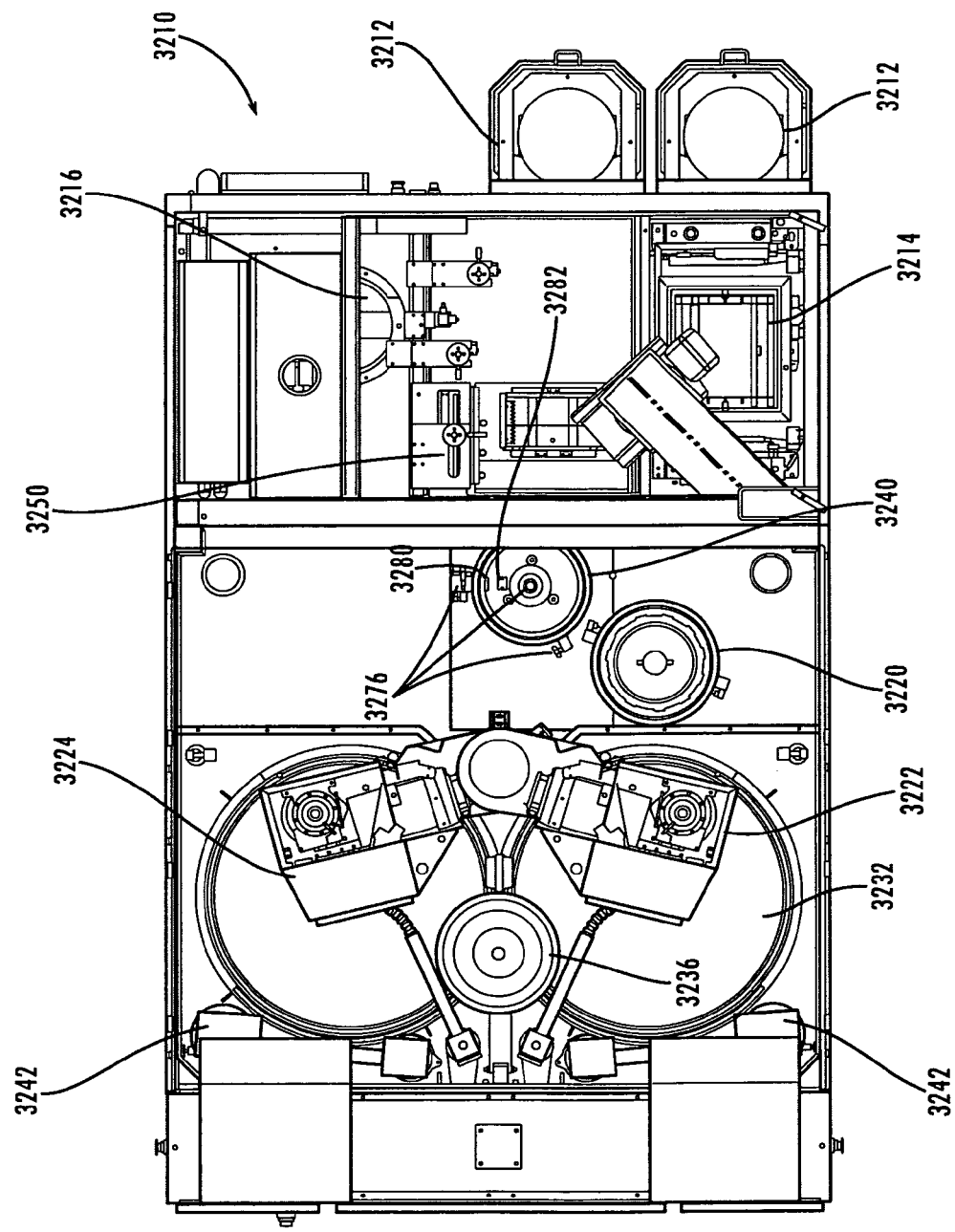
FIG. 32 depicts a simplified, isometric view of a system according to some embodiments.

FIG. 32 depicts a simplified, isometric view of a system 3210 according to some embodiments. This system allows for wafers to be removed dry from the input cassette 3212 and deposited in the output cassette 3214 wet. The robot (not shown) utilizes dry end effectors to remove a wafer from the input cassette 3212 and transfer it to the transfer station 3216. The robot switches end effectors, retrieves the wafer and delivers the wafer to the load station 3220. One of the spindle/carriers 3222, 3224 collects the wafer from the load station and initiates processing, for example, by polishing the wafer on the first polish table 3232. Following the polish, the wafer can be rinsed in an optional rinse station 3236 and polished again on the second polish table 3234. Following the polishing, the wafer can optionally again be washed, and is then delivered to the unload station 3240. The wafer may be further rinsed at the unload station. In some embodiments, the polish pads 3232, 3234 are conditioned with pad conditioners 3242 during polishing (INSITU) or between polishing (EXSITU). In some embodiments, the robot can, flip the wafer for processing on the reverse side. The robot retrieves the polished wafer from the unload station 3240 with the wet end effectors and can optionally measure the wafer, for example, with a wafer scanner when included or simply position the wafer into the wet basin output cassette 3214 without being further dried. Some embodiments additionally include a temporary wet buffer 3252 that allows processed wafers to be vertically stored while the basin is being replaced and/or is full. Again, the six axis robot 220 allows for the rotation of the disk into the vertical position. If is often preferable to store wafers vertically, especially when storing them wet so that particles do not settle on the surface. An additional end effector 3260 can be included in some embodiments, such as a wafer scanning wand that allows many different configurations on the tool changer of the robot to use.

Figure 33:
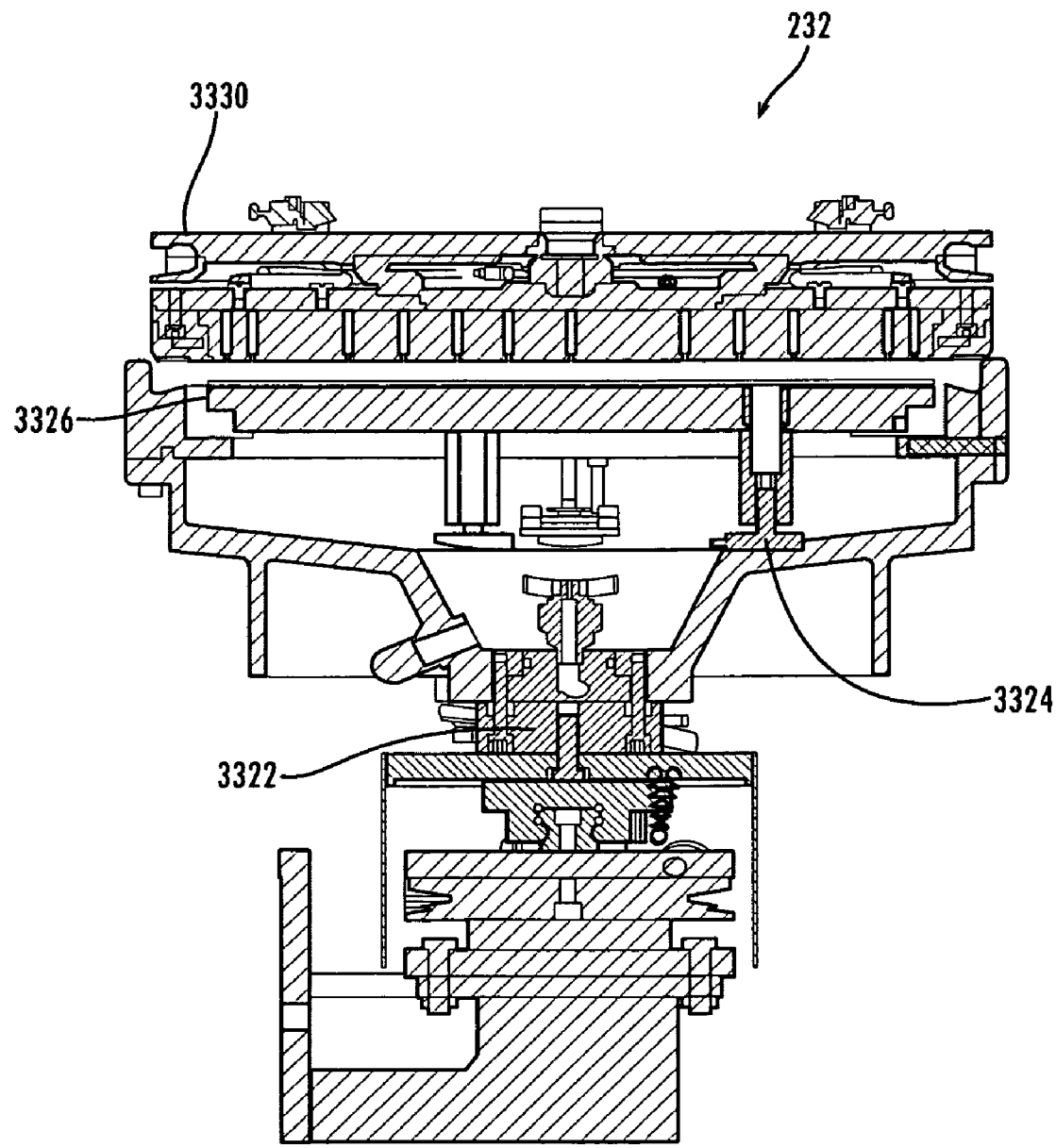
FIG. 33 depicts a simplified cross-sectional view of an unload station.

The system 120 can, in some implementations further include components for measuring and/or calibrating the spindle force, wafer force and/or retaining ring force as applied through the carriers 244, 246. For example, the unload station in some embodiments includes one or more load cells for use in detecting pressures applied by the carrier and/or wafer when the carrier deposits the processed wafer into the unload station. FIG. 33 depicts a simplified cross-sectional view of an unload station 232 according to some implementations incorporating load cells for use in determining forces applied by components of the wafer carrier 244 and spindle 240. A load cell is a transducer that converts a load acting on the load cell into an electrical signal. The load cells can be used to measure and/or calculate one or more of the total spindle force, a retaining ring force component, and a wafer force component.

The unload station 232 can include two load cells 3322 and 3324 and are designed to distinguish between total downward force from the spindle 240 and the force acting on the wafer. A first load cell 3322 measures the total downward force applied by the spindle to the wafer carrier 244 through an actuation system, such as a bellows, piston, cylinder and/or other such actuation system. A secondary load cell 3324, or plurality of secondary load cells (the unload station 232 of FIG. 2 shows three secondary load cells 3324), measures the force component acting on the wafer in a carrier exerted through a back plate or an inflatable membrane; wafer force. A load plate 3326 (not shown in FIG. 2) with standoff or offsets 3 is placed in the unload station. During calibration of the spindle force, pressure in a retaining ring seal or inflatable membrane is set to zero, as further elaborated below. The carrier 244 is brought down on the mechanism and placed in contact with both a ledge around the inner diameter of unload station's guide ring 3330 and the load plate 3326 with downward force generated by the actuation system of the spindle.

The first load cell 3322 measures this downward force and a local processor, a central controller or computer records the measurements and the corresponding fluid pressure within the bellows of the spindle corresponding to the downward force. The fluid pressure in the bellows is measured for example by an electro-pneumatic transducer. The resulting force from the bellows acting on the spindle can also be measured by beam load cell located in the spindle assembly. Measurements from the beam load cell can be used to calculate spindle force. Measurements from the beam load cell are also compared to measurements from the first load cell 3322.

The load plate 3326 is further used to transfer downward force acting on the wafer in the carrier to the secondary load cell(s) 3324. The wafer force component may be generated from a back plate or an inflatable membrane having a membrane pressure. The secondary load cell(s) 3324 are able to measure the wafer force component of the downward force. Force measurements from the spindle and wafer are sent to the controller or computer. Spindle force, wafer force, and retaining ring force are then appropriately calibrated with corresponding pressures using a spindle force equation:

$$(F_{spindle} = F_{wafer} + F_{retaining\ ring}).$$

Figure 34:
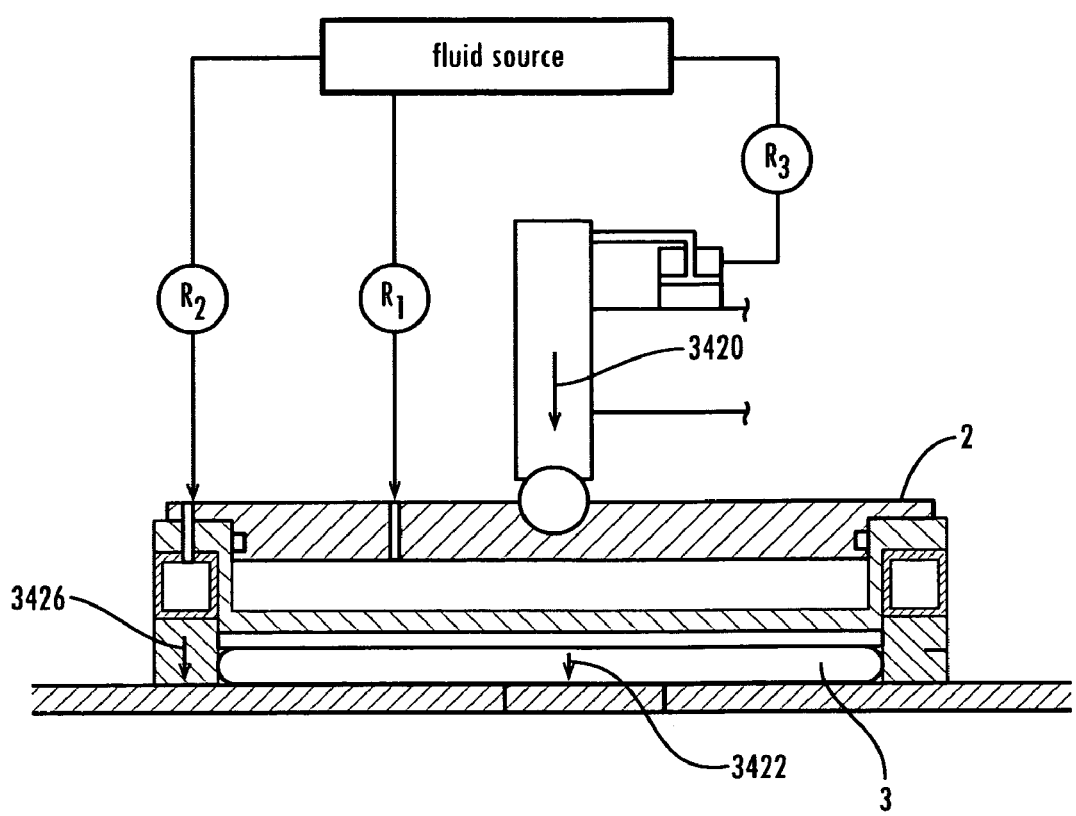
FIG. 34 illustrates the three forces considered during CMP polishing.

FIG. 34 illustrates the three forces considered during CMP polishing. These forces include, spindle force 3420, wafer force 3422, and retaining ring force 3426. Downward force from the spindle 240 acts on the wafer carrier 244. The force acting on the carrier is split in the wafer carrier to a retaining ring force 3426 component and a wafer force 3422 component. The force balance equation of these forces is represented as follows:

$$F_{spindle} = F_{wafer} + F_{retaining\ ring},$$

where $F_{spindle}$ equals force from the spindle acting on the carrier; $F_{wafer}$ equals a portion of force from the spindle acting on the wafer; and $F_{retaining\ ring}$ equals a portion of force from the spindle acting on the retaining ring. Since wafer force 3422 plus retaining ring force 3426 is substantially equal to the total spindle force 3420, one of these force values can be calculated by knowing values for the other two of the three forces in the equation.

The system 120 applies a spindle force at a desired set value. The actual force of the spindle is measured with the first load cell 3322. The system also is able to measure wafer force component using the secondary load cell(s) 3324. Retaining ring force can then be calculated by subtracting the wafer force component from the total downward spindle force (i.e., $F_{retaining\ ring} = F_{spindle} - F_{wafer}$). Retaining ring force can be calculated to generate a calibration curve relating to the retaining ring seal pressure.

The spindle force typically is generated from an actuation system. The actuation system may be pneumatic, hydraulic or some other system. For example, pneumatic actuation of a spindle can be achieved through the use of a bellows. The bellows actuate a mechanism that pushes the spindle coupled to a carrier towards a polish pad during polishing and/or toward the unload station during unload. The spindle force is divided in the carrier into the retaining ring force component and wafer force component. These two components from the carrier act on the polish table during polishing.

Some wafer carriers utilizing a retaining ring seal behind a retaining ring. In some wafer carriers, such as Strasbaugh's ViPRR carrier, the semiconductor wafer is held by the carrier while a retaining ring seal situated behind a retaining ring is pressurized. The pressurized retaining ring seal presses against the retaining ring affecting the retaining ring force. An equation or table is used to determine the amount of air pressure used in the inflatable ring seal to generate the desired amount of force on the retaining ring during wafer processing. The present calibration system of the present embodiments allows the pressure from the inflatable seal to be calibrated in order to achieve the retaining ring force by taking measurements of the wafer force when the spindle force is set to a known value. In other wafer carriers, the retaining ring is held by the carrier, while an inflatable membrane is used to apply pressure behind the wafer. The inflatable membrane in this configuration generates a wafer force which is a component of the downward force acting on the wafer. Other wafer carrier configurations may use a back plate to apply a wafer force. An equation or table can be used to determine the amount of air pressure to supply in the membrane to apply a desired force on the wafer during polishing.

Figure 35:
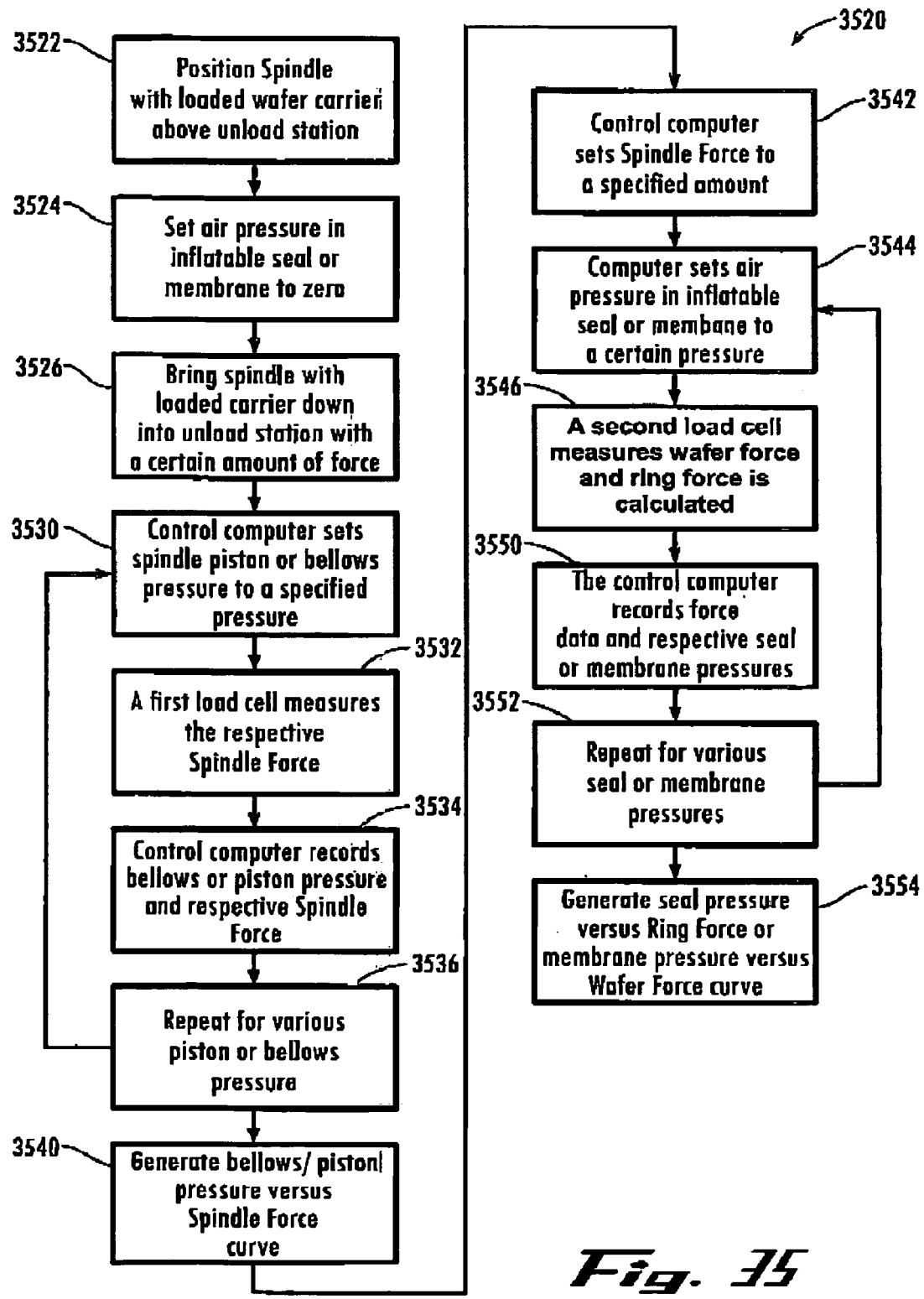
FIG. 35 shows a simplified flow diagram of a process for use in calibrating spindle forces.

The calibration system allows a quick and accurate method to calibrate the spindle bellows or other actuation system, inflatable seal(s), and membrane pressures with corresponding spindle force, retaining ring force, and wafer force in the system before or after a polishing. This calibration method and system result in the use of more accurate forces while polishing wafers. FIG. 35 shows a simplified flow diagram of a process 3520 for use in calibrating spindle forces. When the calibration is employed, a load plate 3326 with offsets 3 is placed in the unload station 232. Typically, the offsets 3 of the load plate 3326 are situated above a load cell or plurality of load cells 3324 located in the unload station. The offset 3 can be adjustable and the height of the load plate 3326 can be adjusted to compensate for wafer thickness. Pressure in the retaining ring seal or inflatable membrane is set to zero, depending on the carrier type. This way, a spindle force measurement unaffected by ring seal pressure or membrane pressure can be taken. A spindle 240 with a carrier 244 is then positioned above an unload station in step 3522. The wafer carrier can be loaded with a test wafer or alternatively, the wafer carrier can be empty depending on the configuration of the load plate.

In step 3524, the actuation system of the spindle is pressurized. In step 3526 the wafer carrier is brought down onto the unload station with a certain amount of downward force. The unload station, can in some embodiments, have some degree of freedom horizontally in the x and y direction (e.g., through linear bearing rail assemblies) and its configuration is such that it is self-centering with the spindle and carrier. This enables the carrier to align itself with the center of the unload station. When the wafer carrier is brought down onto the unload station, it is placed in contact with the load plate and ledge 3330 around the guide ring in the unload station.

Figure 36:
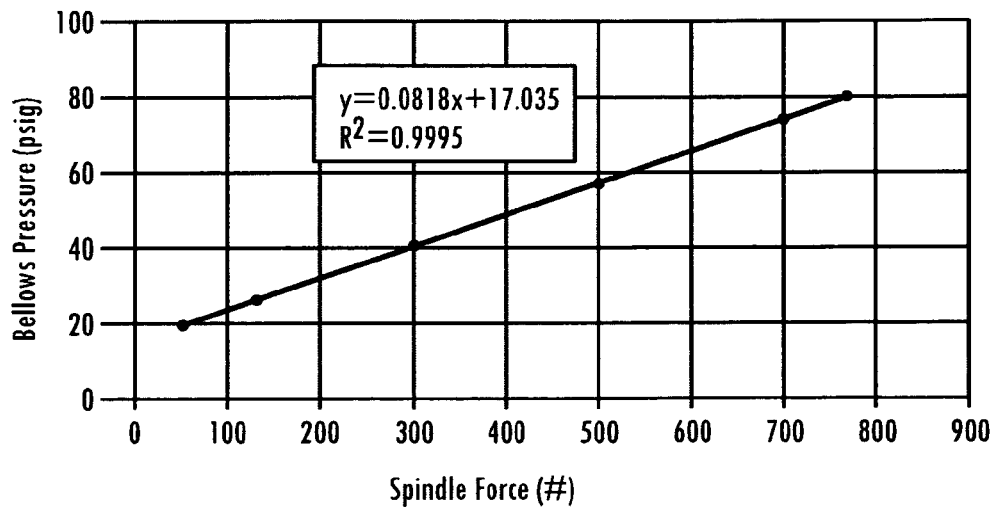
FIG. 36 illustrates a spindle calibration curve created using the data collected for bellows pressure or piston pressure versus spindle force.

In step 3530 a controller activates the actuation system to a specified pressure creating the downward force of the spindle to calibrate the spindle force. Pressure in a wafer carrier's inflatable ring seal or inflatable membrane is at zero. In step 3532, the actuation system brings the wafer carrier down to the unload station and the first load cell 3322 is then used to measure the resulting spindle force created by the actuation system. In step 3534, the controller records the measurements from the first load cell and the respective bellows pressure that generated that spindle force. In step 3536, the control computer then repeats this process for various pressures in the actuation system and records the pressures and corresponding spindle force. In step 3540, a bellows pressure or piston pressure versus spindle force curve is generated. FIG. 36 illustrates a spindle calibration curve created using the data collected for bellows pressure or piston pressure versus spindle force.

Figure 37:
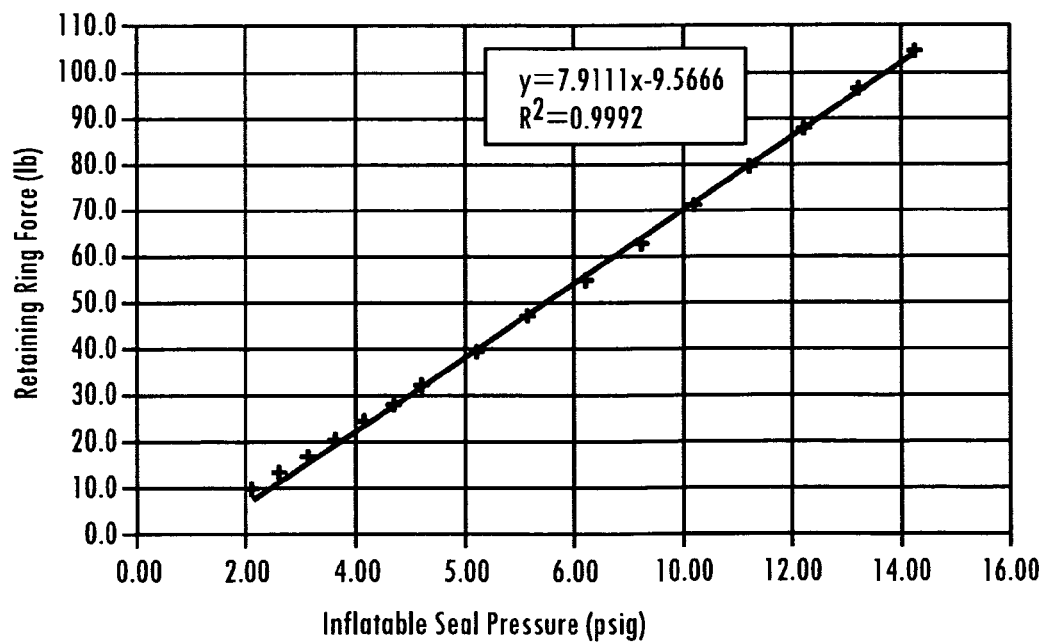
FIG. 37 depicts a calibration curve corresponding either to the inflatable ring seal pressure that generates a retaining ring force or the inflatable membrane pressure that generates a corresponding wafer force.

In step 3542 the controller commands the spindle force to a specified amount bringing the wafer carrier down onto the unload station To calibrate fluid pressure corresponding to force components in the wafer carrier such as retaining ring force or wafer force. In step 3544, the controller then sends a command to inflate the retaining ring seal or to inflate the inflatable membrane, depending on the carrier configuration, to a certain amount of pressure. In step 3546, the first load cell measures the total amount of spindle force and the second load cell(s) measures the wafer force component of the spindle force. In step 3550, the controller tests and records force data for a variety of ring seal or membrane pressures. The controller uses the total spindle force and wafer force components to calculate the retaining ring force. In step 3552, the process is repeated to generate a number of forces. In step 3554, a seal pressure versus ring force or membrane pressure versus wave force curve is generated. FIG. 37 depicts a calibration curve corresponding either to the inflatable ring seal pressure that generates a retaining ring force or the inflatable membrane pressure that generates a corresponding wafer force. For example, FIG. 37, shows a calibration curve for a VIPRR wafer carrier having an inflatable ring seal.

The calibration curves of FIGS. 36 and 37 generated by the above procedure are generally unique to the tested wafer carrier and spindle. The calibrated spindle and carrier can then be used during the wafer polishing process. The calibration helps in attempts to ensure that the spindle force, wafer force, and retaining ring forces are correct during wafer processing.

Calibration should occur when desired or needed. It can be performed when a carrier 2 is replaced with a different carrier, when the retaining ring and/or retaining ring seal are replaced, or when heights of carriers are adjusted (retaining ring height is set using shims—as the ring wears, the height must be shimmed-up). Wafer carriers have many consumable items (including retaining rings and retaining ring seals) causing periodic servicing. As such, it is common for the carriers to be removed, rebuilt, and replaced periodically. Calibration is typically performed after rebuilding the carrier. Similarly, the calibration process can be run when the wafer carrier is changed in the system. In addition, calibrations tend to drift over time. Periodic calibrations can be beneficial even when carriers are not changed or rebuilt.

The wet basin 3214 can be raised from the basin holder. The front-end module 122 can be configured to allow a wet cart to dock with and/or be inserted into the front-end module. The cart receives the wet basin containing the processed and still wet wafers for transporting the wafers for cleaning, further cleaning and/or other processing.

Some implementations of systems according the present embodiments are configured to comply with specification, such as specifications of the document Titel 50 (Technologische Ausrustung fur Wafertechnologien)'Los 50.8.00. These systems can provide a hazefree polishing of, for example, 300 mm silicon wafers and through the developed CMP system to allow the polishing of the front and/or backside, without flipping the wafer in the box. In some preferred embodiments, the system is implemented as a single-side polisher, such that the wafers are flipped by the robot to provide second-side polishing capability. These systems include, for example, two polishing tables 234, 236, two wafer chucks 244, 246, handling robot 220 for transfer between load station 230 (dry input), polisher 234, 236 and unload station 232 (wet output), pad conditioner 262 for each table (nylon brushes and diamond for silicon haze free polishing), and cleaning station 224/256 for chuck and wafer cleaning. The carrier and/or wafer cleaning station 256 are utilized between polishing on table 1 and table 2. The cleaning station employs spray clean, but some embodiments utilize brush cleaning. An output station is further included for depositing the processed wafers by the robot and end effector. In some embodiments, two end effectors are utilized where at least one is submergible. A retaining ring utilizing "floating" and "fixed" retaining ring technology can be employed, in some embodiments, with the same carrier, providing conversion within 10 min. Wafers with thickness between about 650–780μm can be processed without changing the carrier tool (floating and fixed retaining ring). The pad conditioners utilize sufficient water supplier at the place of the brush (maximum distance 10 mm), with sufficient cleaning of the brush after the conditioning process. The brushes are kept wet in some implementations during standby modus.

The wafers are processed in some embodiments includes: placing a wafer at a first polishing table 234, a wafer and polishing chuck rinsing, polishing at the second polishing table 236, wafer and polishing chuck rinsing (Wafer pre clean), wet unload station 232, and chuck clean. An alternative process sequences could include, after polishing, wafers are stored in a wet buffer, where wafers are cleanable by standard silicon cleans.

Preferred embodiments allow for continuous operation. The continuous operation of the system, with no break between successive boxes, is achieved, in some implementations, by two input stations and two output stations or alternatives/output buffer for at least 2 wafer buffer with one output station. The system can be supplied with two input and two output stations, or with a wafer buffer (e.g., minimum two wafer capacity) to ensure continuous, uninterrupted operation of the machine. In some embodiments, the "cart" supplied for the output shall contain water and an empty cassette.

In some embodiments, the input stations are crystal pak 13 wafers (Entegris), and the output station is a transportable wet buffer. The wafers are placed into low mass carriers, for example, one low mass carrier contains 26 wafers, in vertical positioning. The transportable wet buffer is docked to the wafer cleaning tool.

The system can include a stand by mode. In some embodiments, the system wets critical components, such as the polishing tables; wafer clean station; chuck cleaning station; chucks (wafer backing film); and polishing conditioner are sprayed or otherwise kept wet during standby mode.

The slurry flow supplied to the polish tables can be supplied, in some implementations, at rates of between about 10–1500 ml/min on both tables. In some implementations the slurry flow is between 200–300 ml/min. Two slurry pumps can be provided for each of the primary polish tables pumped in the range of about 4.8–480 ml/min. or 17–1700 ml/min. In some implementations one of each type of pump is supplied on each table to provide maximum flexibility.

The polishing control includes measurements of the polishing pressure, current and temperature; with an interface for data transfer to be specified (communication protocol, data sampling frequency, etc.). The system collects and stores data within the machine in log files, and can include SECS/GEM communication capability to download the data files to a third party software or a factory host. SECS/GEM is a standard platform for communication with factory hosts and for data transfer. XML communication is additionally and/or alternatively provided in some implementations.

Measuring instruments (inspection, measuring and test equipment and software) allow the system to conform with quality requirements for control and calibration in regular intervals and that these calibrations are typically traceable to accepted international and national standards. In cases of faulty calibrations, some embodiments include adjustment features to adjust the equipment (hardware and/or software). These adjustments are typically secured against alterations. The processes of adjustment are in some embodiments automatically run through self-adjustment on particular test objects (height standards, gauge block, etc.) which are certified traceable to standards (e.g. DKD, NIST, PTB, etc.).

Some embodiments achieve wafer processing to satisfy at least the following criteria: average haze<0,08 ppm (3 mm edge exclusion); haze homogeneity: Maximum value 0,08 ppm, delta haze 0,01 ppm (3 mm edge exclusion); no contamination, no chuck marks, no scratches on front-and backside (including edge exclusion area); wafer edge: no damage, no contamination; and metal contamination (VPD-AAS, three wafers): Na, Al, K, Cr, Fe, Ni, Cu, Zn, Ca<5 E 9 at/cm2. Similarly, wafer quality can be tested utilizing 50 wafers for inspection after cleaning. Measurement of the geometry (thickness, bow, warp, TTV) before and after the haze free polishing process (silicon removal>=2.0 μm). The specifications to be fulfilled by the wafers include: change of TTV<0.2 μm; site flatness SFQR<0.30 μm (incoming wafer SFQR<or=to 0.20 μm); within Wafer non Uniformity WIWNU (1 sigma)<5%, where the above specifications are at 3 mm edge exclusion.

Figure 38:
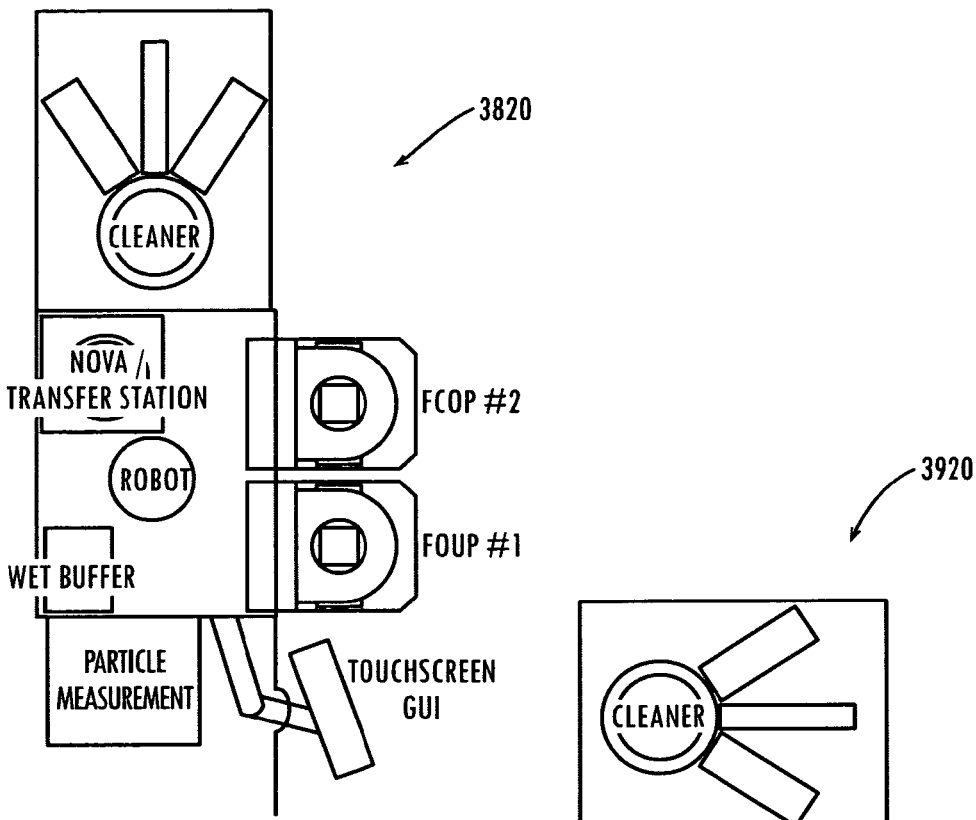
FIG. 38 depicts simplified overhead block diagrams of a two FOUP front-end module.
Figure 39:
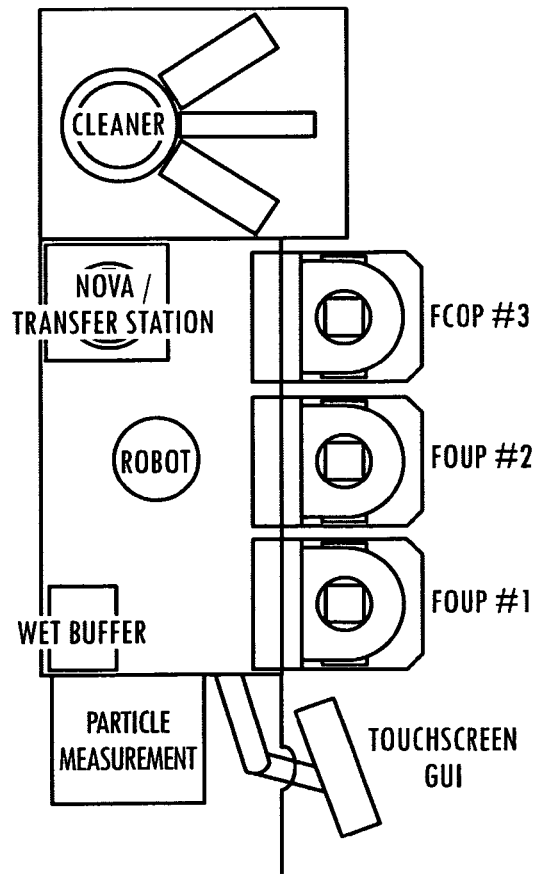
FIG. 39 depicts simplified overhead block diagrams of a three FOUP front-end module.

Referring back to FIG. 29, the system 2910 is configured as a dry-in-dry-out (DIDO) system such that the wafers are retrieved dry from the cassettes, FOUPS or other storage unit 126, and returned dry to the same or different storage unit. In implementing a DIDO front-end 124, the front-end module can be configured from materials that resist corrosion associated with expected chemicals used during processing, to meet industry and safety standards, provide a user interface, have reduced footprint or cross-sectional area, satisfy cleanliness levels of ISO Class 2 or better, easily retrieve and return wafers to storage units, utilize separate wet and dry end effectors, meet power limits, provide off system communication, provide reporting or cooperate with external device to generate reporting. Some implementations optionally include a measurement system, a wet buffer station, and/or a cleaner. FIGS. 38 and 39 depict simplified overhead block diagrams of a two FOUP front-end module 3820 and a three FOUP front-end module 3920, respectively, according to some implementations that satisfy the above listed DIDO front-end criteria.

Because of exposure to chemistries and deionized water the material used in constructing and assembling the front-end modules 3820 and 3920 are selected to withstand contact with such chemicals and deionized water. For example, components can be made of: plastics resistant to expected chemistries including, but not limited to, Polyethylene Terephthalate (PET), Polyetheretherketone (PEEK), polyphenylene sulfide (PPS), stainless steels (e.g., 300 series stainless steel, 17-4 PH stainless steel and the like), anodized and/or Teflon coated Aluminum, powder coated Aluminum, powder coated steel can (e.g., for use with non-wetted components such as the frame, and other such materials. Similar materials can also be used in the polishing module 122 cooperated with the front-end modules 3820 and 3920 for components such as, but not limited to fittings, valves, tubing, hardware, and other components.

The DIDO front-end modules and their components are designed and constructed to meet and/or exceed expected industry safety standards, such as semiconductor equipment and materials international (SEMI) standards S2, S8, and F47, CE standards, Factory Mutual Research Corporation (FMRC) (e.g., FM 4910) and/or other standard. Further, the front-end modules are constructed such that electrical components used are not exposed to splashing and dripping of chemicals and/or deionized water. The cleaner and the handling section of the front-end can provide a panel mounted connector for integrating (through CE compliant devices) connections for an emergency off (EMO) circuit(s). EMO circuit activation, the front-end (and in some implementations the processing module) typically remove electrical power to potentially hazard components. Typically the front-end module, as well as the processing module, include lights (e.g., user configurable light tower) to provide an adequate level of lighting within the front-end (and processing module). A CE compliant interlock system is incorporated into door entries into the front-end module and these are separate from the EMO circuit.

A user interface, in some embodiments is implemented through a graphical user interface (GUI) monitor. In some embodiments a Strasbaugh GUI monitor is used (e.g., part number 300637, providing 110 VAC, touch screen operation, 15" minimum monitor, color display, SEMI compliant for location, includes removable memory storage (e.g., compact disc drive, digital versatile disc drive, floppy drive and/or other drives) allowing storing and importing of data, software and the like (e.g., for recipe portability). In some embodiments, the primary GUI is located on the front-end module and a secondary GUI can be located in processing module or remote from the system. A switch can be used to toggle control of the tool from one GUI to the other, however, typically one GUI controls the tool at a given time. The GUI displays in fixed units, a mixture of metric, English and/or SI units as appropriate. In some embodiments, the GUI further provides for graphical wafer tracking indicating where there are wafers in the system 120.

The footprint of the front-end module 3820, 3920 is kept relatively small and in some instances to a minimum. For example, the two FOUP FEM 3820 (not including the optional cleaner and particulate measurement system) can be 79.5"(width)×31.5"(depth)×89"(height) (these dimensions do NOT include the protrusion of the pod door openers from the front of the enclosure).

As introduced above, some front-end modules are configured to have a cleanliness level of ISO Class 2 or better (under Class 1000 or better ambient conditions), as measured 4" above the wafer surface along regions or places where the wafer track within the front-end. Verification of this cleanliness can be performed with the front end dry state. Positive pressurization and air flow can be employed such that the front end remains clean and is not contaminated by the polishing module or when an operator door is opened. A minimum pressure difference between inside and outside the front end can be maintained, e.g., at about 0.01" $H_2O$ with maintenance doors closed and at about 0.004" $H_2O$ pressure difference when the maintenance doors are open.

The wafer input and output for the DIDO front-end modules 3820, 3920 is typically FOUPs and other similar carriers. Some embodiments further include wafer cassette scanning that is integrated into the FOUP door opening mechanism. The scanning method can be implemented, for example, through-beam type. Similarly, other configurations of the tool may use SMIF or open cassettes (wet and dry).

As detailed above, the robot utilizes one or more end effectors for removing a wafer from the FOUP, transporting the wafer and returning the wafer to the FOUP. A multi-axis robot is used to move wafers to and from the various stations within the front-end module. The robot can be configured to retrieve or place a wafer in between two other wafers in a FOUP. In typically operation, the robot draws the highest or the lowest wafer (e.g., customer-selectable) and proceeds down or up through the wafers of the FOUP, respectively. Typically, the end effectors are implemented as edge contacting effectors. The integrity of the wafer slot is maintained. The robot is further configured to avoid contaminating clean, dry wafers with water. Therefore, the clean, dry end effector is used to enter an opened FOUP. The following configurations and/or methods can be used to accomplish this: use two separate end effectors mounted on one or two arms for dry and wet handling; use two separate robots, one for dry and one for wet wafer handling; and/or use one end effector and incorporate a method to clean and dry that end effector. Typically, the wet end effector is configured to be able to flip wafers 180 degrees. The wet end effector can be saturated with deionized water and diluted slurry as it reaches into the polish section of the machine and thus is typically configured to be compatible in a wet/corrosive environment (but may be exposed to a much lesser degree when an optional end effector and flipper mechanism is employed).

The measurement system can be implemented through one or more devices, such as a Nova Measurement System (e.g., Nova 3030 Measurement System) that is incorporated into the front-end module for pre and/or post-polish measurement of wafers. The measurement system is typically an optional feature. Measurement recipes are user-configurable through the software (e.g., Nova software). The GUI for the measurement device is integrated within the GUI touch screen. Either a manual switch or key can be used to access the measurement system control screens. Handling components located above the measurement system can lower and raise wafers into and out of water, and provide the wafer I/O point for the robot. The measurement system handler contacts the wafer by the edges and/or by using a vacuum style chuck or end effector, and the wafer handling components can also be used as a wet buffer station for wafers, as well as a location to transfer from dry to wet end effector handling. Some embodiments notify the operator via configurable alarm when the machine halts due to back-ups at the measurement system, and/or can include closed-loop control (CLC).

The optional wet buffer station can be included to avoid a wafer from to drying prior to being cleaned. The buffer station can contain at least enough slots to hold a defined maximum amount of wafers that could be in process at any given time. For example, this number of wafers for the buffer is eight (8). Sprayers can be strategically placed relative to the buffer to keep the surfaces of the buffered wafers wet. The wet buffer station can be used when the cleaner or measurement system is not immediately available to clean or measure a wafer, in the event of a machine malfunction, an automated sequence places the in-process wafers in the wet buffer, which can then be cleaned and placed back in the FOUP's, and other situations or scenarios.

The optional cleaner, in some embodiments is implemented for example, through a Contrade's Corwet cleaner. The Corwet includes its own controller and software, and is permissible to either integrate the cleaner using its controller, or to control the unit using a controller in the system. A cleaner GUI is be integrated into the system GUI. A manual switch or key can be used to toggle between the cleaner and system GUI environments. The Corwet's software may be integrated into the system software. The cleaner can be configured to safely handle HF chemistry.

A wafer sequencing process for wafers before polishing can include: remove wafer from FOUP cassette using dry end effector (assume wafers are device-side UP in FOUP); place wafer in transfer station; shift to wet end effector; remove wafer from transfer station using wet end effector; flip wafer (e.g., device-side is now down); place wafer in load station 230; wafer is picked-up by spindle 240/carrier 244 for polishing (e.g., for a polishing time equal to about 2.5 minutes); unpolished wafers are to continually be placed into load station (as it becomes available) in preparation for polish. A wafer sequencing process for retrieving wafers after polishing can include: after polishing spindle/carrier places wafers in the unload station 232; remove wafer from unload station using wet end effector; place wafer in measurement system; measure wafer (e.g., process time of about 1 minute); remove wafer from measurement system using wet end effector; flip wafer (e.g., device-side is now up); place wafer into cleaner; cleaner scrubs wafer (e.g., process time of about 1 minute); switch to dry end effectors; remove wafer from cleaner using dry end effector; place wafer in FOUP cassette; polished wafers are to continually be moved from unload station to FOUP. Variations to the above Sequence(s) can include: that the measurement system measures polished wafer, determines it is out of spec, and the wafer may be placed back into load station for re-polish; measurement system may measure a certain percentage of polished wafers, where some percentage of wafers may go directly from unload station to the cleaner (skipping the measurement system); some or all wafers may be pre-measured by the measurement system, such that wafers are taken from the FOUP with the dry end-effector, placed in the transfer station, picked-up with the wet end-effector, flipped, and then placed in the measurement device for measuring, where after measuring, the wafers are placed in the load station; and/or other variations.

The process times given above are examples of processing time, but can vary depending the processing, type of wafer, and other parameters. In some implementations, the processing times are usable configurable. For example, polishing times can typically vary between about 1 to 5 minutes (2.5 minutes is common, but overhead adds another −0.5 min); measure time can vary between about 1 to 2 minutes (1 min is common); clean times can vary between about 1 to 2 minutes (1 min is common).

Power supplied to the front-end module can vary. For example, power supplied to the cleaner and front-end handling section by the system can be 208, 380, or 460 VAC, 3-Phase. Typically a single point power interface is utilized. The system 120 additionally can include data communication capabilities. Data transfer between the processing module controller and the front-end module controller can occur through an RJ45 connector and utilizing Ethernet TCP/IP protocol. The front-end module can include other interface connections such as EMO circuit, stop motion, GUI and the like. The front-end must tracks wafer movement within the cells, and provide feedback to the system controller or central processing unit. Commands to the front-end from the system controller typically occur at high levels, while movements of components in the front-end can be controlled by an independent controller in the front-end. The front-end controller can be physically located in the front-end module. Further, the FOUP PDO's can have an E84 parallel interface to communicate with the OGV handling unit.

The configuring of the system 120 in two components, the front-end module 124 and the processing module 122 allow the system to be more easily transported. Further, the two modules allow the system to be more precisely customized for a specific user implementation. Still further, the separable modules allow one module to be constructed (e.g., the processing module) while the other module (e.g., the front-end module) is being designed.

Some present embodiments may be further understood in view of U.S. patent application Ser. No. 11/046,502, filed Jan. 28, 2005, entitled Chemical-Mechanical Planarization Tool Force Calibration Method and System, incorporated in its entirety herein by reference, and U.S. Pat. Nos. 6,045,716, filed Apr. 4, 2000, and 6,354,926, filed Mar. 12, 2002 each incorporated herein by reference in their entirety.

While the invention herein disclosed has been described by means of specific embodiments and applications thereof, numerous modifications and variations could be made thereto by those skilled in the art without departing from the scope of the invention set forth in the claims.

What is claimed is:

1. An apparatus for use in processing wafers, the apparatus comprising:
   a single turret;
   a first spindle cooperated with the turret;
   a second spindle cooperated with the turret;
   a first motor cooperated with the turret such that the first motor indexes the first spindle using the turret; and
   a second motor cooperated with the turret such that the second motor indexes the second spindle using the turret independent of the first spindle.

2. The apparatus of claim 1, further comprising:
   a slip ring cooperated with the turret supplying electrical signals to the first spindle.

3. The apparatus of claim 2, further comprising:
   a rotary union cooperated with the turret such that the rotary union couples fluids to the first spindle.

4. The apparatus of claim 3, wherein the second spindle is daisy chain coupled with the first spindle such that at least some of the electrical signals received by the first spindle Through the slip ring are directed from the first spindle to the second spindle, and at least some of the fluids received by the first spindle through the rotary union is directed from the first spindle to the second spindle.

5. The apparatus of claim 1, further comprising a front-end module that cooperates with the first and second spindles to deliver wafers for processing to the spindles.

6. The apparatus of claim 1, wherein the turret comprises a first turret and a concentric second turret within the first turret such that the first turret is cooperated with the first spindle and the first motor such that the first motor indexes the first spindle using the first turret, and the second turret is cooperated with the second spindle and the second motor such that the second motor indexes the second spindle using the second turret.

7. The apparatus of claim 1, further comprising:
   a controller secured on the first spindle.

8. The apparatus of claim 7, wherein the controller on the first spindle controls the first and second motors to rotate the first and second spindles.

9. The apparatus of claim 1, wherein the first motor oscillates the first spindle using the turret, and the second motor oscillates the second spindle using the turret independent of the first spindle.

10. The apparatus of claim 9, wherein the first motor is controlled to radially position the first spindle using the turret, and the second motor is controlled to radially position the second spindle using the turret independent of the first spindle.

11. The apparatus of claim 1, further comprising:
a load station from which the first and second spindles retrieve wafers.

12. The apparatus of claim 11, wherein the load station comprise a linear rail assembly allowing a portion of the load station to shift relative to a center position when cooperating with a carrier of the first spindle.

13. The apparatus of claim 12, wherein the first spindle comprises a carrier that comprises a chamfered retaining ring that cooperates with the chamfer of the load guide ring of the load station to align the load station with the carrier.

14. The apparatus of claim 12, wherein the load station further comprising a biasing spring that returns the pardon of the load station to substantially the center position when the carrier retrieves the wafer from the load station.

15. The apparatus of claim 11, the load station further comprising:
a wafer chuck;
a wafer guide ring biased in contact with the wafer chuck; and
a load guide ring aligned with the wafer guide ring such that the wafer chuck is separated from the wafer guide ring when the wafer guide ring contacts the load guide ring as the wafer chuck is advanced through the load guide ring to deliver the wafer to the first spindle.

16. The apparatus of claim 11, wherein the load station comprises a wafer chuck that comprises segmented shoulders providing edge contact support of the wafer in the load station.

17. The apparatus of claim 9, wherein the controller on the first spindle controls the first motor to oscillate the first spindle using the turret and the second motor to oscillate the second spindle using the turret independent of the first spindle, and to vary the frequency of oscillation.

18. The apparatus of claim 1, wherein the first and second spindles each comprise a biasing spring that bias carriers of the first and second spindles in a position separated a distance from polishing tables.

19. An apparatus far use in processing wafers, the apparatus comprising:
a single turret assembly;
a first spindle cooperated with the turret assembly;
a second spindle cooperated with the turret assembly;
a first motor cooperated wit the turret assembly such that the first motor indexes the first spindle using the turret assembly;
a second motor cooperated with the turret assembly such that the second motor indexes the second spindle using the turret assembly independent of the first spindle; and
a front-end module that cooperates with the first and second spindles to deliver wafers for processing to the spindles, wherein the front-end module comprises a single, multi-axial robot.

20. An apparatus for use in processing wafers, the apparatus comprising:
a single turret assembly;
a first spindle cooperated with the turret assembly;
a second spindle cooperated with the turret assembly;
a first motor cooperated with the turret assembly such that the first motor indexes the first spindle using the turret assembly;
a second motor cooperated with the turret assembly such that the second motor indexes the second spindle using the turret assembly independent of the first spindle;
a plurality of polishing tables;
a wash station; and
an unload station where the polishing tables, wash station and unload station are accessible by the first and second spindles without the first and second spindles reversing direction.

* * * * *

UNITED STATES PATENT AND TRADEMARK OFFICE
CERTIFICATE OF CORRECTION

PATENT NO.        : 7,249,992 B2
APPLICATION NO.   : 11/173992
DATED             : July 31, 2007
INVENTOR(S)       : Kalenian et al.

Page 1 of 1

It is certified that error appears in the above-identified patent and that said Letters Patent is hereby corrected as shown below:

In the CLAIMS:

Claim 4, column 32, line 43, delete "Through" and insert --through--.

Claim 14, column 33, line 18, delete "pardon" and insert --portion--.

Claim 19, column 34, line 10, delete "wit" and insert --with--.

Signed and Sealed this

Fourth Day of December, 2007

JON W. DUDAS
*Director of the United States Patent and Trademark Office*